United States Patent [19]
Yuzurihara et al.

[11] Patent Number: 5,612,230
[45] Date of Patent: Mar. 18, 1997

[54] PROCESS FOR MANUFACTURING A SEMICONDUCTOR DEVICE BY APPLYING A NON-SINGLE-CRYSTALLINE MATERIAL ON A SIDEWALL INSIDE OF AN OPENING PORTION FOR GROWING A SINGLE-CRYSTALLINE SEMICONDUCTOR BODY

[75] Inventors: Hiroshi Yuzurihara, Isehara; Mamoru Miyawaki, Tokyo; Akira Ishizaki, Atsugi; Genzo Momma; Tetsunobu Kochi, both of Hiratsuka, all of Japan

[73] Assignee: Canon Kabushiki Kaisha, Tokyo, Japan

[21] Appl. No.: 417,901

[22] Filed: Apr. 6, 1995

Related U.S. Application Data

[62] Division of Ser. No. 158,371, Nov. 29, 1993, Pat. No. 5,428,237, which is a continuation of Ser. No. 872,294, Apr. 22, 1992, abandoned.

[30] Foreign Application Priority Data

| Apr. 16, 1991 | [JP] | Japan | 3-97257 |
| Apr. 26, 1991 | [JP] | Japan | 3-97244 |
| May 31, 1991 | [JP] | Japan | 3-129506 |

[51] Int. Cl.⁶ .......................... H01L 21/265; H01L 21/20
[52] U.S. Cl. .................. 437/21; 437/40; 437/101
[58] Field of Search ........................ 437/21, 101, 40 TFI, 437/40 TFT, 41 TFI, 41 TFT; 257/347, 348, 349, 350, 351, 352, 353, 354, 901

[56] References Cited

U.S. PATENT DOCUMENTS

| 4,381,202 | 4/1983 | Mori et al. .................. 437/41 TFT |
| 4,479,297 | 10/1984 | Mitzutani et al. .................. 437/21 |
| 4,571,609 | 2/1986 | Hatano .................. 257/347 |
| 4,619,033 | 10/1986 | Jastrzebski .................. 437/21 |
| 4,763,183 | 8/1988 | Ng et al. .................. 357/23.7 |
| 4,810,664 | 3/1989 | Kamins et al. .................. 257/347 |
| 5,016,070 | 5/1991 | Sundaresan .................. 257/351 |

FOREIGN PATENT DOCUMENTS

| 0436038A1 | 7/1991 | European Pat. Off. . |
| 58-3286A | 1/1983 | Japan .................. 257/347 |
| 2-83980A | 3/1990 | Japan .................. 257/354 |

*Primary Examiner*—Mary Wilczewski
*Assistant Examiner*—Brian K. Dutton
*Attorney, Agent, or Firm*—Fitzpatrick, Cella, Harper & Scinto

[57] ABSTRACT

An insulated gate type transistor includes a plurality of major electrode regions, a channel region provided between the plurality of major electrode regions, a gate electrode provided on the channel region with a gate insulating film therebetween, and a semiconductor region provided in contact with the channel region, the semiconductor region having the same conductivity type as that of the channel region and a higher impurity concentration than the channel region. The gate electrode has at least two opposing portions. The plurality of major electrode regions are provided on an substrate insulating film. The transistor is activated in a state where the semiconductor region is maintained at a predetermined voltage. A semiconductor device includes a plurality of memory cells, each of which includes the aforementioned insulated gate type transistor and an electrically breakable memory element provided on one of the major electrode regions.

10 Claims, 59 Drawing Sheets

TEOS
 ETCH-BACK
 (REGURATE S:N SELECTIVE PATIO)
 S:N ETCHING

PROCESS FOR MANUFACTURING A SEMICONDUCTOR DEVICE BY APPLYING A NON-SINGLE-CRYSTALLINE MATERIAL ON A SIDEWALL INSIDE OF AN OPENING PORTION FOR GROWING A SINGLE-CRYSTALLINE SEMICONDUCTOR BODY

This application is a division of application Ser. No. 08/158,371 filed Nov. 29, 1993, now U.S. Pat. No. 5,428, 237 which was a continuation of application Ser. No. 07/872,294 filed Apr. 22, 1992, now abandoned.

BACKGROUND OF THE INVENTION

1. Field of the Invention

The present invention relates to a semiconductor device which is employed in electronic circuits of various technical fields including office automation apparatus, electrical devices of private use, such as facsimile machines, printers and video cameras, as well as automobiles, power plants and space satellites. More particularly, the present invention relates to a semiconductor device which is suitable for use in a semiconductor memory for storing necessary data signals.

2. Related Background Art

FIG. 1 illustrates a semiconductor memory device (a semiconductor memory) which can be programmed once. The memory cell of this semiconductor memory device is made up of a MOS field effect transistor (hereinafter referred to as a 'MOSFET') which is an insulated-gate field effect transistor, and an insulating film. This memory device includes an insulator 10, AL(Y) 11, Poly Si(X) 12, PSG 13 and SiO$_2$ 14.

Such a memory has been described in, for example, "A new Programmable Cell Utilizing Insulator Breakdown" IEDM' 85, pp 639 through 642.

Another type of semiconductor memory is shown in FIG. 2.

In FIG. 2 which is a cross-sectional view thereof, reference numeral 120 denotes a n type substrate; 121, a p$^+$ drain; 122, a p$^+$ source; 123, a floating gate; 124, an insulating layer; 125, a drain interconnection; and 126, a source interconnection. The floating gate 123 is manufactured by embedding, for example, a polysilicon into a silicon oxide. Normally, no current flows between the source and the drain. When a high voltage is applied between the source and drain of this transistor, avalanche breakdown occurs in the pn junction on the side of the drain, injecting electrons of a high energy level to the floating gate and thus permitting current to be established between the source and drain, by which writing can be performed on the memory. When this device is used as a memory, injection and non-injection of electrons to the floating gate are made to correspond to 1 and 0 of data, respectively. However, in the above-described memory, since a slight amount of electric charges stored in the floating gate leaks, permanent storage of data is impossible, and the reading characteristics vary with time. Furthermore, the aforementioned MOSFET is not suited to the fine processing, and is characterized by a low mutual conductance (gm characteristics).

Furthermore, when the gate length is 0.5 μm or less, improvement in the aforementioned MOSFET based on the scaling rule cannot be expected.

Apart from the above-mentioned semiconductor device, a SOI type MOSFET has also been proposed (Japanese Patent Application Laid-Open No. 2-14578). In this semiconductor device, a SiO$_2$ layer is provided on a Si substrate, and a Si mesa structure is provided on the SiO$_2$ layer. A gate oxide film is provided on the side wall of the mesa structure. FIGS. 3 and 4 illustrate such a device. In FIGS. 3 and 4, reference numeral 232 denotes an insulating film; 231', a crystalline silicon; 236, a source region; 237, a drain region; and 235, a gate electrode which bridges a channel region of the crystalline Si portion. FIG. 3 is a section taken along a line a–a' of FIG. 4.

As shown in FIG. 3, upper three surfaces of the crystalline Si 231' portion are covered with the gate electrode 235 through the gate oxide film 234, while a lower surface 238 thereof is in contact with the surface of the insulating film 232. The dimensions of the crystalline Si portion satisfy $W_0 < 2W_H$. Thus, the channel of the side wall is increased, thus increasing the channel conductance.

A MOSFET which is similar to the above-mentioned one in terms of the structure has also been proposed (Japanese Patent Application Laid-Open No. 2-263473). FIG. 5 is a plan view of this MOSFET. FIG. 6 is a section taken along a line A–A' of FIG. 5. FIG. 7 is a section taken along a line B–B' of FIG. 5. A crystalline Si layer 246 forms a source 243, a drain 242 and a channel. The portion of the crystalline Si layer 246 which is covered by a gate electrode 245 forms a channel region connected to a substrate 240 via an opening 247. The drain layer 242 is connected to the substrate 240 through the crystalline Si layer 246 via an opening 248.

The above-described conventional structures are characterized in an increased leaking current of the transistor, variations in the transistor and degraded OFF characteristics and hence unstable operation of the transistor. First, why off characteristics of the SOI type MOSFET is degraded will be explained. The present inventors consider it is because the Si region which forms the channel is covered with a SiO$_2$ except for the interfaces between the source and drain and the Si region. That is, the Si region which forms the channel portion is made completely floating, and the potential thereof cannot be fixed, making the operation unstable. Furthermore, the carriers (electrons in the case of, for example, a p type MOSFET) generated in the Si region when the transistor is in an On state stop flowing when the transistor is turned off, and remain in the Si region until they recombine with holes and disappear, thus deteriorating the off characteristics of the transistor. In the aforementioned conventional transistors, a large amount of current leaks because the channel region surrounded by the gate electrode is in direct contact with the insulating layer which is the substrate. That is, the channel region is made in a completely depletion state when the transistor is turned on, and the resultant depletion layer reaches the interface between the channel region and the insulating layer and generates a large amount of recombination current by the defects present in the interface.

SUMMARY OF THE INVENTION

In view of the aforementioned problems of the conventional techniques, an object of the present invention is to provide a semiconductor device which has a structure suited to fine processing, and which assures low power consumption and high-speed operation.

Another object of the present invention is to provide a semiconductor device having a memory function which assures accurate and stable writing operation and high-speed and accurate reading out operation.

To achieve the above objects, the present invention provides a semiconductor device which comprises: an insulated gate type transistor including a plurality of major electrode regions, a channel region provided between the plurality of major electrode regions, a gate electrode provided on the channel region with a gate insulating film therebetween, the gate electrode having at least two opposing portions, and a semiconductor region provided in contact with the channel region and having the same conductivity type as that of the channel region and a higher impurity concentration than the channel region, the plurality of major electrode regions being provided on an substrate insulating film, and the transistor being activated in a state where the semiconductor region is maintained at a predetermined voltage; and an electrically breakable memory element provided on one of the major electrode regions.

Another object of the present invention is to provide a FET having a SOI type backgate structure which are excellent than a conventional one.

The above object of the present invention is achieved by provision of a method of manufacturing a semiconductor device which comprises the steps of forming an insulating region on a single crystalline semiconductor substrate, said insulating region having an opening through which a surface of the substrate is exposed and a recessed portion whose diameter is larger than the opening, forming a single crystalline semiconductor region within the opening and the recessed portion, and forming a semiconductor element whose activated region is at least part of the single crystalline semiconductor region.

Another object of the present invention is to provide a semiconductor device which comprises a transistor including a first major electrode region, a second major electrode region, a first channel region provided between the first and second major electrode regions, a first gate electrode provided on the first channel region with a first gate insulating film provided therebetween, a third major electrode region, a second channel region provided between the second and third major electrode regions, and a second gate electrode provided on the second channel region with a second gate insulating film provided therebetween, said first, second and third major electrode regions and the first and second channel regions being formed on a semiconductor island region provided on a surface of a semiconductor substrate, the first and second gate electrodes having opposing portions which sandwich the first and second channel regions, respectively.

The above-described another object of the present invention is achieved by the provision of a semiconductor device which comprises: a plurality of insulated gate type transistors each of which includes a source region and a drain region, a channel region provided between the source region and the drain region, a gate electrode provided on the channel region with a gate insulator provided therebetween, and a semiconductor region provided in contact with the channel region and having the same conductivity type as that of the channel region and a higher impurity concentration than the channel region, the gate electrode having at least two opposing portions which are disposed such that they have a surface which crosses the joining surface between the channel region and the semiconductor region; and an electrically breakable memory element provided on the source region of each of the plurality of transistors, the drain region being common to the plurality of transistors.

That is, in the semiconductor memory which employs, as a memory cell transistor, a transistor which is suited to fine processing and which has a high current driving capability, the word line is formed by the gate of the transistor while the bit line is formed on the source region of the transistor with a pn junction therebetween. Consequently, a programmable semiconductor memory which has a low error rate and high-density and high-speed reading and writing characteristics can be obtained. In such a memory, the drain region of the memory cell transistor is made common to the plurality of the memory cells, and such a common drain region is connected to a power source line to make the power source line common to the plurality of memory cells. Consequently, the area required for the power source portion can be reduced, and the number of memory cell transistors present in a fixed area can thus be increased. As a result, high integration can be achieved.

In the present invention, since the magnitude of an electric field in a direction perpendicular to the carrier mobilizing direction is reduced by the opposing two gate electrodes, a semiconductor device exhibiting a high mobility and excellent gm characteristics can be obtained. Consequently, generation of hot carriers can be prevented due to electric field limitation, and the life and hence reliability of the device can be enhanced.

Furthermore, since the capacitance of the Si portion provided below the gate oxide film is reduced, S factor (subthreshold swing) characteristics are improved, and leaking current is greatly reduced.

Furthermore, the area required for the memory element is reduced, and high integration can be achieved.

In the present invention, since a region of a different conductivity type from that of a source and drain portion and having a higher impurity concentration than a channel region which ensures that the driving voltage applied to the gate when the transistor is driven does not inverse the region is provided on the portion of the channel region other than the portion on which the opposing two gate electrodes are provided, the speed at which the minority carrier enters or exits from the semiconductor layer surrounded by the opposing two gate electrodes (which is holes in the case of an n channel MOS and electrons in the case of a P channel MOS) when the transistor is turned on or off is increased, and the switching characteristics are thus improved.

Furthermore, even when the channel region is completely depleted of current carriers when the transistor is turned on, the aforementioned high concentration layer prevents a depletion layer from reaching the lower insulating layer, and generation of dark current is restricted.

Furthermore, when fine processing at a level of 0.1 µm is achieved, the semiconductor device must be able to be activated at low temperatures, such as the liquid nitrogen temperature. However, even when carrier freezing occurs in the low-temperature activation, an increase in the parasitic resistance and reduction in the drain current can be greatly lessened as compared with the conventional one.

In the present invention, it is possible to form a SOI type MOSFET in a self-alignment by defining the single crystal semiconductor region formed by SEG or the like by at least two insulating layers made of the same or different types of materials.

Since alignment margin can be ignored, a semiconductor device which assures high integration and high speed activation can be manufactured.

Furthermore, since a polysilicon or amorphous semiconductor layer is disposed as a buffer layer between the portion of the insulating layer other than that which forms the seed of SEG or other than that which is in contact with the semiconductor substrate and the single crystal semiconductor region formed by SEG or the like, current leaking from the transistor formed in the semiconductor region can be restricted, and a high-performance transistor can thus be provided.

DETAILED DESCRIPTION OF THE PREFERRED EMBODIMENTS

Figure 1:
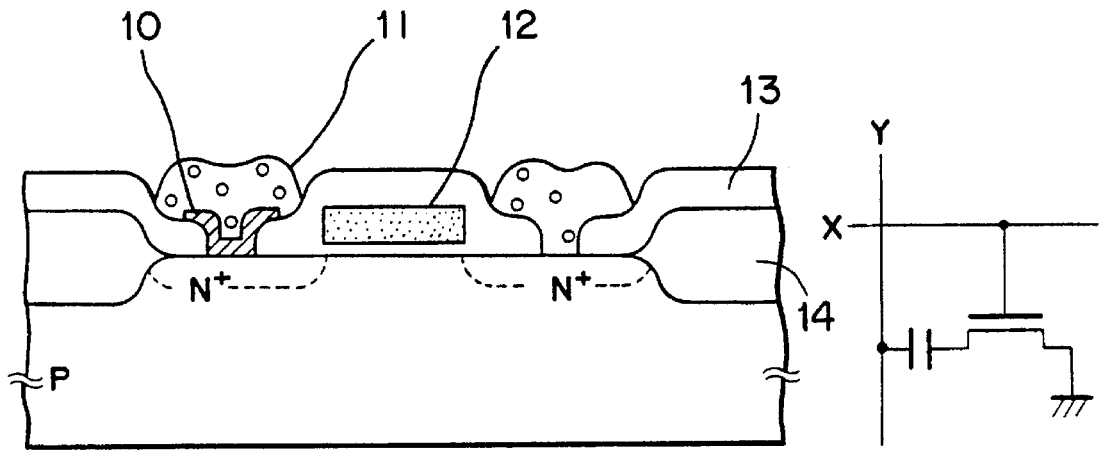
FIG. 1 is a schematic view of an example of a conventional semiconductor memory.
Figure 2:
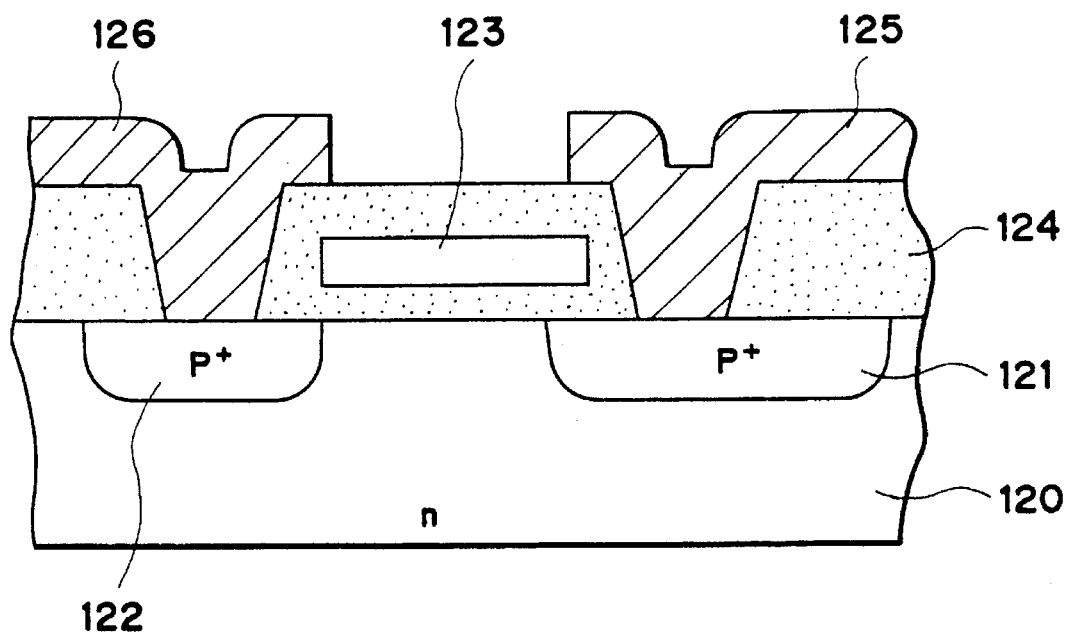
FIG. 2 is a schematic view of another example of a conventional semiconductor memory.

The structure of a transistor and a semiconductor memory on which the present invention is based will be described first.

In a preferred form of the present invention, a semiconductor memory includes: a transistor in which a gate electrode has at least opposing portions sandwiching a channel region and in which part of the portion of the channel region other than the portion thereof jointed to the source and drain regions is in contact with a doped region which can exchange minority carries with the channel region; and a memory element which is a breakable insulating layer.

In the channel region of the semiconductor device according to the present invention, a width ($d_3$) of the channel region sandwiched between the opposing portions of the gate electrode in the direction of the opposing portions and the semiconductor impurity concentration of the channel region are determined in the manner described below. That is, they are determined such that depletion layers extending from two sides of the opposing portions are coupled with each other to form a depletion region even when no gate voltage is applied. Practically, where $d_3$ is the width of the channel region in the direction of the opposing portions of the gate electrode and W is the width of the depletion layer extending from the two sides in the same direction, the relation of $d_3 \leq W$ is satisfied. If the channel region located between the opposing electrodes is completely depleted, even when the gate voltage increases to a level at which an inversion layer is formed, the electric field applied to the interior of the channel region is limited, and the characteristics of the device are improved.

The doped region is any semiconductor region having a different conductivity type from that of the source and drain region and a higher impurity concentration than the channel region. Thus, there is no limitation in the type of impurity and conductivity type. Practically, the impurity concentration of the doped region is a concentration which ensures that the doped region is not inverted by the driving voltage applied to the gate when the transistor is activated. Functionally, the doped region has a structure which allows carriers from the channel region sandwiched by the opposing portions of the gate electrode to be accepted in an activated state (when the transistor is turned on or off). To achieve this function, the doped region is maintained at a reference voltage (Vref) directly or through a semiconductor substrate having the same conductivity type.

The gate electrode of the present invention is made of a material, such as a metal, polycrystalline silicone, silicide or polycide. Practically, Al, W, Mo, Ni, Co, Rh, Pt, Pd or silicide or polycide of these elements is employed. Selection is made with the structure, driving conditions and work function of a MOSFET taken into consideration.

The gate electrode and doped region are shaped such that no gate electrode exists on the portion which opposes the doped region, that the doped region is provided on the portion which opposes the doped region or that part of the gate electrode is disposed on the portion which opposes the doped region, as in the case of an embodiment described later. It is desirable that the cross-sectional form of the channel region taken in a direction perpendicular to the carrier mobilizing direction be square, e.g., the three surfaces is surrounded by the gate electrode while the remaining surface is in contact with the doped region. The sides of that square may be straight or curved. Each of the edge portions may be bevelled with the coating property of the gate insulating film taken into consideration.

In the semiconductor memory device according to the present invention, the transistor is of the type in which the MOSFET elements are located on a substrate in the lateral direction thereof, as will be described later, and are in contact with the doped region on the side of the substrate, and in which the opposing portions of the gate electrode have a surface which crosses the surface of the substrate. Alternatively, the opposing portions of the gate electrode may be disposed substantially parallel to the surface of the substrate with the doped region provided on the side surface. However, the former structure, i.e., the structure of the embodiments which will be described later, is desirable from the viewpoint of the currently adopted manufacturing process.

For example, the surrounding gate transistor (SGT), proposed by IEDM (International Electron Device Meeting) (1988) pp 222–225 by H. Tadato, K. S. unoushi, N. Okabe, A. Nitayama, K. Hieda, F. Horiguchi and F. Masuoka, is known. In this surrounding gate transistor, a source and a drain are disposed above and below a channel, and four gate electrodes are opposed.

The transistor of the present invention is of the type in which a source and a drain are disposed on the front and rear sides of the opposing gate electrodes.

With this structure, the electrodes of the source and drain can be readily formed on the same plane, as in the case of the conventional MOSFET. Since the channel length is determined by the gate electrode width, as in the case of the conventional MOSFET, the channel length processing accuracy is high. The patterning required to form the opposing two gate electrodes in the lateral direction can be conducted by lithography without using a mask, and the aforementioned structure is therefore suited to fine processing. As a result, the distance between the two gate electrodes can be narrowed and generation of punch through phenomenon can be prevented without increasing the impurity concentration. This allows excellent gm characteristics to be obtained even when high integration is achieved.

The transistor of the present invention is of the type in which the MOSFET elements are located on the substrate in the lateral direction thereof and are in contact with the doped region on the side of the substrate, and in which the opposing portions of the gate electrode have a surface which crosses the surface of the substrate. The reason why this structure of the transistor is employed will be described below in comparison with the aforementioned conventional MOSFET.

In the conventional MOSFET, at least part of the channel region is in contact with the insulating layer located below the channel region. This causes the following drawbacks.

First, amount of leaking current due to generation of dark current is large. In the structure shown in FIG. 3, the channel region 231' made of silicon is surrounded by the surface 238 of the insulating film 232 and the gate oxide film. When the transistor is turned on, the entire channel region is depleted of current carriers due to the voltage applied to the gate. As a result, the MOSFET transistor has a higher current driving capability than the other types of transistors. However, although the interface between the gate oxide film and the channel silicon exhibits excellent characteristics due to the recently developed process technology (washing or the like), the interface between the channel silicon and the insulating film has defects and a high level density. Since the gate electrode is provided on the insulating layer adjacent to the portions indicated by 250, depletion of the entire channel portion brings the surface 238 of the insulating layer into contact with the depletion layer. Thus, in the case of an n type MOSFET, when the transistor is turned on, holes are accumulated in the channel region. If the holes generated in the interface are present in the channel portion, even when a voltage to be applied to the gate is changed to turn off the transistor, electrons are injected from the source, and the transistor cannot be turned off at once. In other words, in the MOSFET which is activated by depletion, generation of unnecessary carriers must be avoided more strictly than in the case of the conventional MOSFETs.

Figure 6:
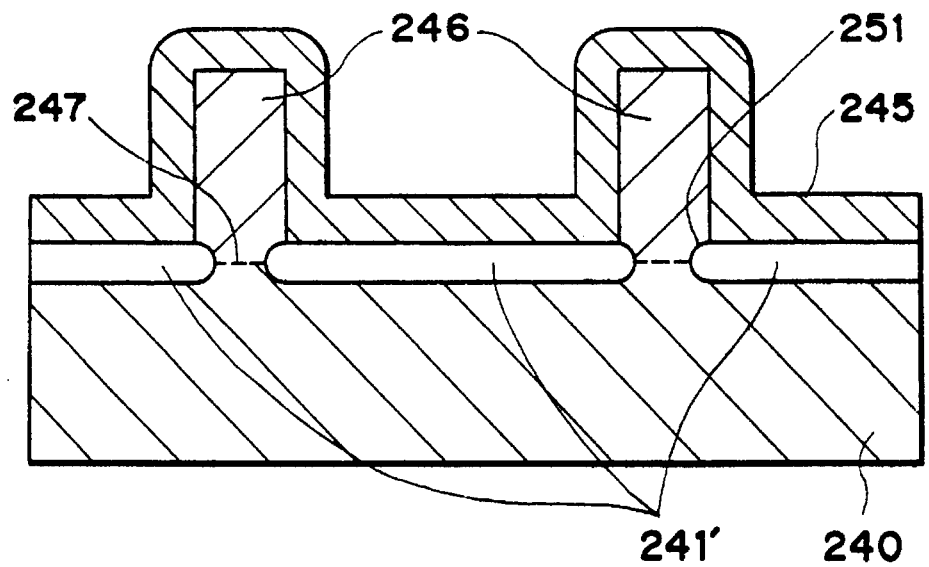
FIG. 6 is a schematic cross-sectional view of the example of the conventional semiconductor device.
Figure 7:
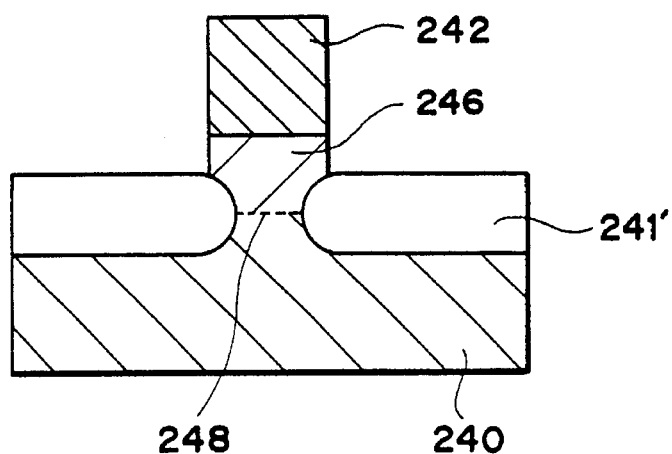
FIG. 7 is a schematic cross-sectional view of the example of the conventional semiconductor device.

The aforementioned phenomenon can be observed in other types of conventional transistors. This will be explained with reference to FIG. 6. In FIG. 6, since the Si single crystal portions 246, serving as the channel regions, are in contact with the substrate through the openings 247, the channels become floating, and unnecessary carriers (holes in the case of an n type MOSFET of electrodes in the case of a p type MOSFET) will escape through the channels. However, as indicated by 251 in FIG. 6, the channel regions are in contact with the surface of the insulating layer, and generation of unnecessary carriers takes place. Therefore, the leaking current generated from the defects present in the interface between the insulating layer and the channel region deteriorates the device characteristics.

Secondly, the effective channel width readily varies in individual transistors.

Figure 3:
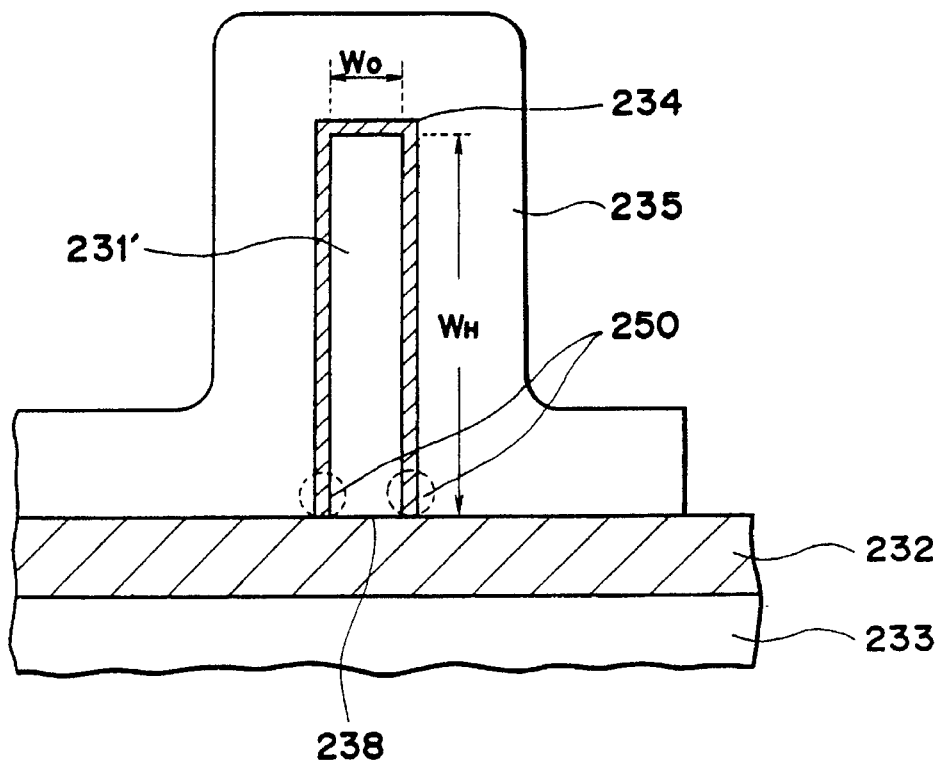
FIG. 3 is a schematic cross-sectional view of an example of a conventional transistor.
Figure 4:
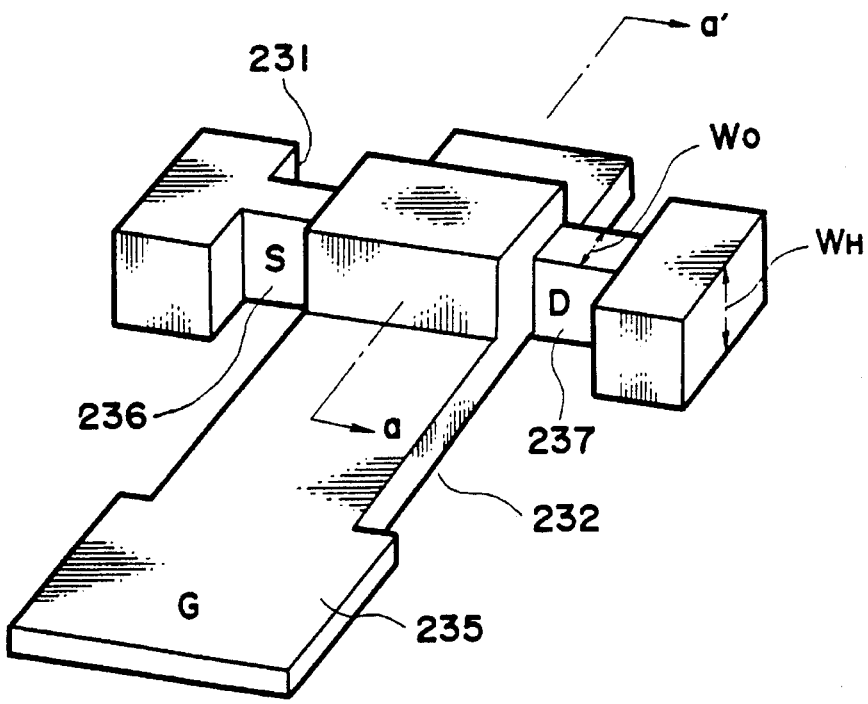
FIG. 4 is a schematic perspective view of the example of the conventional transistor.
Figure 5:
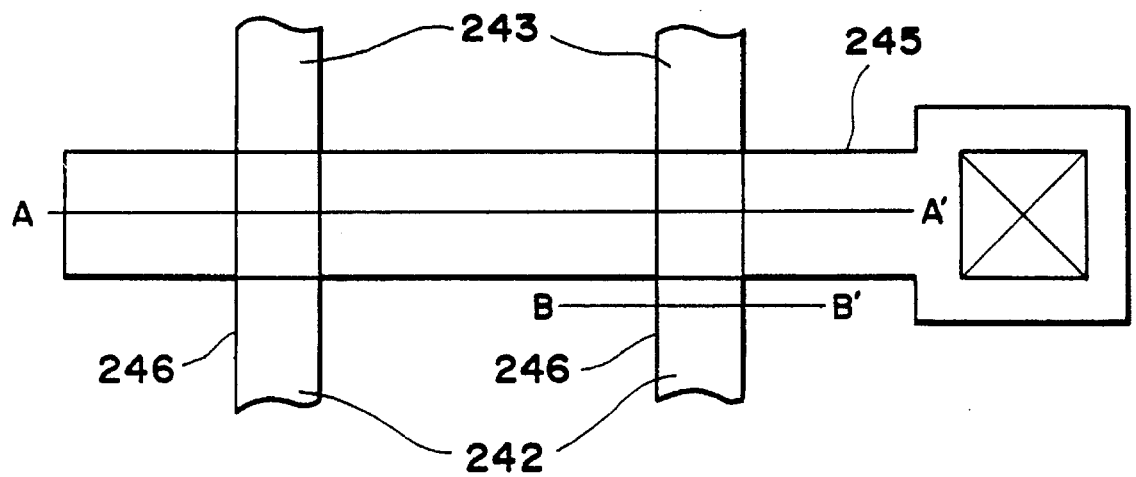
FIG. 5 is a schematic top view of the example of the conventional transistor.

The channel width of the conventional transistor is determined by the height and width of the single crystalline silicon 231' shown in FIG. 3 or of the Si portion 246 shown in FIG. 6. Generally, the height is determined by the etching depth of Si. In a MOSFET having a gate length of 0.1 μm and a gate width of 0.5 μm, this height of Si is about 0.2 μm, and allowance thereof must be within 200 Å. In the currently adopted dry etching technique, it is very difficult to achieve this allowance in the wafer plane or between the wafers. Furthermore, as indicated by 250 in FIG. 3, the height of the Si portion immediately above the insulating layer readily varies, and this causes the thickness of the Si portion to change between the upper and lower Si portions.

In the transistor employed in the present invention, since the channel length is determined by the gate electrode width, as in the case of the conventional MOSFET, channel length processing accuracy is high. Furthermore, since channel region is defined by the gate electrode portion and the high concentration layer located immediately below or above the channel, variations thereof are less. Furthermore, even when the channel portion becomes depleted when the transistor is turned on, the resulting depletion layer does not expand due to presence of the high concentration layer. Thus, the depletion layer does not make contact with the surface of the insulating layer except for the gate oxide film (insulating film), and unnecessary carrier generation source does not exist.

As will be understood from the foregoing description, the memory of the present invention employs, as a memory cell transistor, a transistor which is suited to fine processing and which has a high current driving capability. In this memory, the word line is formed by the gate of the transistor while the bit line is formed on the source region of the transistor with a pn junction therebetween. Thus, a programmable memory of this invention has a low error rate and exhibits high-density and high-speed reading out and writing characteristics.

Prior to description of the individual embodiments of the present invention, reference examples that the present inventors have examined will be described first, because they are the basic technologies of the present invention.

(First Reference Example)

Figure 8:
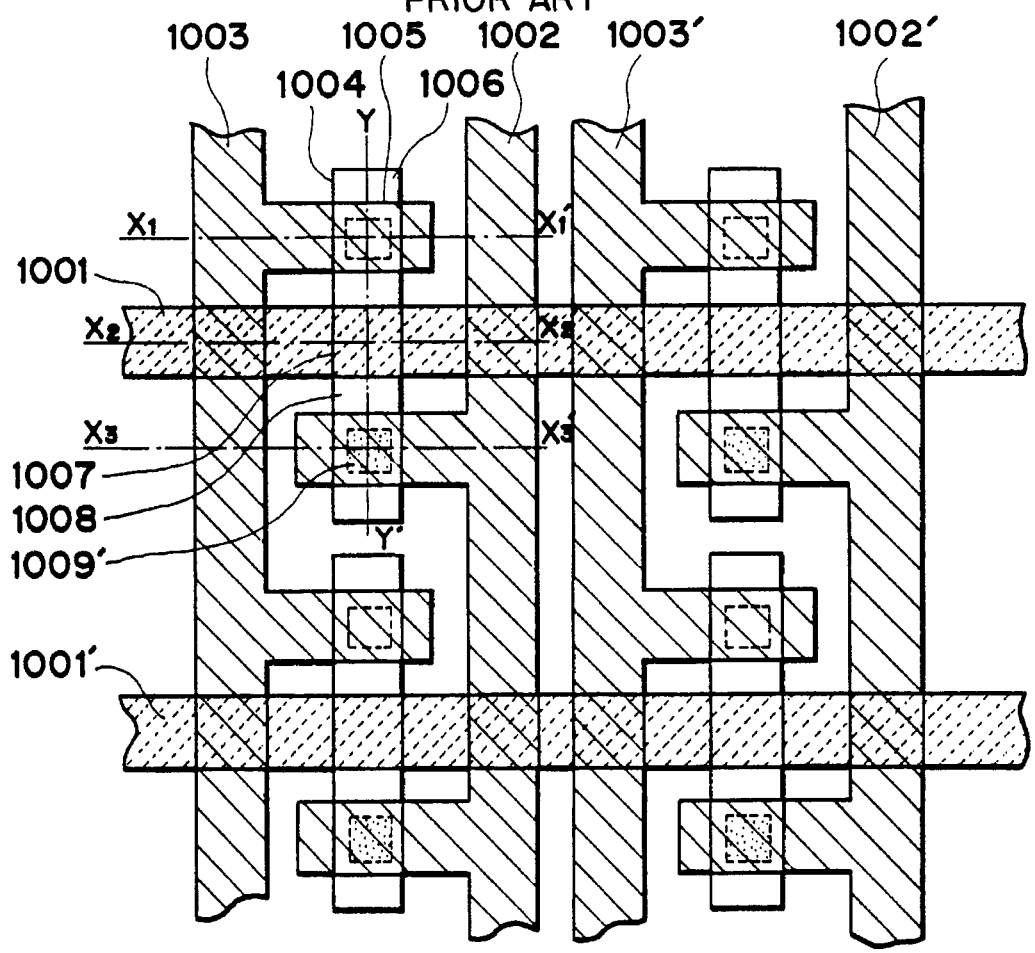
FIG. 8 is a schematic top view of a semiconductor memory according to a first reference example of the present invention.
Figure 9:
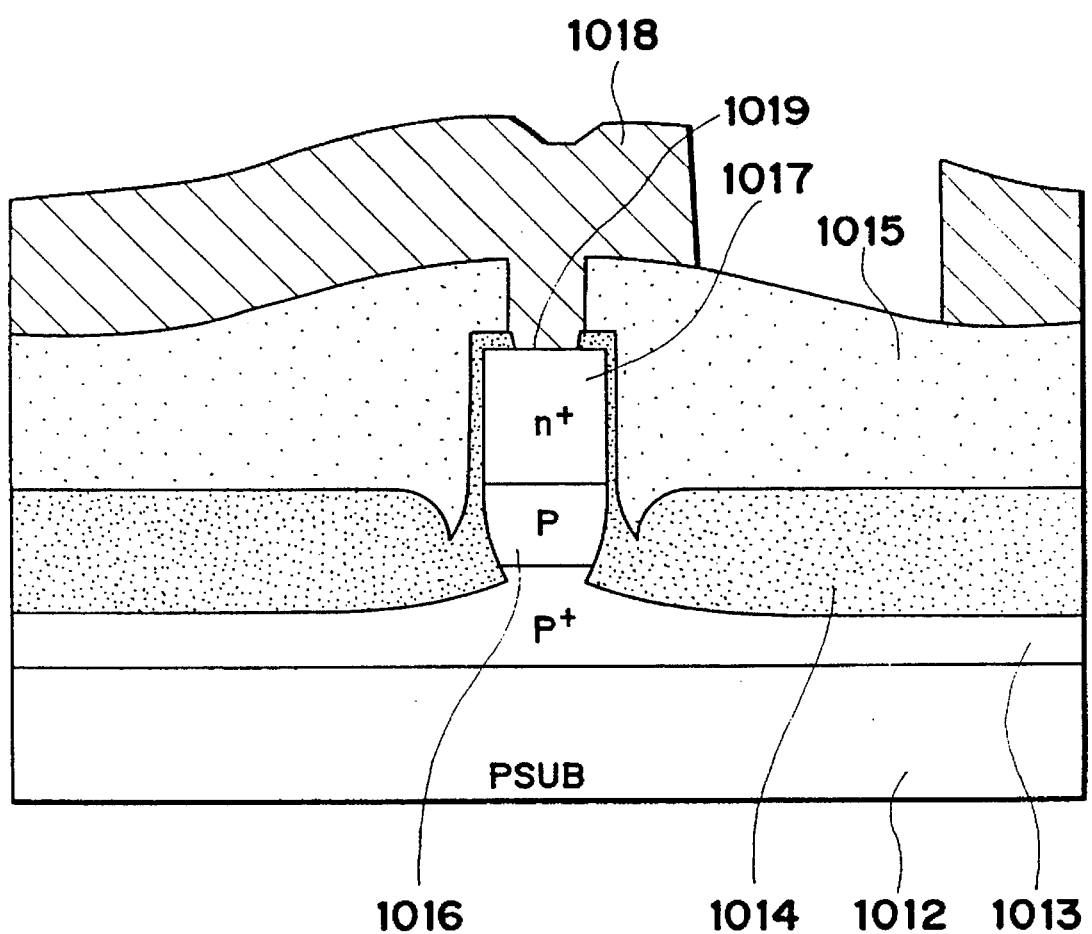
FIG. 9 is a schematic cross-sectional view taken along line $X_1$–$X_1'$ of FIG. 8.

FIG. 8 is a top view of a memory cell which is a first reference example of the present invention. In FIG. 8, reference characters 1001 and 1001' denote word lines; 1002 and 1002', bit lines; 1003 and 1003', power source lines; 1004, an Si single crystal which operates as a switching transistor in the memory cell; 1005, a contact region between the power source line and a drain layer; 1006, a drain layer of the transistor; 1007, a gate of the transistor; 1008, a source layer of the transistor; 1009, an electrically breakable insulating layer provided between the source layer and the bit line. FIGS. 9 through 12 are respectively sections taken along lines $X_1$–$X_1'$, $X_2$–$X_2'$, $X_3$–$X_3'$ and Y–Y' of FIG. 8. In FIG. 9, reference character 1012 denotes a p type Si substrate which has a resistivity of, for example, several Ω cm; 1013, a $p^+$ type buried layer; 1014, a field oxide layer; 1015, an interlayer insulator which may be made of PSG, BPSG, SiN or SON; 1016, a p type layer provided just below the drain; 1017, a drain $n^+$ high concentration layer; 1018, an interconnection for a drain power source which is connected to the drain layer 1017 through a contact portion 1019. The drain layer 1006 shown in FIG. 10 corresponds to the drain $n^+$ high concentration layer 1017. The contact portion 1005 shown in FIG. 8 corresponds to the contact portion 1019 shown in FIG. 9. In FIG. 9, illustration of a passivation film is omitted.

Figure 10:
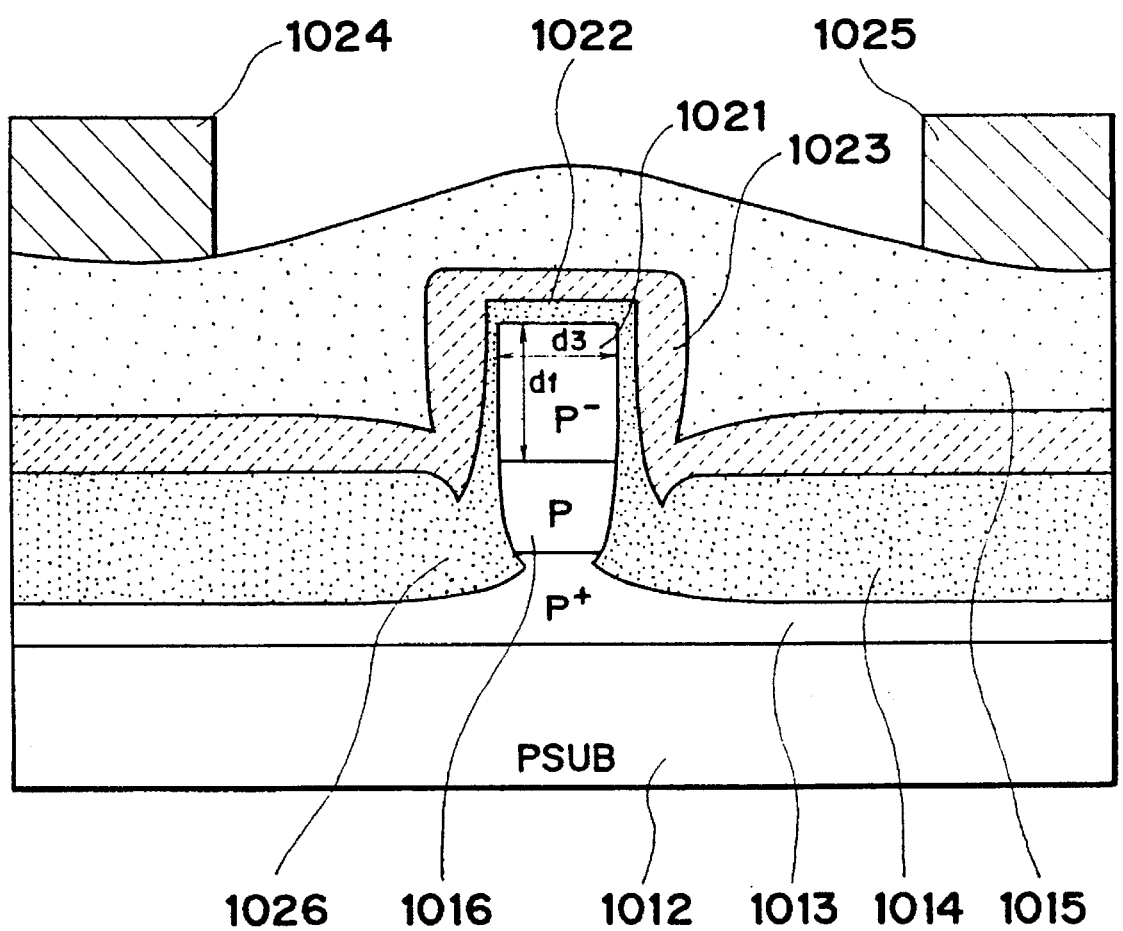
FIG. 10 is a schematic cross-sectional view taken along line $X_2$–$X_2'$ of FIG. 8.

FIG. 10 is a cross-sectional view of the gate portion of the transistor in the memory cell.

In FIG. 10, reference character 1021 denotes a channel region which is made of a semiconductor having an impurity concentration of, for example, $5 \times 10^{14}$ through $5 \times 10^{16}$ cm$^{-3}$; 1022, a gate insulating film which is about 60 Å through 250 Å thick, although the thickness thereof must be changed according to the length of the gate.

The gate insulating film 1022 may be a Si oxide film, SiON or a laminated layer of $SiO_2$ and SiON. Reference character 1023 denotes a gate electrode having a low resistance structure having a work function which ensures a desired threshold of the transistor, such as a polycide structure in which an upper layer made of $W_xSi_{1-x}$ is formed on a $p^+$ type polysilicon substrate; 1024, an interconnection for the drain power source which corresponds to the interconnection 1003 shown in FIG. 8; and 1025, an interconnection for the bit line which corresponds to the interconnection 1002 shown in FIG. 8. As shown in FIG. 10, the channel region 1021 is defined by the gate insulating film 1022 and the p layer 1016. Therefore, the channel width of this transistor is $2d_1+d_3$. The thickness of the gate insulating layer located below the channel region 1021 changes in the manner indicated by 1026 in FIG. 10 as a result of the field oxidation process, and is comparatively difficult to control. However, in this transistor, since the actually activated channel region is defined by the p region located below the channel region, it is not affected by variations in the thickness of the gate insulating film, and variations in the transistors are greatly reduced.

Figure 11:
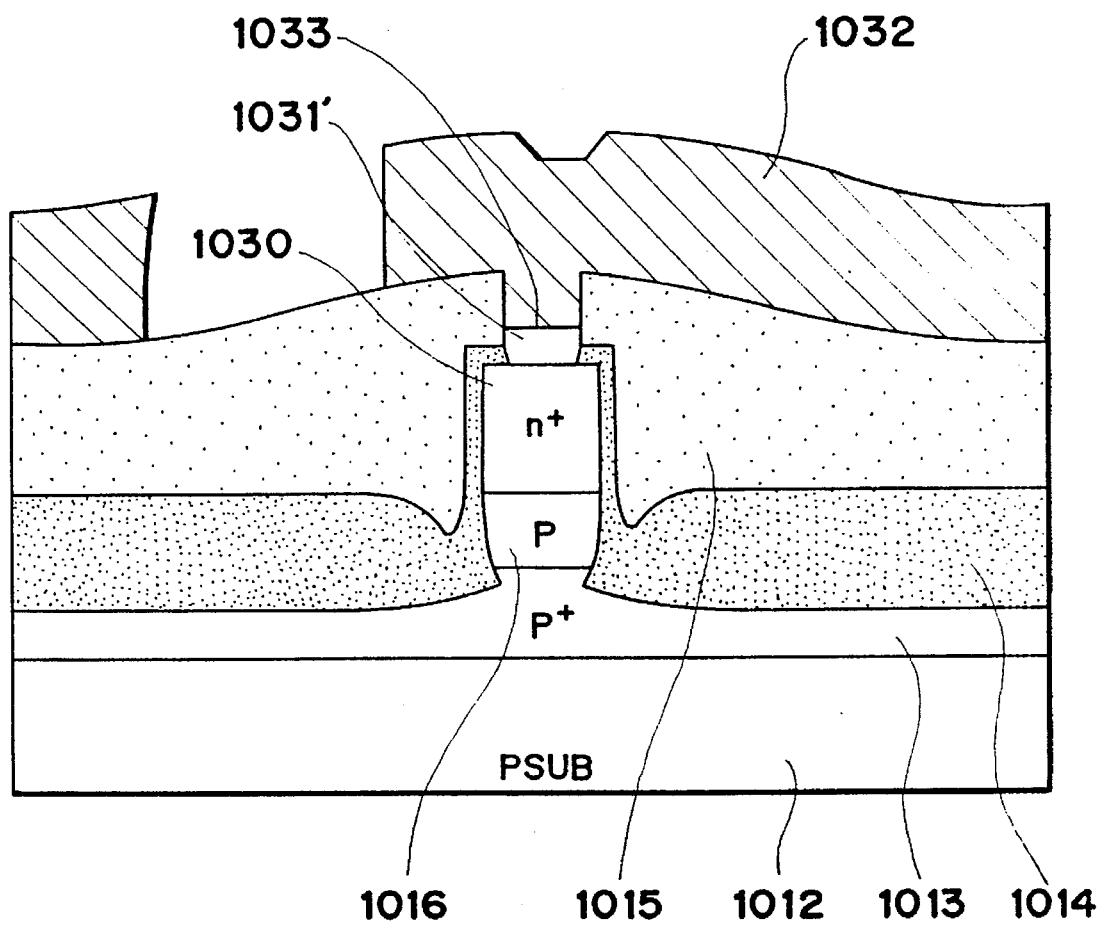
FIG. 11 is a schematic cross-sectional view taken along line $X_3$–$X_3'$ of FIG. 8.

FIG. 11 is a cross-sectional view of a source region of the transistor in the memory cell. In FIG. 11, reference character 1030 denotes a $n^+$—Si region which is the source region; 1031', an insulating layer provided on the source whose breakdown and non-breakdown define conduction and non-conduction of the memory, respectively; and 1032, a bit line interconnection which is connected to the insulating film 1031' through a contact area 1033. The insulating layer may be made of $SiO_2$, SiON or a laminated layer of $SiO_2$ and SiN. Aluminum oxide and tantalum oxide can also be used.

Figure 12:
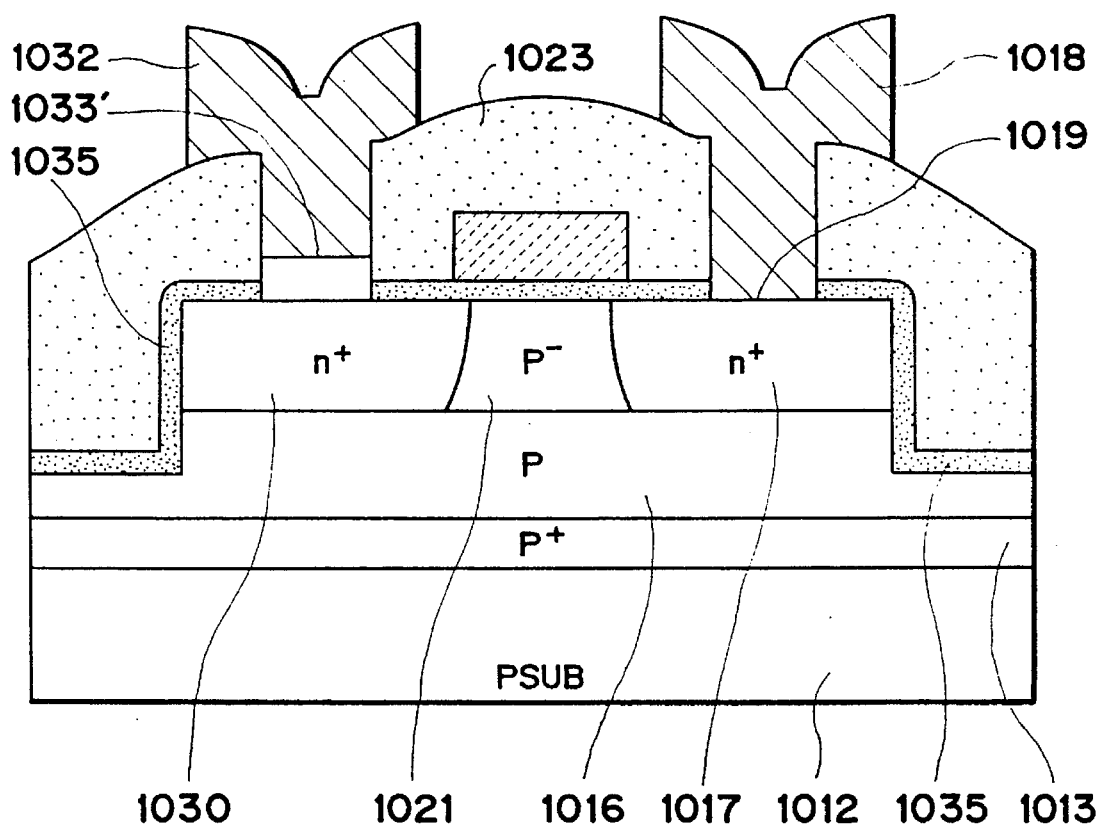
FIG. 12 is a schematic cross-sectional view taken along line Y–Y' of FIG. 8.

FIG. 12 which is the section taken along the line Y–Y' of FIG. 8 will be explained.

As indicated by 1035 and 1035' in FIG. 12, the transistors are separated from each other by a vertical surface. An interlayer insulator is buried between the adjacent transistors and the separation width can be narrowed. Therefore, the transistor of this reference example is suited to a high integration device. The gate electrode structure on the section shown in FIG. 12 is similar to that of an ordinal MOSFET. However, on the section of FIG. 10 which is perpendicular to the section shown in FIG. 12, the gate electrode is disposed such that it opposes the side wall portions. Furthermore, although the gate electrode is provided on the upper portion, if the relation between $d_1$ and $d_3$ shown in FIG. 10 is determined by $$d_3 < d_1 \qquad \text{Equation (1),}$$

even when the gate voltage increases, the potential of the channel region is increased from both sides thereof, and the electric field in the channel region can thus be limited as compared with the general MOSFET. Furthermore, changes in the potential take place over the entire channel region. Consequently, when the transistor is turned on, a large current can flow, and a high driving capability can be obtained.

Figure 13:
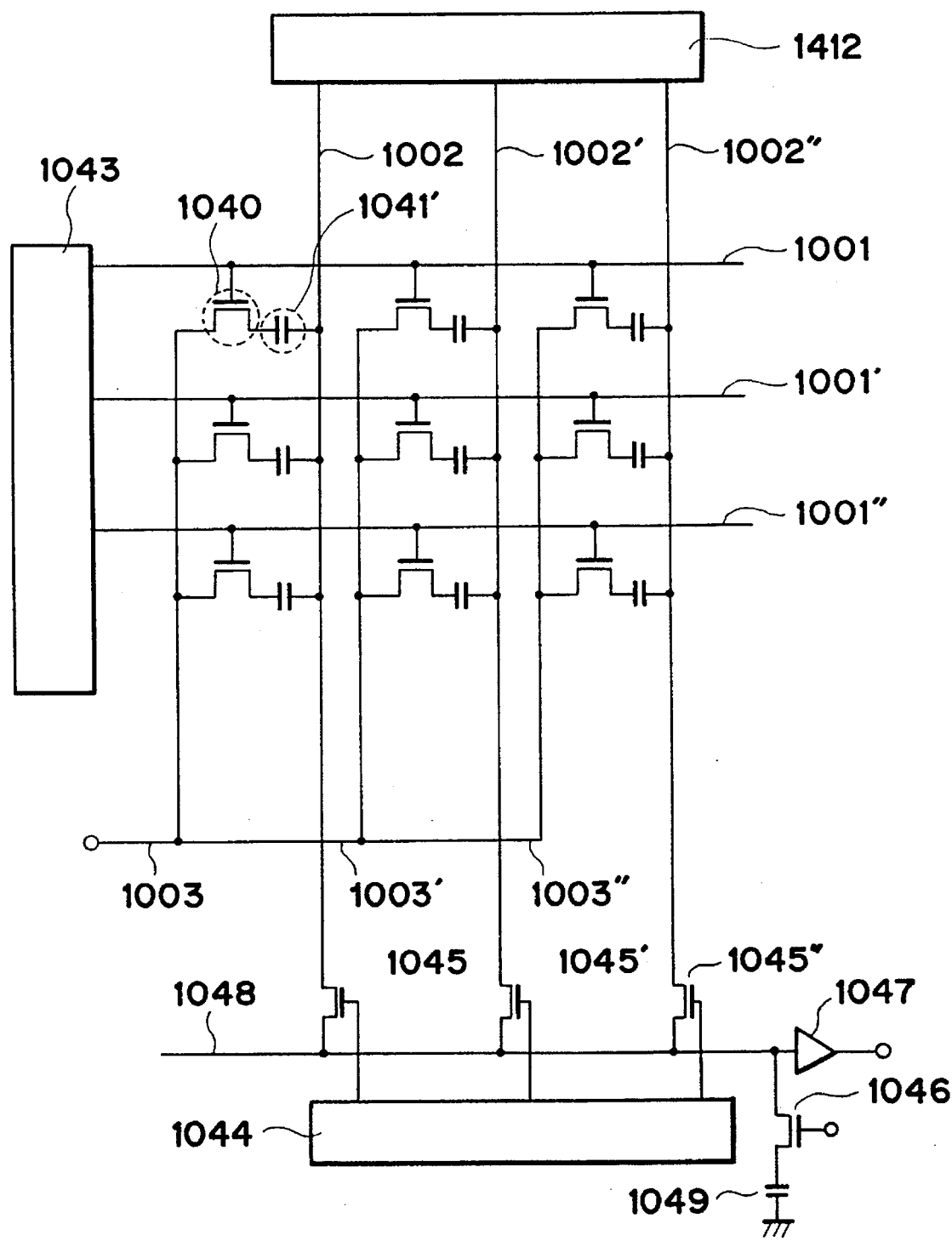
FIG. 13 is a circuit diagram of the semiconductor memory according to the first reference example of the present invention.

FIG. 13 is a circuit diagram of a semiconductor memory having 3×3 cells according to the first reference example of the present invention.

The single cell includes an addressing transistor 1040 and a memory element 1041. The memory element 1041 acts as a capacitor before breakdown takes place and does not act as the capacitor after breakdown occurs.

Reference characters 1001, 1001' and 1001" denote word lines connected to the gates of FETs.

1002, 1002' and 1002" denote bit lines connected to one side of each of the memory elements.

1003, 1003' and 1003" denote power source lines. The memory also includes, as the peripheral circuits, a bit line voltage setting circuit 1042 for setting the voltage of each of the bit lines to a reference voltage, a word line voltage setting circuit 1043, a selection signal generating circuit 1044 for generating a signal of sequentially selecting the bit lines, bit line selection switches 1045, 1045' and 1045", and a switch 1046 for resetting a bit line reading-out line 1048, and an amplifier 1047.

The operation of the aforementioned semiconductor memory will now be described.

First, the writing operation will be explained. The operation consists of following four major operations.

(1) Writing operation part 1: (pre-charge of the bit lines)

The reference voltage $V_{DD}$ is set on the bit lines by the voltage setting circuit 1042. Consequently, no potential difference exists between the power source lines and the bit lines. Thus, no matter what voltage is applied to the word lines, no potential is generated or no current flows between the source and the drain of the FET, and breakdown of the insulating film 1041 thus does not occur. The pre-charge voltage applied to the bit lines may be or may not be equal to the power source voltage. When the pre-charge voltage is not equal to the power source voltage, a voltage which does not generate breakdown of the insulating film region and hence conduction is set. A voltage between 1 and 5 v is applied as $V_{DD}$.

(2) Writing operation part 2: (discharge of the word lines)

The voltage on all of the word lines is fixed to a first grounding voltage $V_{GND1}$. It is fixed to, for example, 0 v. This prevents mixture of a signal into the adjacent word lines of the word line on which writing operation is conducted due to generation of cross-talk.

(3) Writing operation part 3: (selection of a writing word line)

Assuming that the present writing bit represents the cell on the second line and second row with the upper and left cell as an origin, the writing bit is present on the word line 1001' shown in FIG. 13. Hence, the potential on the word line 1001' is set to $V_G$ which is expressed by:

$$V_{GND1} < V_G < V_{GB} \qquad \text{Equation (2)}$$

where $V_{GB}$ is a gate insulating film breakdown voltage.

(4) Writing operation part 4: (selection of a bit line)

The voltage on the bit line corresponding to the writing cell present on the selected line is set to the grounded voltage. Since all the FETs present on the selected line have been turned on, application of the grounded voltage causes a high voltage to be applied to the insulating film, causing breakdown of the insulating film and hence conduction. When the writing operation is completed, a current flows between the bit line and the word line. Thus, it is desirable that selection of the bit lines be conducted line by line. However, it is also possible to conduct writing on a plurality of bit lines at the same time.

Next, the reading out operation will be explained. This operation consists of following four major operations.

(1) Reading out operation part 1: (pre-charge of the bit lines)

Pre-charge of the bit lines is conducted in the same manner as that of the writing operation to prevent the reading out operation performing writing on the bits on which writing has not been conducted. The voltage applied for pre-charging is equal to the power source voltage $V_{DD}$.

(2) Reading out operation part 2 (discharge of the word lines)

The voltage on all of the word lines is fixed to second grounded voltage $V_{GND2}$. The voltage $V_{GND2}$ and the first grounded voltage $V_{GND1}$ has the following relation.

$$V_{GND1} < V_{GND2} \qquad \text{Equation (3)}$$

(3) Reading out operation part 3 (selection of a reading line)

The voltage on the word line on which the reading out operation is to be conducted is fixed to $V_G$ defined by Equation (2) to turn on the FETs present on that line.

(4) Reading out operation part 4 (resetting of the bit line reading out line)

The bit line reading out line 1048 is reset by the switch 1046. The reset voltage, determined by the power source connected to the switch 1046, is $V_{GND2}$. Thereafter, the switch 1046 is turned off to make the bit line reading out line floating.

(5) Reading out operation part 5 (selection of a bit line)

The gate of the Selected bit selection switch is raised by the bit line sequentially selecting signal generating circuit 1044 to turn on the switch and thereby connect it to the bit line reading out line. If the selected cell is not present, the voltage on the reading out line converges to the value expressed by $$\frac{C_{BIT} \cdot V_{DD} + C_{OUT} + V_{GND2}}{C_{BIT} + C_{OUT}}$$

where $C_{BIT}$ is the capacity of the bit line and $C_{OUT}$ is the capacity of the reading out line.

If the selected cell is present and the insulating film is in a conducting state, the reading out line is connected to the power source $V_{DD}$ through the transistor and the voltage on the reading out line thus converges to $V_{DD}$. These two voltage stages are utilized to determine whether the written cell (bit) is present or not. The voltage on the reading out line is detected by the amplifier 1047. In the reading out operation which is conducted in the manner described above, in the case of a written state, the time it takes for the voltage on the reading out line to converge to $V_{DD}$ determines the reading out speed. The larger the capacity of the memory, the larger the capacity of the bit line and bit line reading out line. Thus, how these large capacities are driven is the key to an increase in the reading out speed. The aforementioned fine transistor structure having a high driving ability is therefore very effective in this sense.

In this reference example, two types of grounded voltages are used so that the reading out operation does not cause breakdown of the insulating film. That is, a difference in the voltages applied to the two ends of the insulating film in the reading out operation is lower than that in the writing operation.

The manufacturing method of the first reference example will be described below with reference to FIGS. 14 through 18. FIGS. 14 through 17 are cross-sectional views which correspond to FIG. 10. FIG. 18 corresponds to FIG. 12.

Figure 14:
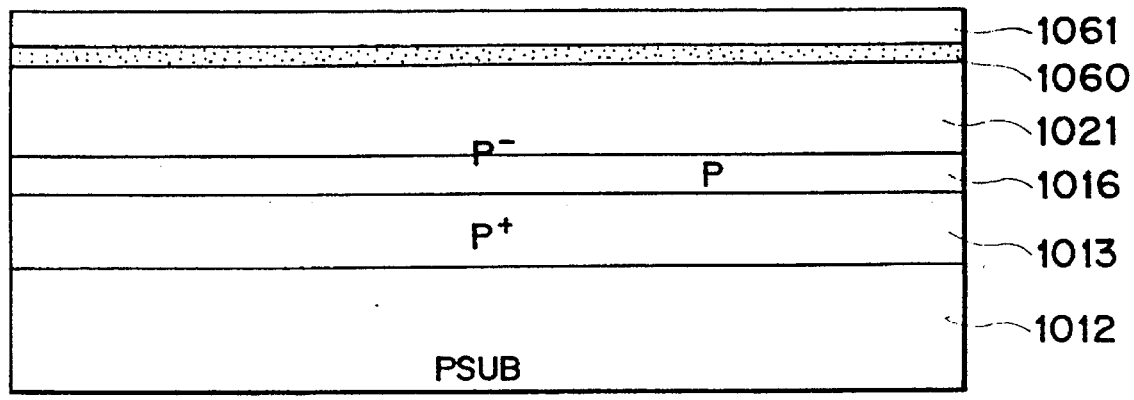
FIG. 14 is a schematic view illustrating the manufacturing method of the first reference example.

First, boron ions are injected into the surface of the p type silicon substrate 1012, and then activation of the impurities in the ion injected layer is conducted at about 900° C. After the p$^+$ high concentration layer 1013 has been formed, the wafer is washed and placed in an epitaxial growth device. In the device, the natural oxidized film formed on the surface is removed due to reduction of silane, and then the 2 μm thick p layer 1016 and the 0.5 μm thick p$^-$ layer 1021 are sequentially grown at a low temperature of 850° C. Low-temperature epitaxial growth restricts welling of impurities, and provides rapid joint between p$^+$–p and p–p$^-$. The concentration of the p$^+$ layer is $10^{19}$ cm$^{-3}$. The concentration of the p layer is $10^{17}$ cm$^{-3}$. The concentration of the p$^-$ layer is $10^{16}$ cm$^{-3}$. The resultant wafer is subjected to thermal oxidation to form the silicon oxide film 1060 of about 250 Å. Thereafter, the silicon nitride film 1061 of 250 Å is formed on the silicon oxide film 1060 by the vapor chemical deposition technique (CVD) (FIG. 14).

Figure 15:
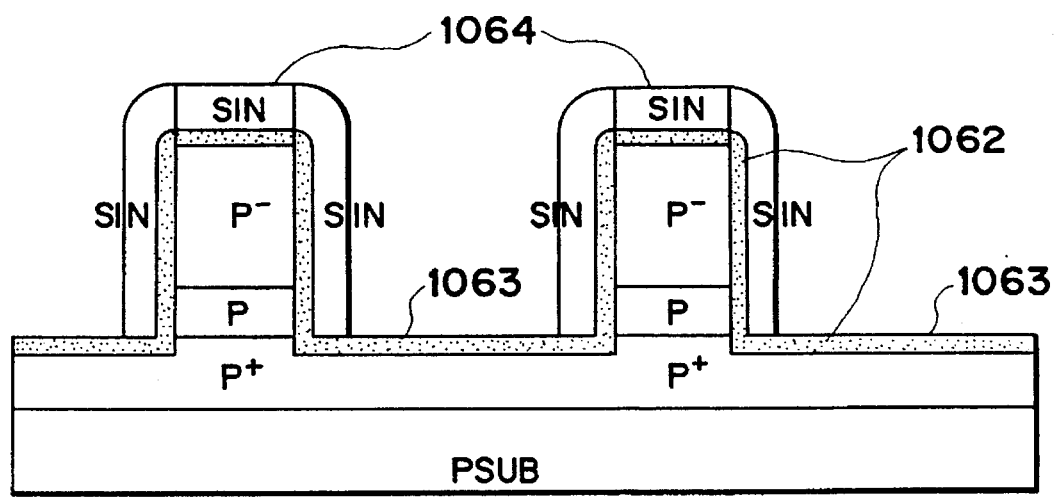
FIG. 15 is a schematic view illustrating the manufacturing method of the first reference example.

Next, reactive anisotropic etching is conducted on the wafer except for the transistor forming area using a resist as a mask to vertically remove the silicon nitride film 1061, the silicon oxide film 1060, the p$^-$ layer 1021 and the p layer 1016. The end of the groove formed by etching is as deep as either the p layer or p$^+$ layer. It is not necessary to control the depth of the groove strictly, which is one of the advantages of this structure. Next, the resist used for patterning is removed. After washing of the wafer, a silicon oxide film 1062 of about 250 Å thickness is formed on the surface where Si is exposed. Thereafter, a silicon nitride film is deposed on the entire surface by CVD, and only the silicon nitride film formed on a bottom surface 1063 is removed by the anisotropic silicon nitride film etching. At that time, a silicon nitride film 1064 formed on Si columns remains because they consist of two layers (FIG. 15).

Figure 16:
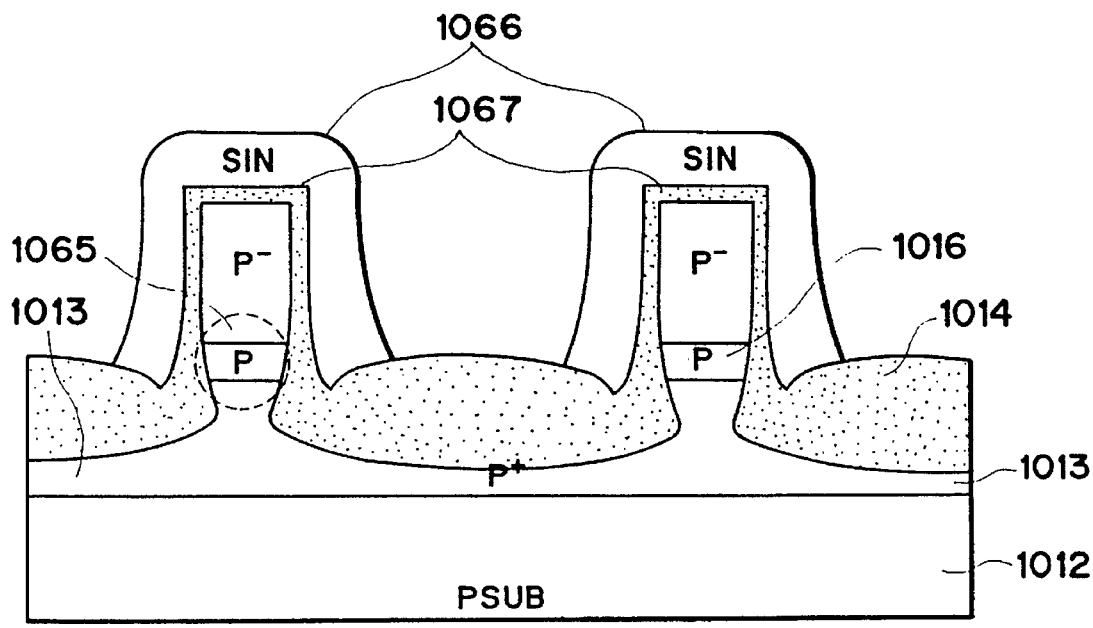
FIG. 16 is a schematic view illustrating the manufacturing method of the first reference example.

Next, pyrogenic oxidation is conducted on the wafer at about 900° C. to selectively oxidize the surface on which no silicon nitride film is formed. This process forms a field oxidized film 1014, as shown in FIG. 16. This field oxidation process deforms the silicon columnar I portion, as indicated by 1065. However, the deformed area is either the p layer 1016 or the p+ layer 1013, and is not affected by deformation (FIG. 16).

Next, the silicon nitride film 1066 used for selective oxidation and the pad oxide film 1067 are removed. After the exposed Si surface has been washed, the gate oxide film 1022 is formed by thermal oxidation. Thereafter, polysi W (tungsten) is continuously deposited, and then a gate electrode consisting of p$^+$ type polysilicon, $W_{1-x}Si_x$ and W was formed by injecting boron ions from the W surface and then by conducting annealing. The distance between the opposing gates of the transistor of this type is 0.1 μm. Thus, the transistor is turned on and off by controlling the entire potential of the channel portion by the gate voltage. Hence, the threshold thereof, which is reduced than that of a conventional MOSFET, is increased by the presence of the $p^+$ layer 1068. A W metal 1069 formed on the upper portion of the gate electrode reduces the resistance of the word lines.

After the patterning of the gate electrode, an $n^+$ layer is diffused using the gate as a mask to form the source layer 1030 and the drain layer 1017.

Figure 17:
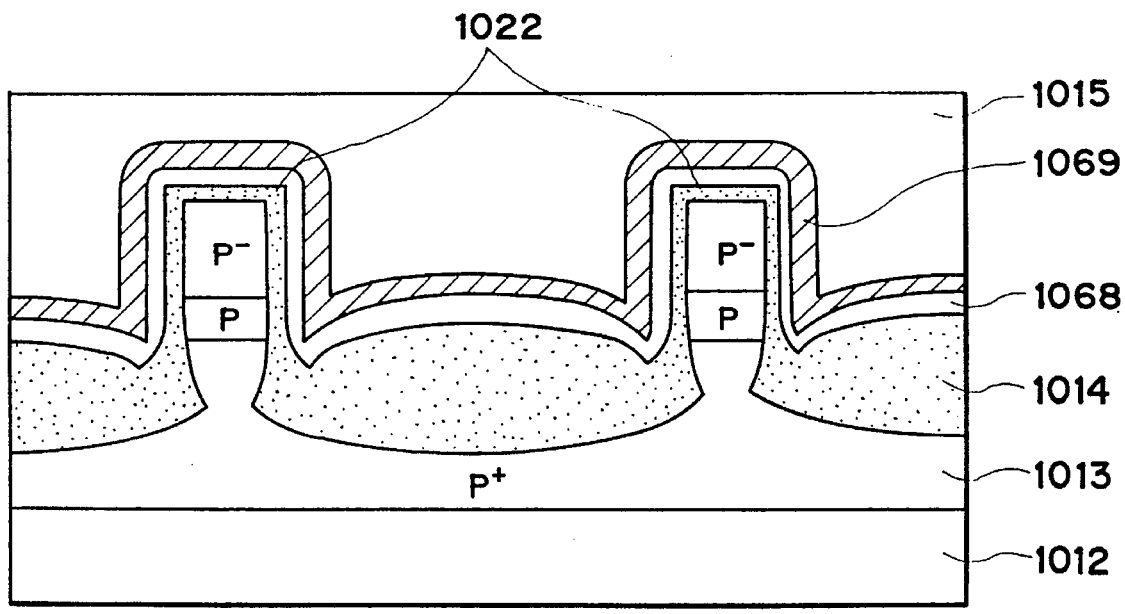
FIG. 17 is a schematic view illustrating the manufacturing method of the first reference example.
Figure 18:
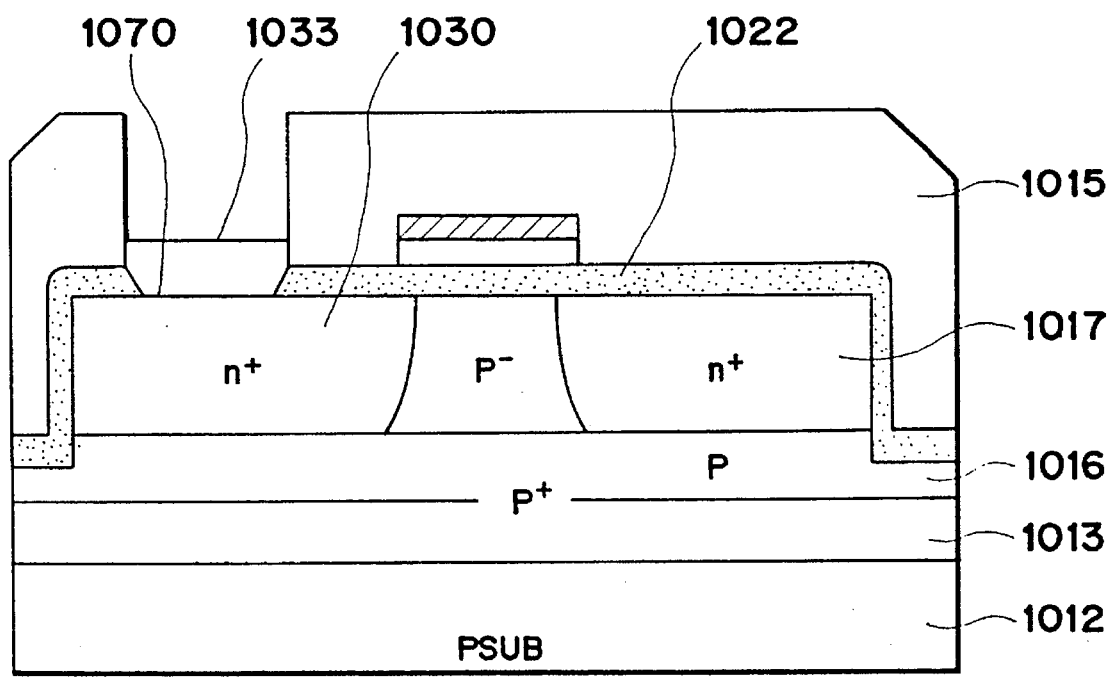
FIG. 18 is a schematic view illustrating the manufacturing method of the first reference example.

Next, as shown in FIG. 17, the interlayer insulator 1015 is planarized. Planarization of the insulating layer 1015 is achieved by a combination of deposition of tetraethyl orthosilicate (TEOS) and etching back.

Next, a contact hole 1070 is formed only in the source region 1030. Only in the contact hole, the Si surface is exposed. A 50 Å thick oxide silicon film 1033 is formed by CVD only in the contact hole. Thereafter, the concentration of the thin $SiO_2$ film is increased in an atmosphere of $N_2$ at 550° C. The thin $SiO_2$ film may also be formed by forming an oxide film in platinum after washing and then by increasing the concentration thereof in an atmosphere of $N_2$ at a temperature ranging from 500° to 600° C. Subsequently, the power source and bit line interconnections are formed, and then patterning and passivation films are formed, by which the cell structure is completed. In this reference example, the n channel MOSFET has been described. However, a p channel MOSFET can be manufactured by the same process, if the conductivity type is inverted. Thus, the peripheral circuit can be manufactured as a CMOS structure consisting of an n channel MOSFET and a p channel MOSFET.

As will be understood from the foregoing description, the first reference example of the present invention is of the type in which a conducted state and a non-conducted state are obtained by breakdown and non-breakdown of an insulating film, respectively, and is not of the type in which a small amount of stored electric charges is read out, as in the case of the conventional DRAM or $E^2PROM$. Therefore, even when the degree of fine processing is increased, reading out at a high S/N ratio can be provided. Furthermore, reading out is conducted using a transistor which has a new structure. Since this transistor has a fine structure and a high driving capability, high integration and high-speed reading out can be achieved.

(Second Reference Example)

A second reference example of the present invention will be described below with reference to FIGS. 19 through 22. The same reference numerals are used to denote parts which are the same as those shown in FIGS. 9 through 12.

The second reference example differs from the first reference example in that a p layer 1080 having the same conductivity type as that of the $p^-$ layer 1017 and a higher impurity concentration than the $p^-$ layer is formed on the $p^-$ layer 1017 serving as the channel area.

This structure is obtained by conducting epitaxial growth at different impurity concentrations when the p well layer 1016, the $p^-$ layer 1017 and the p layer 1080 are formed. Thus, the manufacturing process of the second reference example is the same as that of the first reference example.

Figure 19:
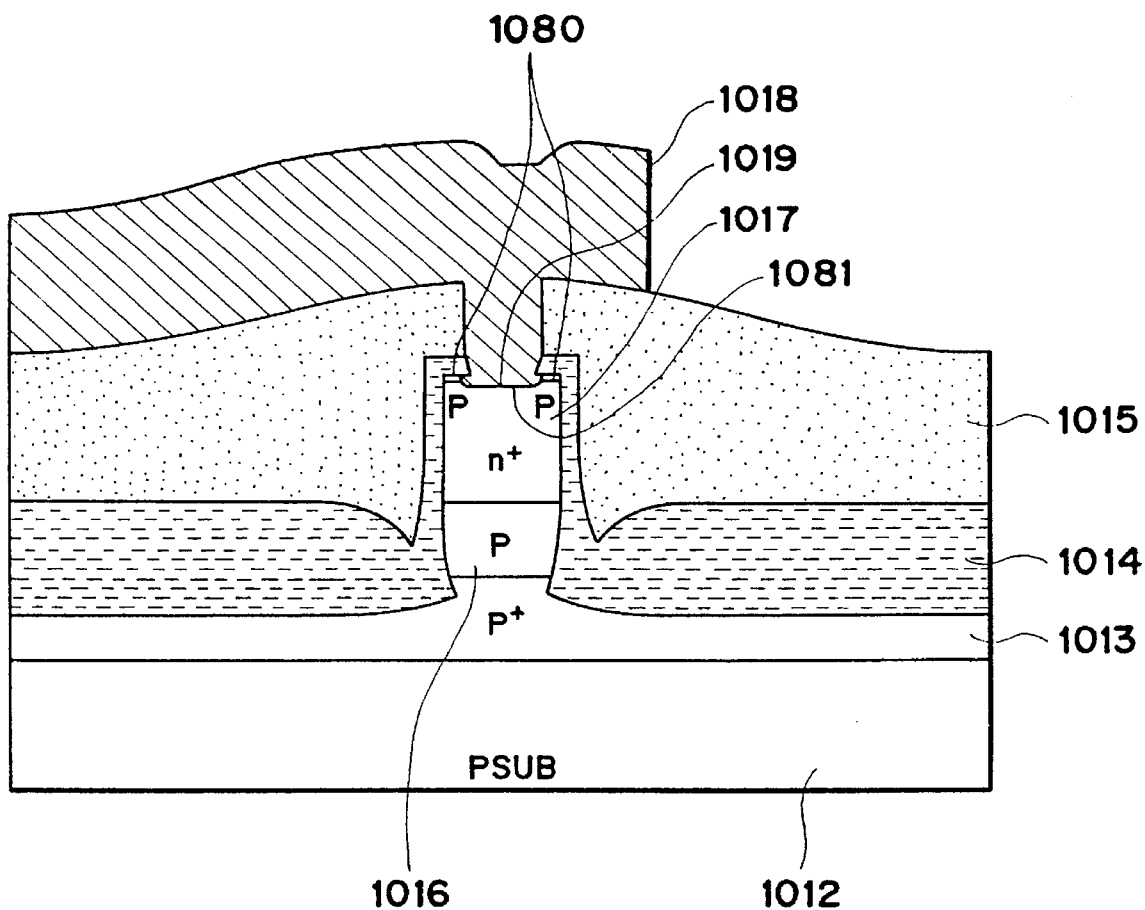
FIG. 19 is a schematic cross-sectional view of a semiconductor memory according to a second reference example of the present invention.
Figure 20:
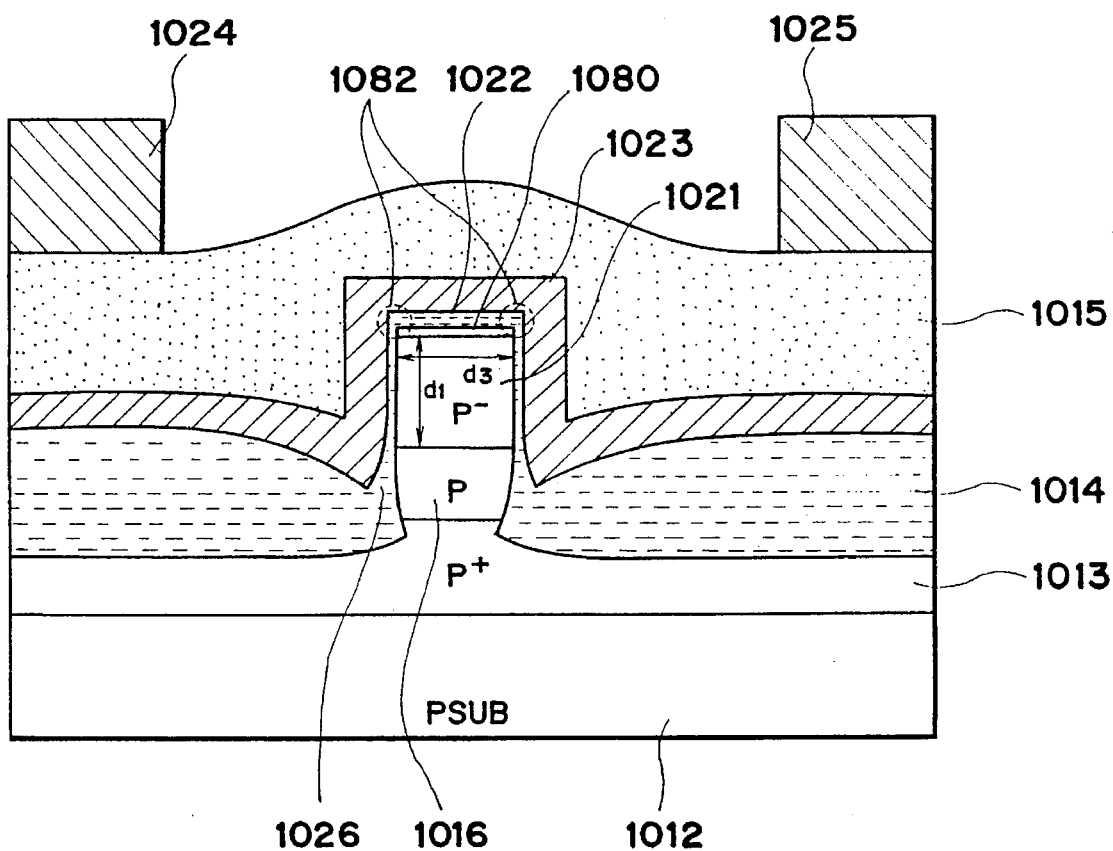
FIG. 20 is a schematic cross-sectional view of the second reference example of the present invention.
Figure 21:
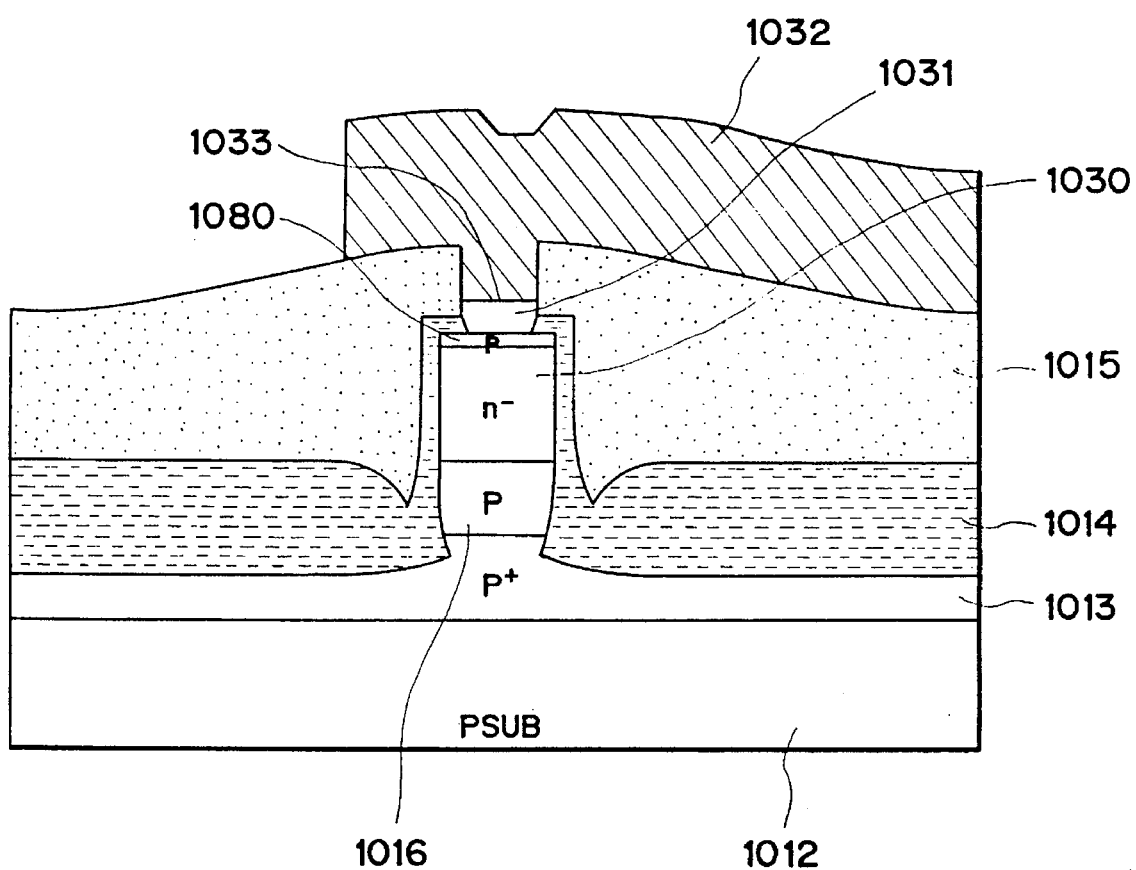
FIG. 21 is a schematic cross-sectional view of the second reference example of the present invention.
Figure 22:
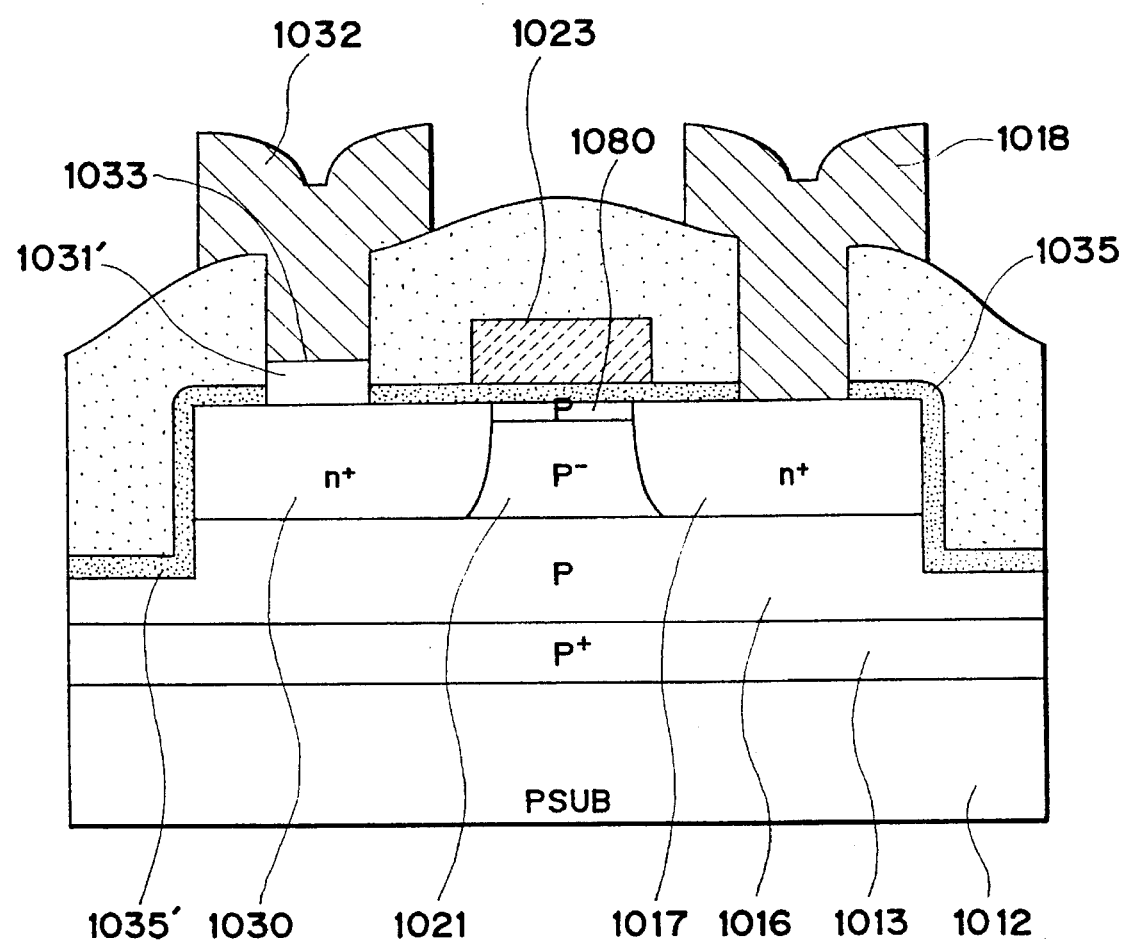
FIG. 22 is a schematic cross-sectional view of the second reference example of the present invention.

Furthermore, when contact between the drain layer 1017 and the power source is provided, the Si layer on the surface of the drain is slightly removed, as indicated by 1081 in FIG. 19, and then the drain layer 1017 is connected to the power source.

Next, the operation of the transistor employed in the second reference example will be described below.

The p layer 1016 and the p layer 1080 have impurity concentrations which ensure that no inversion layer is formed on the interface between the upper gate insulating film 1022 and the p layer 1080 even when the gate voltage is at a maximum during the operation. Hence, a channel is formed only on the side wall portion of the $p^-$ layer 1021 and the gate insulating film 1022. Therefore, the aforementioned structure is equivalent to the structure including two opposing gates, and thus assures stable operation.

Furthermore, although the thickness of the insulating film at the edge portion of Si is smaller than that of the flat portion and the withstanding voltage thereof is thus lower than that of the flat portion, as indicated by 1082, since the concentration of the inner p layer is high, sufficient withstanding voltage is obtained, and the thickness of the insulating layer can thus be made smaller than that of the insulating layer employed in the first reference example. This assures high gm characteristics.

Such excellent transistor characteristics provide high-speed reading out for the memory.

(Third Reference Example)

Figure 23:
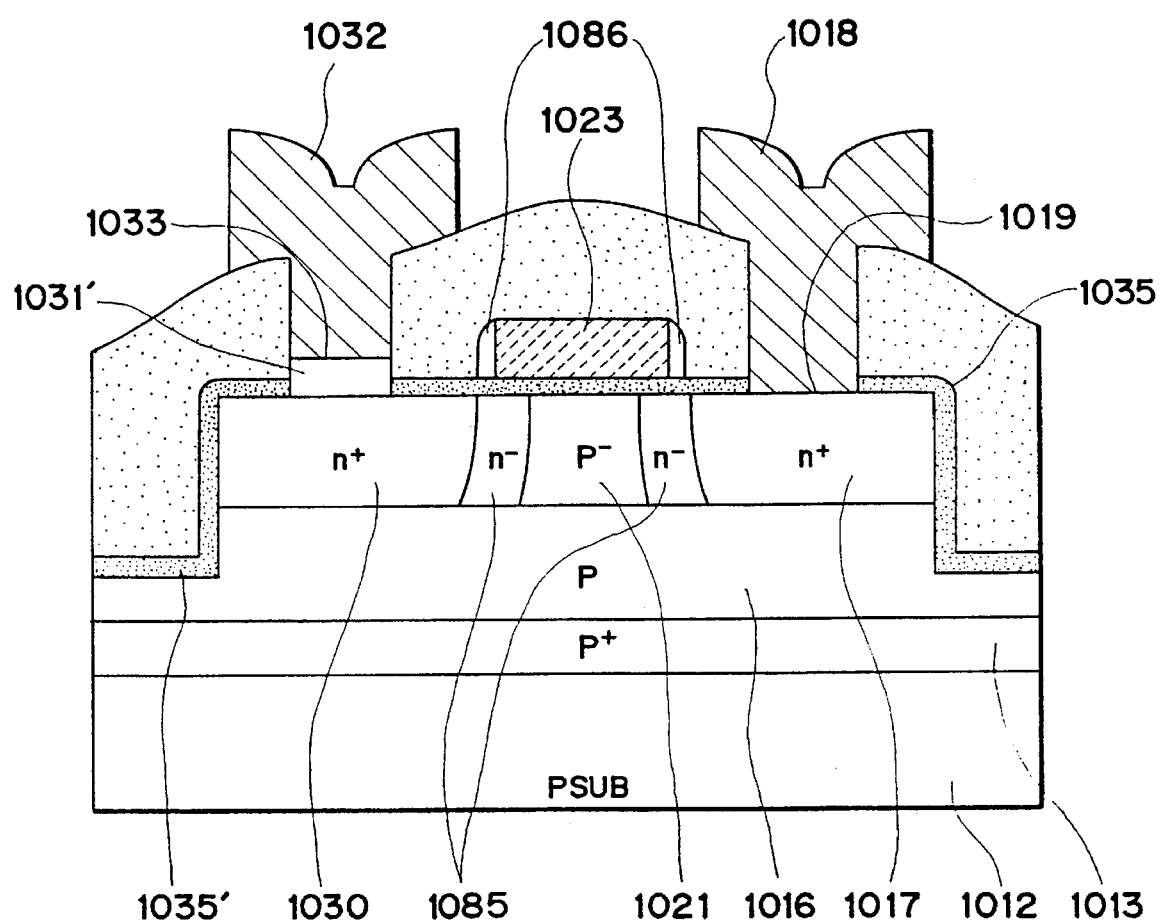
FIG. 23 is a schematic cross-sectional view of a semiconductor memory according to a third reference example of the present invention.

A third reference example of the present invention will be described below with reference to FIG. 23. Like the second reference example, the third reference example employs an improved memory cell transistor. Thus, the cross-sectional views of the portions excluding that shown in FIG. 23 which correspond to the first reference example are the same as FIGS. 9, 10 and 11. Parts which are the same as those of the first reference example are designated by the same reference numerals, and description thereof is omitted. The third reference example is characterized in that a $n^-$ layer 1085 is formed in the portions of the source and drain which are located near the gate electrode. This structure can be readily formed in a self-alignment fashion utilizing the insulating layer provided on the side wall of the gate electrode, as in the case of the manufacture of a structure, such as LDD or GOLD. In this structure, an electric field at the portion of the gate electrode near the source and drain is limited, and entry of unnecessary carriers into the channel area can be prevented. It is therefore possible to provide a highly reliable memory which exhibits high-speed reading out and which can prevent generation of hot carriers.

Furthermore, the $n^-$ layers are symmetrically provided for both the source and drain. However, since a high voltage is applied to the drain end and it is desirable that a resistor component be not provided near the source due to an improvement in the driving capability, an $n^-$ layer may be provided only at the drain side.

(Fourth Reference Example)

Figure 24:
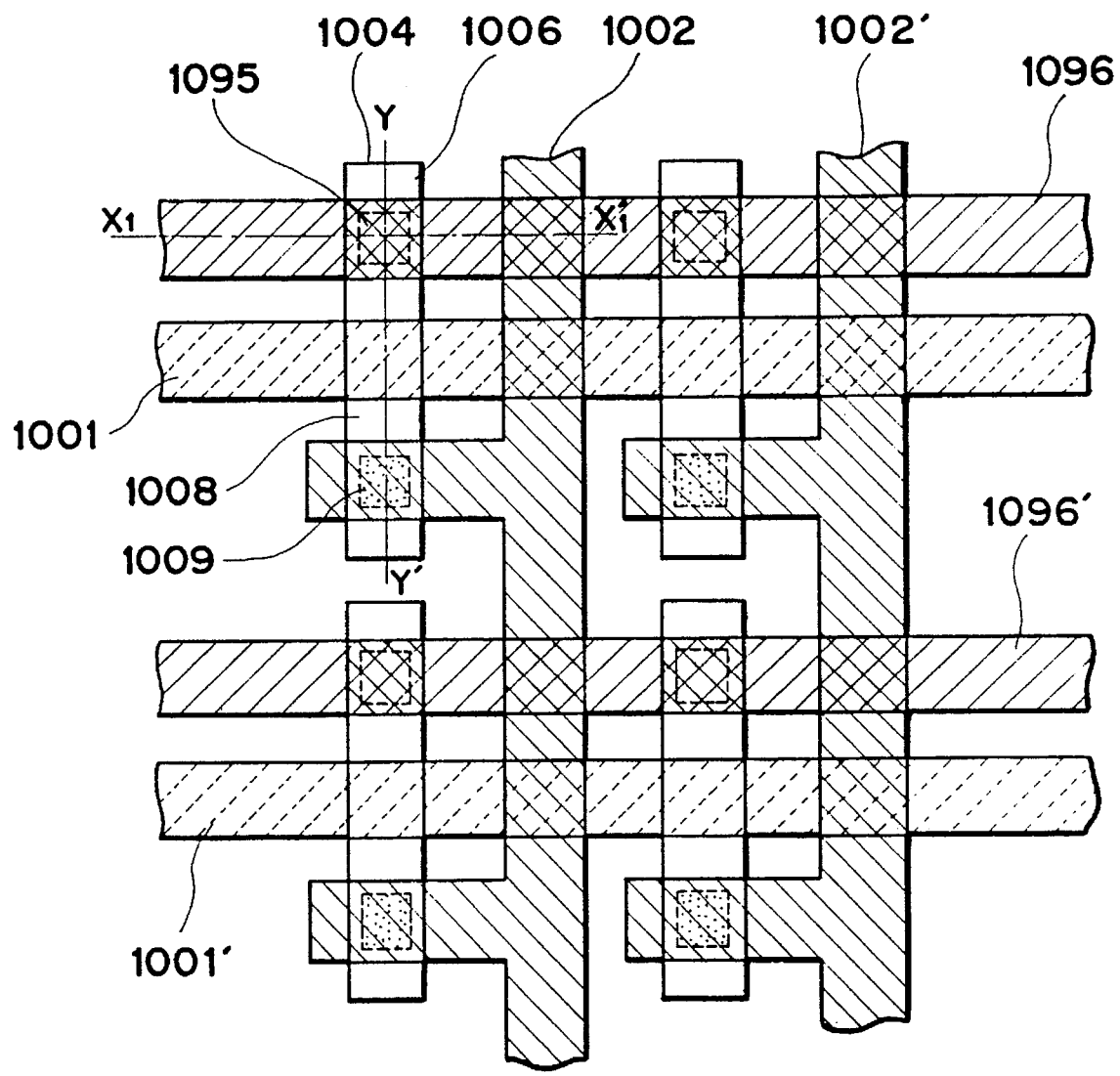
FIG. 24 is a schematic top view of a semiconductor memory according to a fourth reference example of the present invention.
Figure 25:
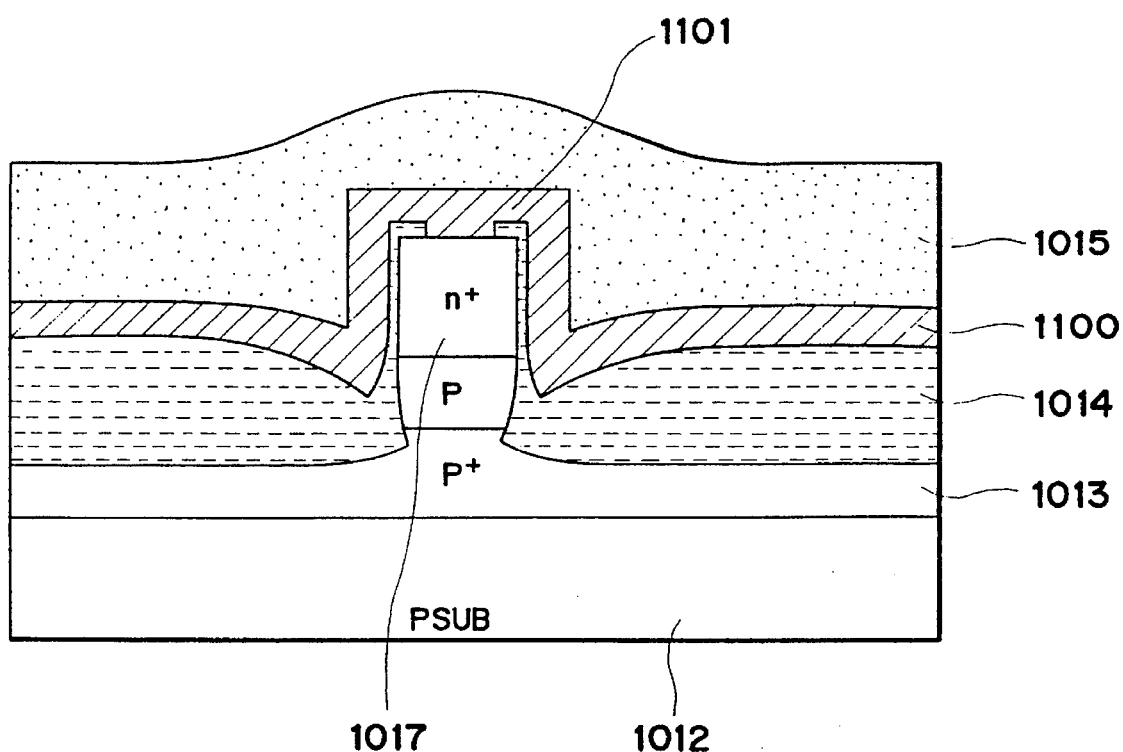
FIG. 25 is a schematic cross-sectional view taken along line $X_1$–$X_1'$ of FIG. 24.
Figure 26:
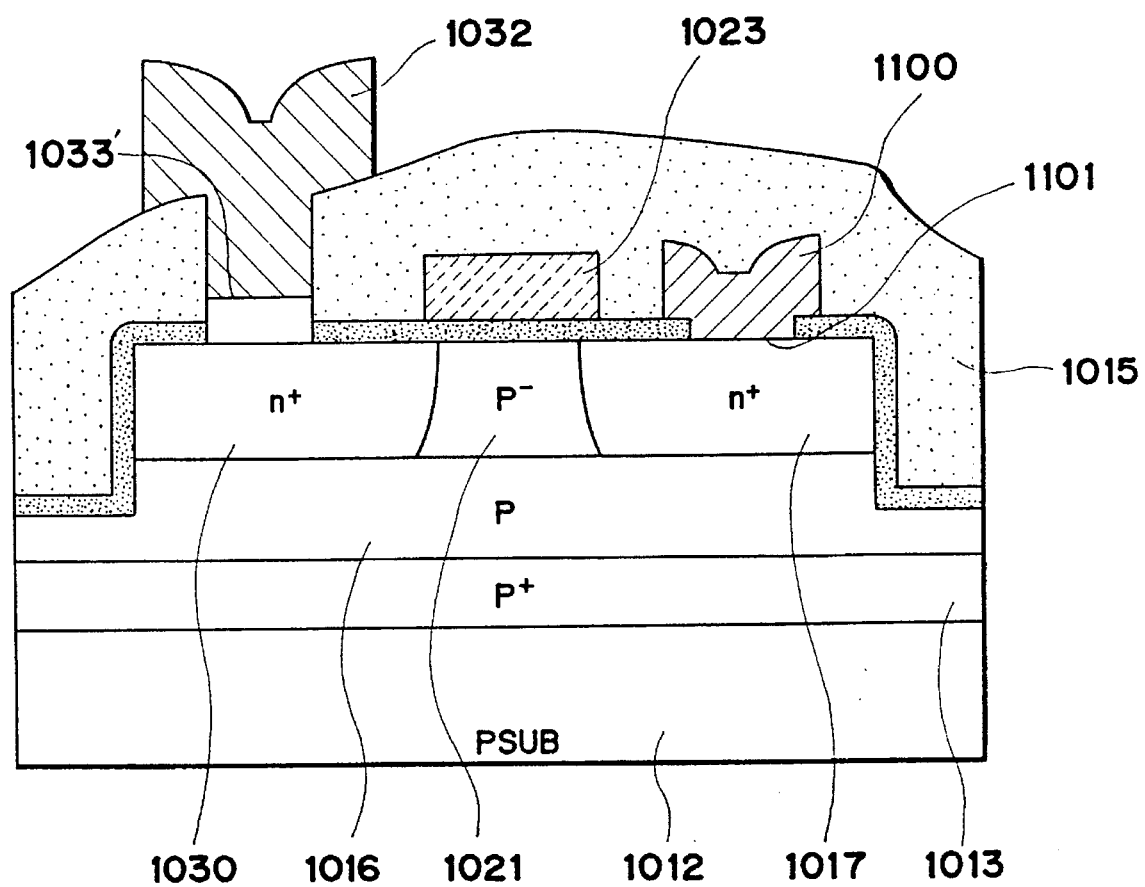
FIG. 26 is a schematic cross-sectional view taken along line Y–Y' of FIG. 24.

A fourth reference example of the present invention will be described below with reference to FIGS. 24, 25 and 26. FIG. 24 is a plan view of the fourth reference example. FIG. 25 is a section taken along a line $X_1$–$X_1'$ of FIG. 24. FIG. 26 is a section taken along a line Y–Y' of FIG. 24. In the first reference numeral, the word lines run in the horizontal direction, while the bit lines and power source lines are provided in the vertical direction. However, in the fourth reference example, word lines 1001 and 1001' and power source lines 1096 and 1096' run in the horizontal direction, while only bit lines 1002 and 1002' run in the vertical direction. Since the transistor of this reference example is longitudinally long, provision of the power source lines in the horizontal direction decreases the area by two cells from that of the first reference example and thus assures higher integration.

An example of the structure which assures the layout shown in FIG. 24 will be explained with reference to FIGS.

25 and 26. In FIG. 25, reference character 1100 denotes an n$^+$ type polysilicon—W$_{1-x}$Si$_x$—W interconnection which serves as a power source line; and 1101, a direct contact portion where the n$^+$ type polysilicon is in direct contact with the drain layer 1017. As can be seen from FIG. 26, two polysilicon—polycide W interconnections 1023 and 1100 are disposed in the horizontal direction. In addition to the structure shown in FIGS. 25 and 26, a metal double-layer interconnection, consisting of a first metal layer serving as a bit line and a second metal layer serving as a power source line, may also be employed.

(Fifth Reference Example)

Figure 27:
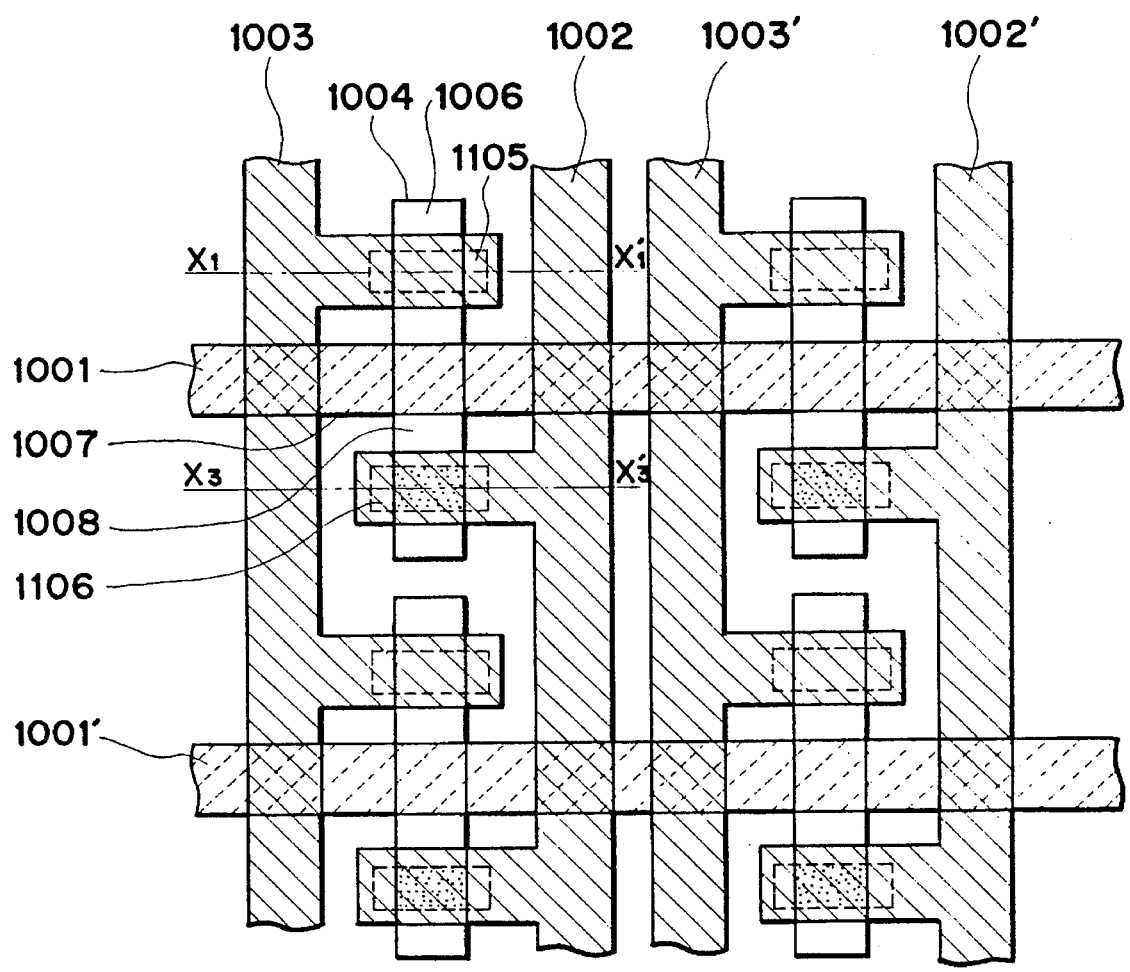
FIG. 27 is a schematic top view of a semiconductor memory according to a fifth reference example of the present invention.
Figure 28:
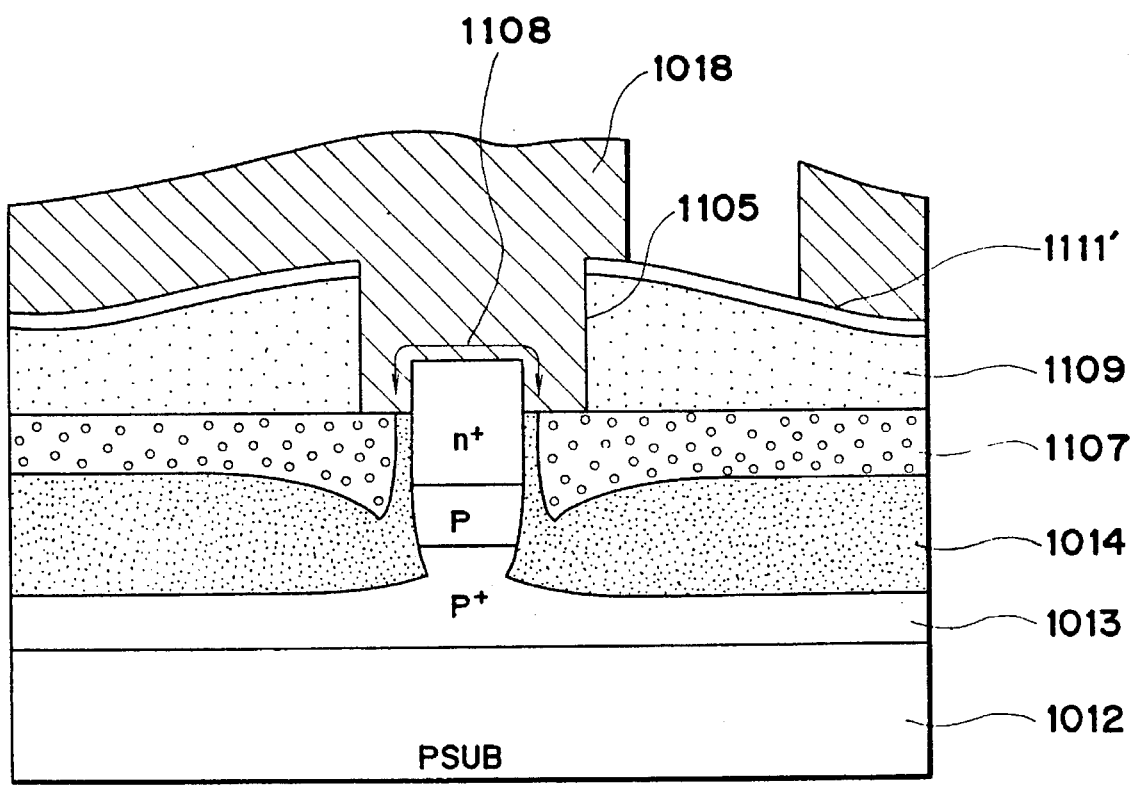
FIG. 28 is a schematic cross-sectional view taken along line $X_1$–$X_1'$ of FIG. 27.
Figure 29:
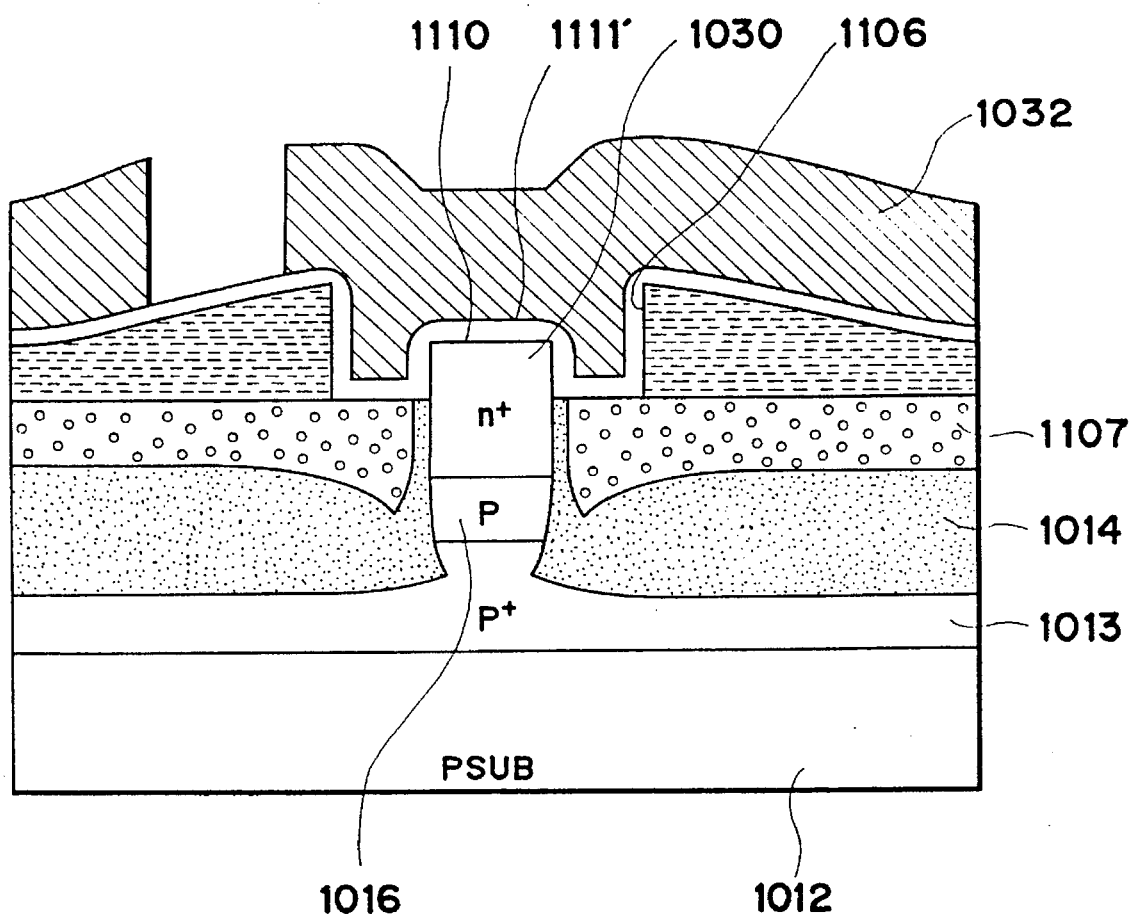
FIG. 29 is a schematic cross-sectional view taken along line $X_3$–$X_3'$ of FIG. 27.

A fifth reference example of the present invention will be described below with reference to FIGS. 27 through 29. FIG. 27 illustrates the layout of a memory cell. FIG. 28 is a section taken along line X$_1$–X$_1$' of FIG. 27. FIG. 29 is a section taken along line X$_3$–X$_3$' of FIG. 27. This reference example differs from the first reference example in that the contact size of the source and the drain of the transistor is wider. When the contact, which is long in a direction perpendicular to the direction (Y–Y' direction) in which a current flows in the transistor, is made wide, contact can be provided even at the side wall of the source and drain, and contact resistance can thus be reduced. When the degree of fine processing is high, the circuit characteristics are affected not only by the driving capability of the transistor but also by the parasitic resistance and capacity thereof. The aforementioned structure is excellent in terms of reduction in the parasitic resistance. The structure of the contact will now be described in detail with reference to FIGS. 28 and 29.

In FIG. 28, reference character 1105 denotes a contact hole for the drain layer; 1107, a first interlayer insulator for stopping the contact edge; 1109, a second interlayer insulator which is made of a material different from that of the first interlayer insulator and which ensures etching selectivity. If the first interlayer insulator is, for example, a silicon nitride film, a silicon oxide film is used as the second interlayer insulator. In this way, the drain can be brought into contact with the metal interconnection over a wide area, as indicated by 1108 in FIG. 28. In the contact for the source portion, a thin insulating film 1111 for a memory is formed on the surface of an exposed n$^+$ layer 1110, as shown in FIG. 29, which is in turn in contact with a metal interconnection 1032 through a p$^+$ layer. As mentioned above, in the present reference example, the resistance of the contact portion can be further reduced, and high-speed reading out can thus be provided.

(Sixth Reference Example)

A sixth reference example of the present invention will be described below with reference to FIGS. 30 and 31. In the sixth reference example, the same structure as that of the first reference example is manufactured by the different manufacturing method. Parts which are the same as those of FIGS. 14 through 18 are designated by the same reference numerals, description thereof being omitted.

Figure 30:
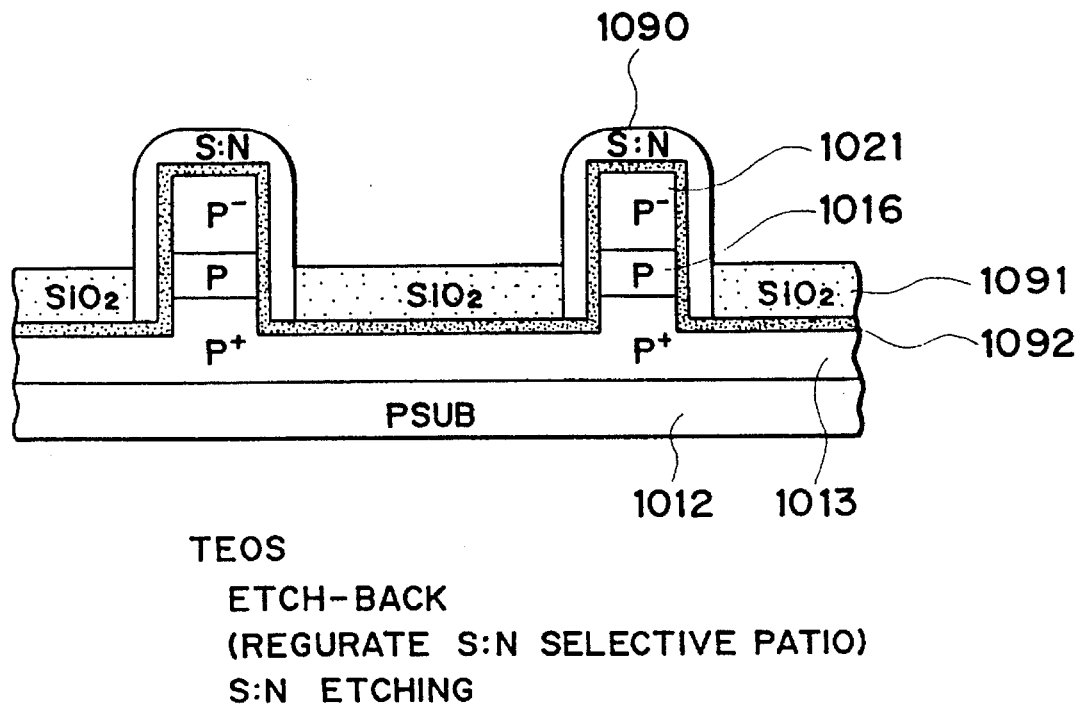
FIG. 30 is a schematic view illustrating a method of manufacturing a semiconductor device according to a sixth reference example of the present invention.
Figure 31:
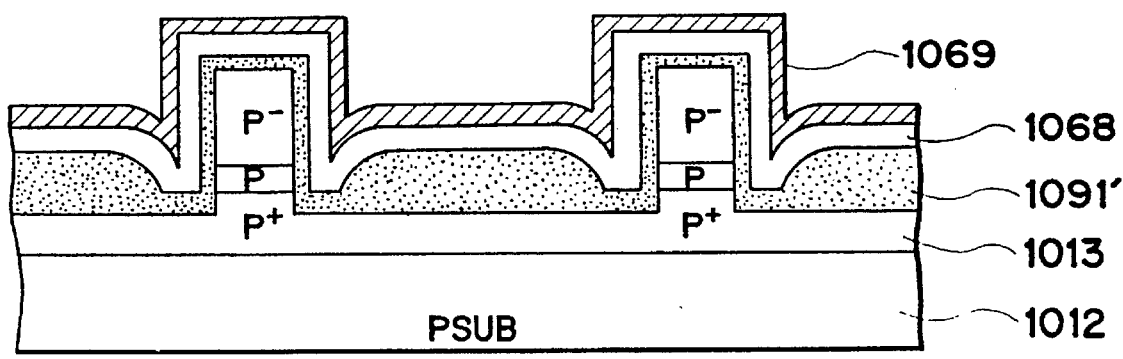
FIG. 31 is a schematic view illustrating the method of manufacturing a semiconductor device according to the sixth reference example of the present invention.

As shown in FIG. 30, the sixth reference-example is characterized in that the field oxide film is formed not by selective oxidation but by a combination of film formation and etching. The manufacturing process up to the formation of pad oxide film and silicon nitride film is the same as that of the first reference example. Thereafter, the silicon oxide film formed on the surface from which the silicon nitride film is anisotropically etched is removed, and a thermally oxide film 1092 is formed again. An interlayer insulator is formed utilizing TEOS, and a SiO$_2$ layer 1091 is formed by etchback. A sufficient etching selectivity between the silicon nitride film and the silicon oxide film is necessary for the etchback. In this etchback process, the surface of the field oxide film is made higher than an interface between the p layer 1016 and the p$^+$ buried layer 1013 and lower than an interface between the p layer 1016 and the p$^-$ layer 1021. After the silicon nitride film and then the pad oxide film are removed, the wafer is washed and gate oxidation is then conducted so as to provide the field oxidized film, as indicated by 1091' of FIG. 31. Thereafter, the gate electrode layers 1068 and 1069 are formed in the same manner as that of the first reference example. The aforementioned manufacturing method does not contain the high temperature treatment. Consequently, unnecessary diffusion of impurities is reduced, and the stable size of the channel area can be obtained. Furthermore, distortion, which would be generated by the field oxidation, can be eliminated. Since variations in the individual memory cells in the semiconductor memory can be reduced, high yield can be achieved.

Writing and reading out operations were performed on the semiconductor memories manufactured on the basis of the individual reference examples. In each memory, excellent operations could be obtained.

The basic structure of the present invention has been described above using the reference examples. Embodiments of the present invention, which is an improvement of those reference examples, will be described in detail below. However, they are illustrative and not restrictive, since various modifications are possible by combining and replacing individual elements.

(First Embodiment)

A first embodiment of the present invention will be described below with reference to FIGS. 32 to 33C.

Figure 32:
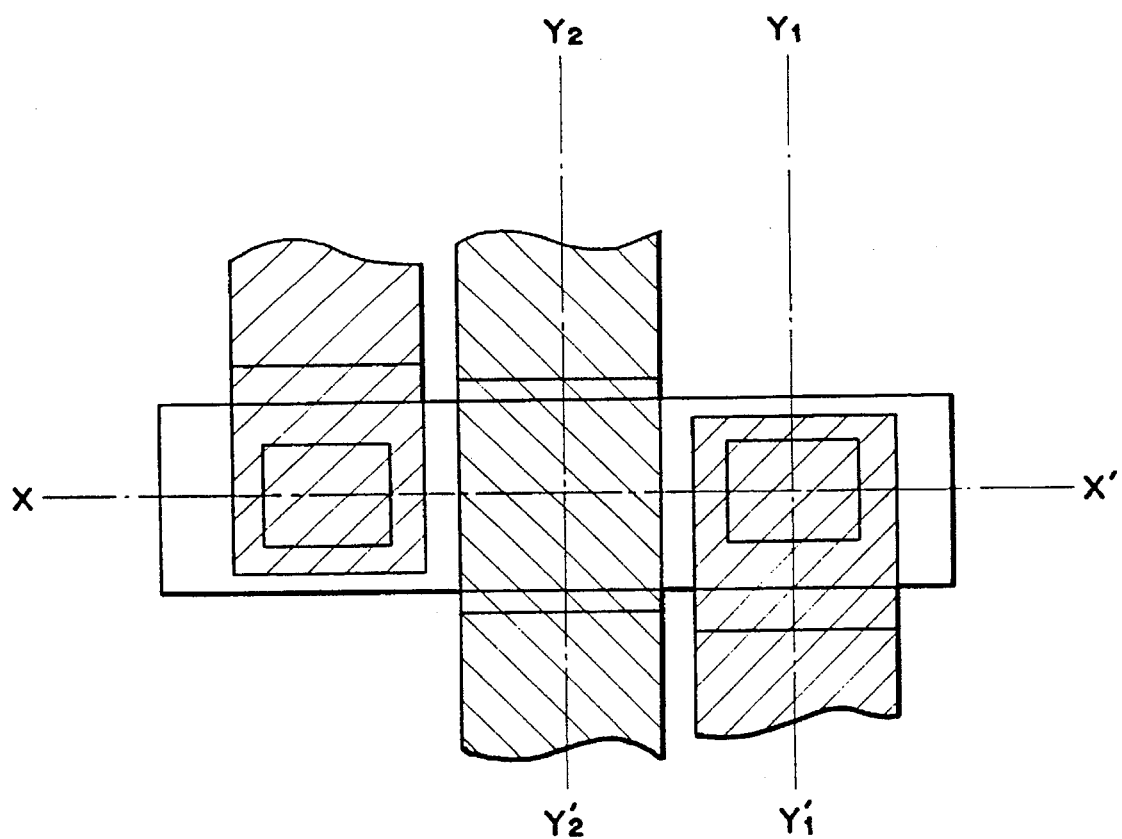
FIG. 32 is a schematic top view of a transistor according to a first embodiment of the present invention.

FIG. 32 is a top view of a MOS transistor employed in the first embodiment of the present invention.

Figure 33A:
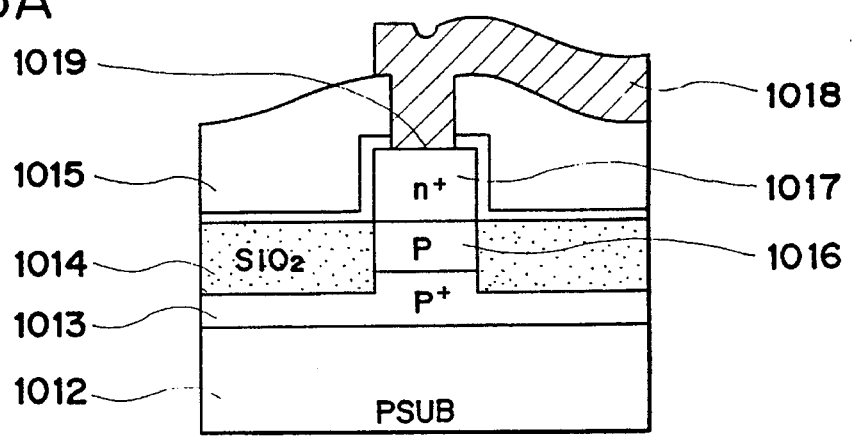
FIGS. 33A to 33C are schematic cross-sectional views of the first embodiment of the present invention.
Figure 33B:
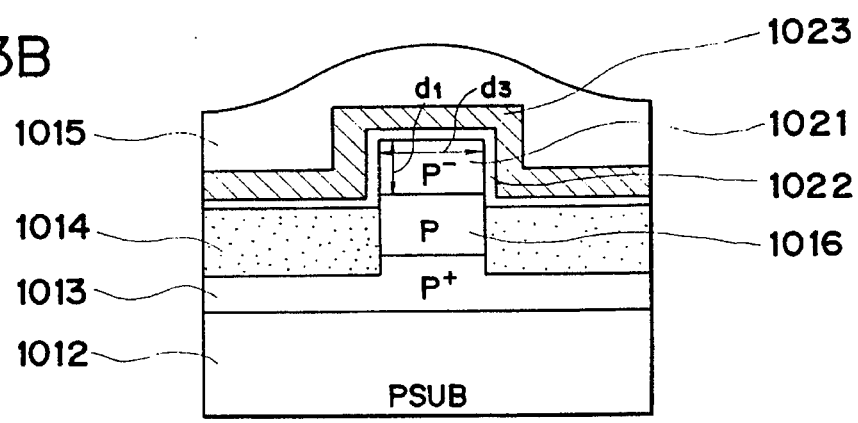
Figure 33C:
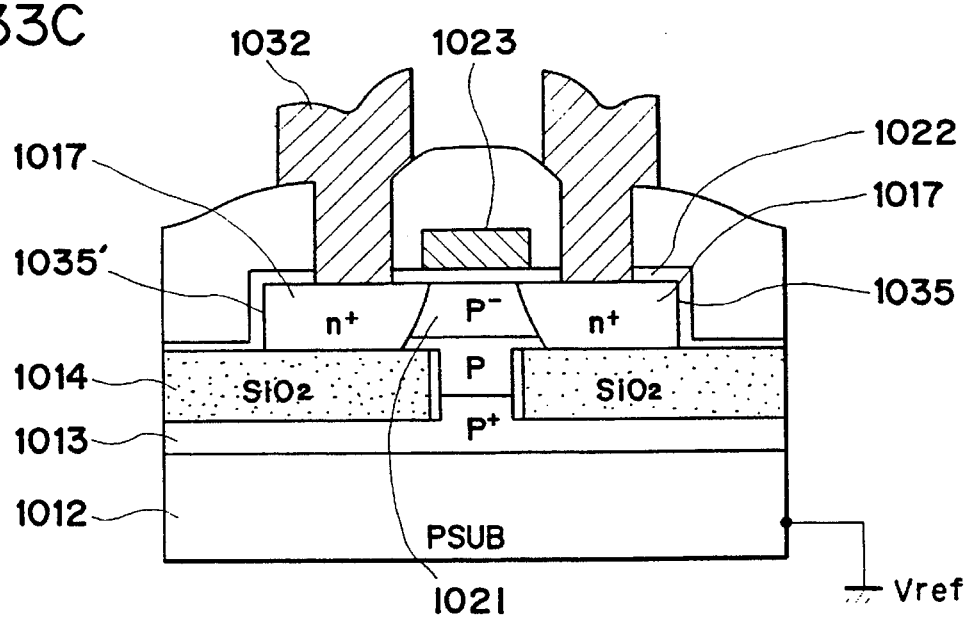

FIGS. 33A, 33B and 33C are respectively cross sections taken along lines Y$_1$–Y$_1$', Y$_2$–Y$_2$' and X–X' in FIG. 32.

In FIG. 33A, reference numeral 1012 denotes a p type silicon substrate having a resistivity of several Ω·cm, which will be replaced with another type, depending on the type of used transistor; 1013, a p$^+$ type buried layer; 1014, a field oxide film; 1015, an interlayer insulator which is made of SiO, PSG, BPSG, SiN or SiON; 1016, a p type layer provided immediately below a channel; 1017, a drain n$^+$ high concentration layer; and 1018, an interconnection for a drain power source which is in contact with the drain layer through a contact portion 1019.

In FIG. 33B which is the cross-section of the gate portion of the transistor, reference character 1021 denotes a channel region having a concentration of, for example, $5 \times 10^{14}$ to $5 \times 10^{16}$ cm$^{-3}$; and 1022, a gate oxide film having a thickness of about 6 to 25 nm. The thickness of the gate oxide film 1022 should be changed depending on the gate length.

The gate oxide film may be a Si oxide film, a SiON film or a laminated film consisting of SiO$_2$ and SiON. A gate electrode 1023 has a structure which assures a low resistance and a work function ensuring a desired threshold of the transistor, such as a polycide made up of a substrate of p$^+$—poly Si and an upper layer of W$_x$Si$_{1-x}$.

As will be clear from FIGS. 33A to 33C, the channel region 1021 is defined by both the gate film 1022 and the p layer 1016. Therefore, the channel width of the transistor is expressed by $2d_1 + d_3$.

In this transistor structure, the actually activated channel region is limited by the p region located below it, and variations in the individual transistors are thus greatly reduced.

In FIG. 33C, the same reference numerals are used to denote parts which are the same as those shown in FIGS.

33A and 33B, description thereof being omitted. As indicated by 1035 and 1035', the transistors are separated from each other by a vertical surface. An interlayer insulator is buried between the adjacent transistors. Therefore, the separation width can be narrowed, and the transistor having this structure is suited to a high integration device. The gate electrode structure viewed on the section shown in FIG. 33C is similar to that of ordinal MOSFETs. However, on the section of FIG. 33A which is perpendicular to the section shown in FIG. 33C, the gate electrode is disposed such that it opposes the side wall portions.

Furthermore, although the gate electrode is provided above the channel region, if the relation between $d_1$ and $d_3$ shown in FIG. 33A is determined by $$d_3 < d_1 \qquad \text{Equation (1),}$$

even when the gate voltage increases, the potential of the channel region is increased from both sides thereof, and the electric field in the channel region can thus be limited as compared with the general MOSFET. Furthermore, changes in the potential take place over the entire channel region. Consequently, when the transistor is turned on, a large current can flow, and a high driving capability can be obtained.

Next, the manufacturing method of the first embodiment of the present invention will be described with reference to FIGS. 34A to 34D. The sections shown in FIGS. 34A through 34C correspond to that shown in FIG. 33A, and the section shown in FIG. 34D corresponds to that of FIG. 33B.

First, boron ions are injected into the surface of the p type silicon substrate, and then the ion injected layer is activated at 900° C. After the formation of the $p^+$ high concentration layer, a 600 nm thick silicon oxide film is formed at 900° C.

Next, the portion of the silicon oxide film which corresponds to the channel portion of the MOS transistor is opened by dry etching, and a polysilicon is formed to a thickness of 25 nm by LP-CVD. Thereafter, the polysilicon is selectively removed by etchback so that the portion thereof located on the side wall of the opening remains. Since formation of the poly silicon film and the etchback process are conducted to improve the crystallinity of a silicon film formed in the subsequent SEG (selective epitaxial growth) process, they may be omitted.

Thereafter, the 1 μm thick p layer and the 600 nm thick $p^-$ layer are epitaxially grown in sequence at 850° C. and under 50 Torr using $H_2$, HCl, $SiHCl_3+H_2$, $B_2H_6+H_2$ gases. Under these conditions, the epitaxial layers are formed only in the opening in a thickness of 1.6 μm. The thickness of the portion of the epitaxial layers located on the source and drain is 1.0 μm. The length of the epitaxial layers in the lateral direction is 1.1 μm. Also, low-temperature epitaxial growth restricts welling of impurities, and provides firm joint between $p^+$–p and p–$p^-$. The concentration of the $p^+$ layer is $10^{19}$ cm$^{-3}$. The concentration of the p layer is $10^{17}$ cm$^{-3}$. The concentration of the $p^-$ layer is $10^{16}$ cm$^{-3}$.

Next, silicon is etched in the vertical direction by dry etching to make the epitaxial layers upright relative to the substrate.

Subsequently, the wafer is thermally oxidized to form the gate oxide film.

Thereafter, polySiW (tungsten) is continuously deposited, and then a gate electrode consisting of $p^-$—polySi—$W_{rx}$-$Si_x$—W is formed by injecting boron ions from the W surface and then by conducting annealing. The distance between the opposing gates of the transistor of this type is 0.1 μm. Thus, the transistor is turned on and off by controlling the entire potential of the channel portion by the gate voltage.

After the patterning of the gate electrode, an $n^+$ layer is diffused using the gate as a mask to form the source layer 1030 and the drain layer 1017.

Figure 34A:
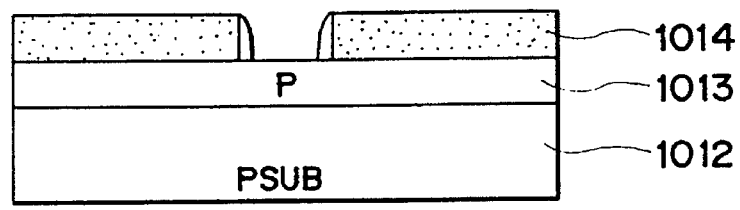
FIGS. 34A to 34D are schematic views illustrating a method of manufacturing the transistor according to the first embodiment of the present invention.
Figure 34B:
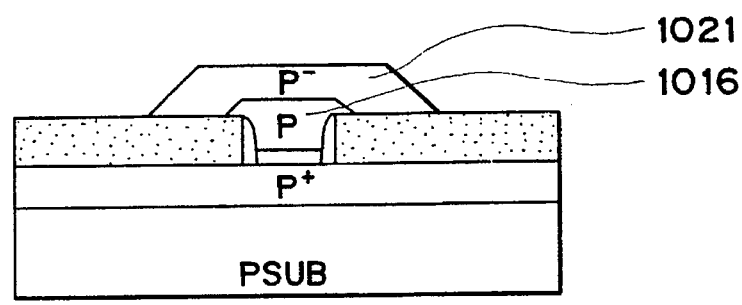
Figure 34C:
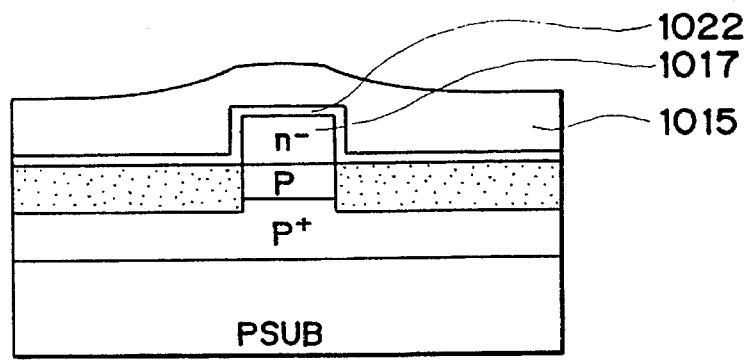
Figure 34D:
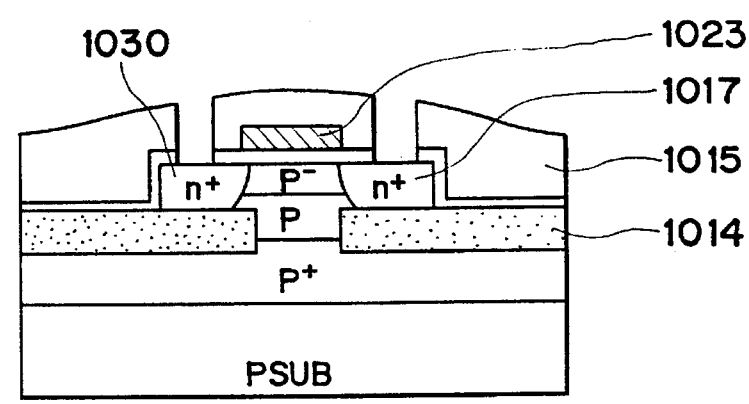

Next, as shown in FIG. 34C, the interlayer insulator 1015 is planarized. Planarization of the insulating layer 1015 is achieved by a combination of deposition of tetraethyl orthosilicate (TEOS) and etching back.

Next, a contact hole is opened, Ti, TiN and Al—Si are formed and then the interconnections are formed. Finally, a passivation film is formed, by which manufacture of the transistor structure is completed. In this embodiment, the n channel MOSFET has been described. However, if the conductivity type is inverted, a p channel MOSFET can be manufactured by the same process, description thereof being omitted. It is therefore possible to manufacture a CMOS circuit using the the MOSFETs having the aforementioned structure.

(Second Embodiment)

Figure 35A:
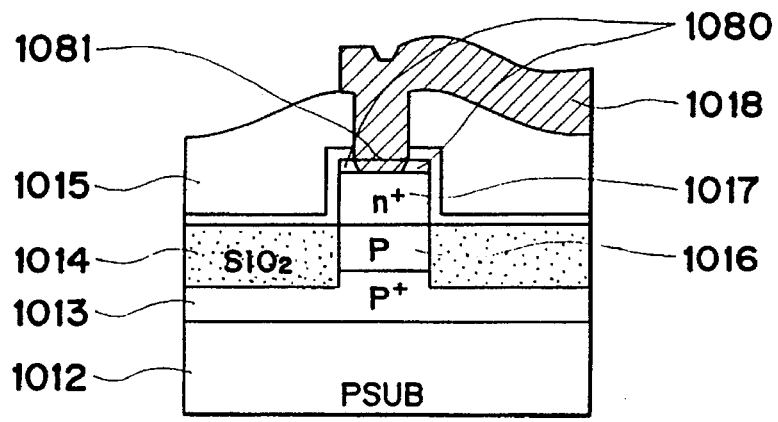
FIGS. 35A to 35C are schematic cross-sectional views of a transistor according to a second embodiment of the present invention.
Figure 35B:
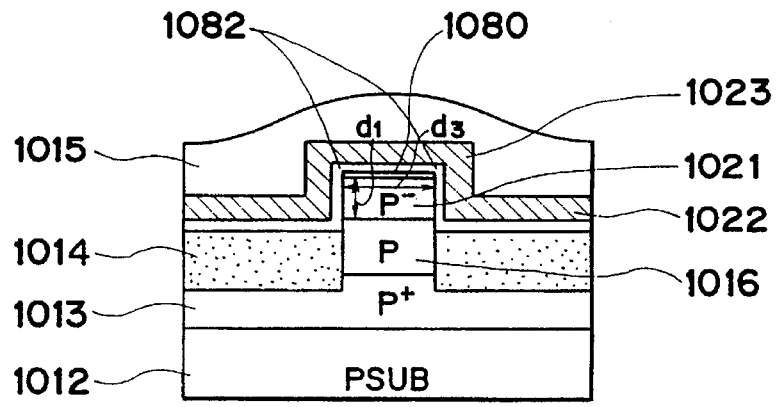
Figure 35C:
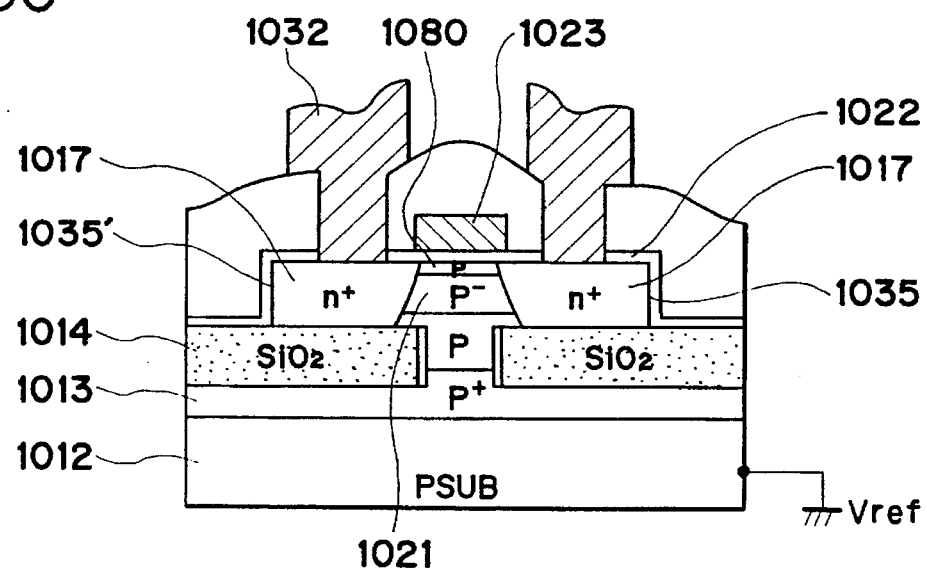

A second embodiment of the present invention will be described below with reference to FIGS. 35A to 35C. In FIGS. 35A to 35C, the same reference numerals are used to denote parts which are the same as those shown in FIGS. 33A to 33C.

The second embodiment differs from the first embodiment in that a p layer 1080 having the same conductivity type as that of the $p^-$ layer 1021 and a higher impurity concentration than the $p^-$ layer is formed on the $p^-$ layer 1021 serving as the channel area.

This structure, consisting of the p layer 1016, the $p^-$ layer 1017 and the p layer 1080, is formed by conducting epitaxial growth at different impurity concentrations. Thus, the manufacturing process of the second embodiment is the same as that of the first embodiment.

Furthermore, when contact between the drain layer 1017 and the power source is to be provided, the Si layer on the surface of the drain is slightly removed, as indicated by 1081 in FIG. 35A, and then the drain layer 1017 is connected to the power source.

Next, the operation of the transistor employed in the second embodiment will be described below.

The p layer 1016 and the p layer 1080 have impurity concentrations which ensure that no inversion layer is formed on the interface between the upper gate insulating film 1022 and the p layer 1080 even when the gate voltage applied when the transistor is activated is at a maximum during the operation. Hence, a channel is formed only on the side wall portion of the $p^-$ layer 1021 and that of the gate insulating film 1022. Therefore, the aforementioned structure is equivalent to the structure including two opposing gates, and thus assures stable operation.

Generally, the thickness of the insulating film at the edge portion of Si is smaller than that of the flat portion and the withstanding voltage thereof is thus lower than that of the flat portion, as indicated by 1082. However, since concentration of the inner p layer is high, sufficient withstanding voltage is obtained, and the thickness of the insulating layer can thus be made smaller than that of the insulating layer employed in the first embodiment. This assures excellent gm characteristics.

(Third Embodiment)

Figure 36:
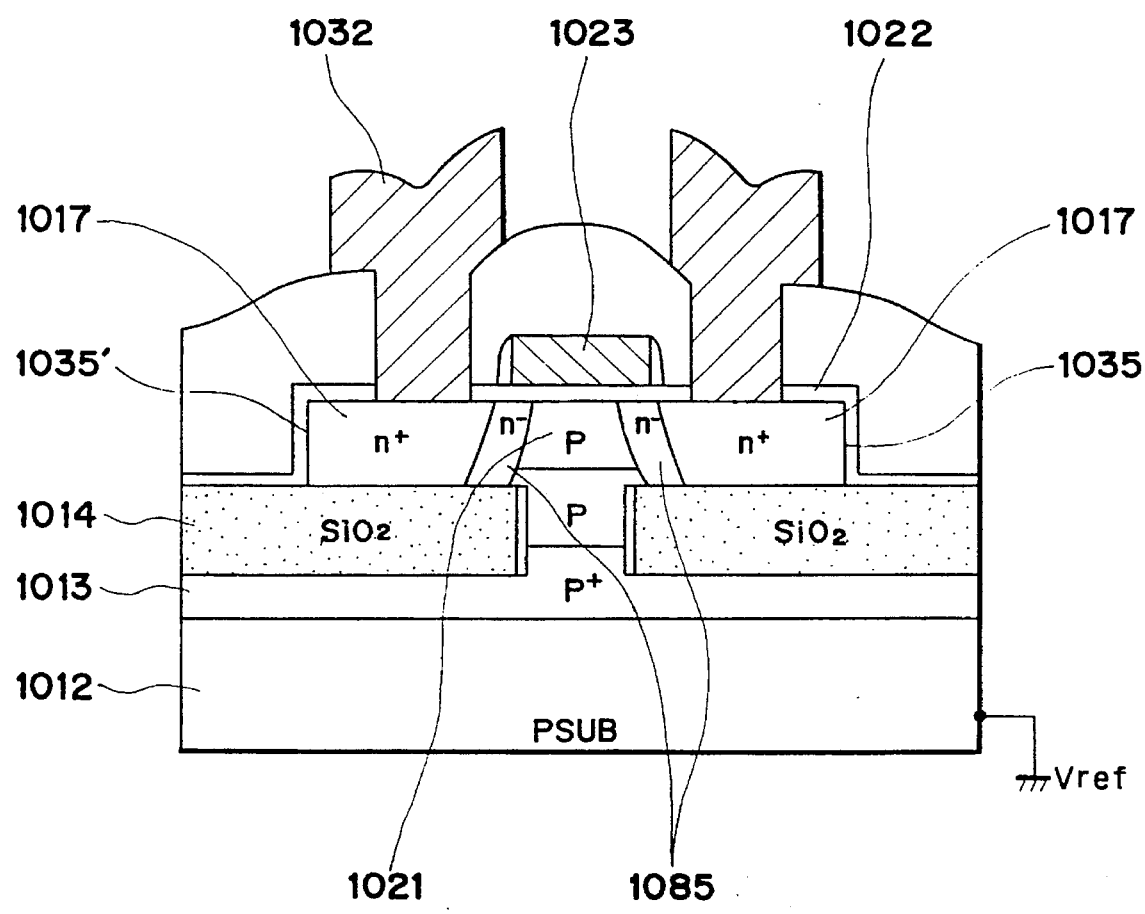
FIG. 36 is a schematic cross-sectional view of a transistor according to a third embodiment of the present invention.

A third embodiment of the present invention will be described below with reference to FIG. 36. Like the second embodiment, the third embodiment employs an improved memory cell transistor. The third embodiment differs from the first embodiment only in X–X' section. Parts of this embodiment which are the same as those shown in FIG. 33C are designated by the same reference numerals, and description thereof is omitted. The third embodiment is characterized in that an n– layer 1085 is formed in the portions of the source and drain which are located near the gate electrode. This structure can be readily obtained in a self-alignment fashion utilizing the insulating layer provided on the side wall of the gate electrode, as in the case of the manufacture of LDD or GOLD. In this structure, an electric field at the portion of the gate electrode near the source and drain is limited, and entry of unnecessary carriers into the channel region can be prevented. It is therefore possible to provide a highly reliable memory which exhibits high-speed reading out and which can prevent generation of hot carriers.

Furthermore, the n⁻ layers are symmetrically provided for both the source and drain. However, since a high voltage is applied to the portion of the gate electrode provided near the drain and it is desirable that a resistor component be not provided near the source due to an improvement in the driving capability, an n– layer may be provided only at the drain side.

(Fourth Embodiment)

Figure 37:
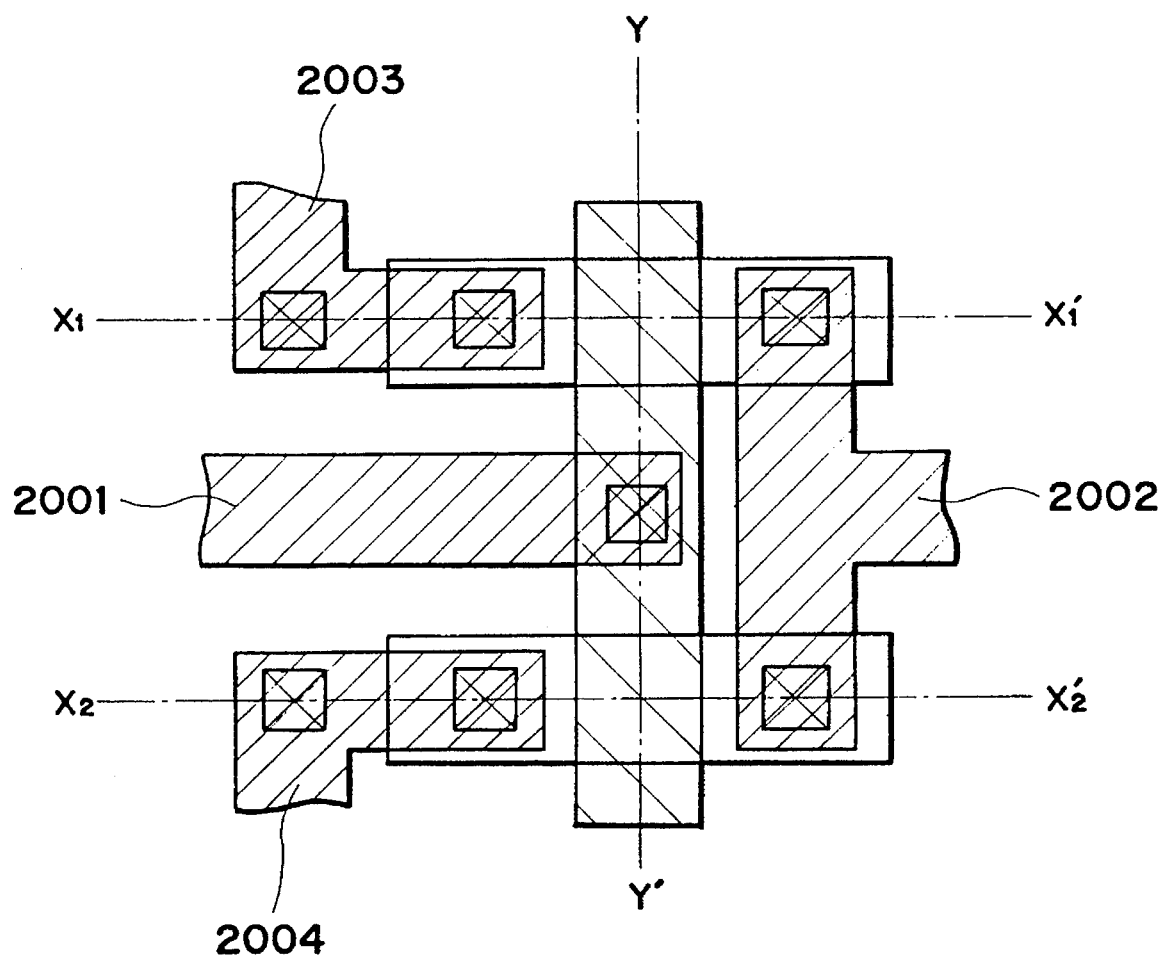
FIG. 37 is a schematic top view of a semiconductor device according to a fourth embodiment of the present invention.

A fourth embodiment of the present invention will be described below with reference to FIG. 37.

Figure 38A:
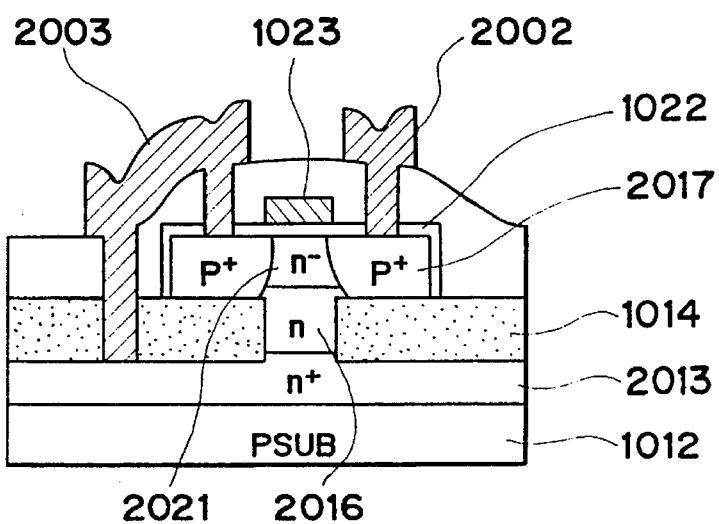
FIGS. 38A to 38C are schematic cross-sectional views of the fourth embodiment of the present invention.
Figure 38B:
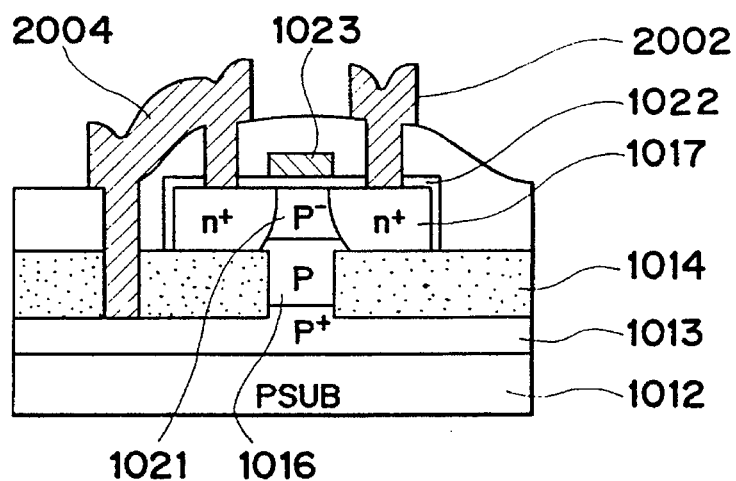
Figure 38C:
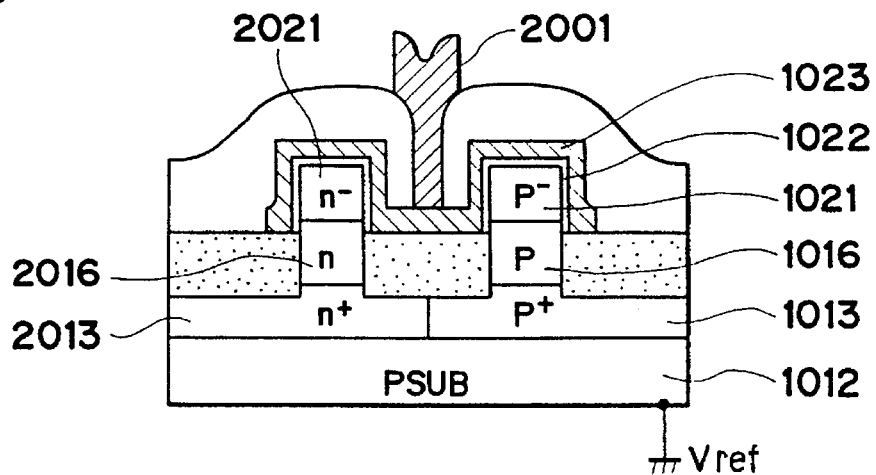

In this embodiment, the MOSFET of the present invention is formed as a CMOS inverter. FIG. 38A is a section taken along line X1–X1' of FIG. 37. FIG. 38B is a section taken along line X2–X2' of FIG. 37. FIG. 38C is a section taken along line Y–Y' of FIG. 37. In FIGS. 37 to 38C, the same reference characters are used to denote parts which are the same, and description thereof is omitted. Reference character 2001 denotes an input of a CMOS inverter; 2002, an output thereof; 2003, a power source; and 2004, an earth.

The manufacturing method of this embodiment is substantially the same as that of the first embodiment. To form a CMOS transistor, however, it differs from the manufacturing method of the first embodiment in the following points. That is:

1. A p⁺ layer 1013 for NMOS and an n⁺ layer 2013 for PMOS are formed on the p type substrate.

2. N wells 2016 and 2021 are formed on the epitaxial film which forms the PMOS portion.

3. PMOS source and drain 2017 are formed by ion injection.

As mentioned above, it is possible to apply the MOSFET according to the present invention to a CMOS circuit.

(Fifth Embodiment)

Figure 39:
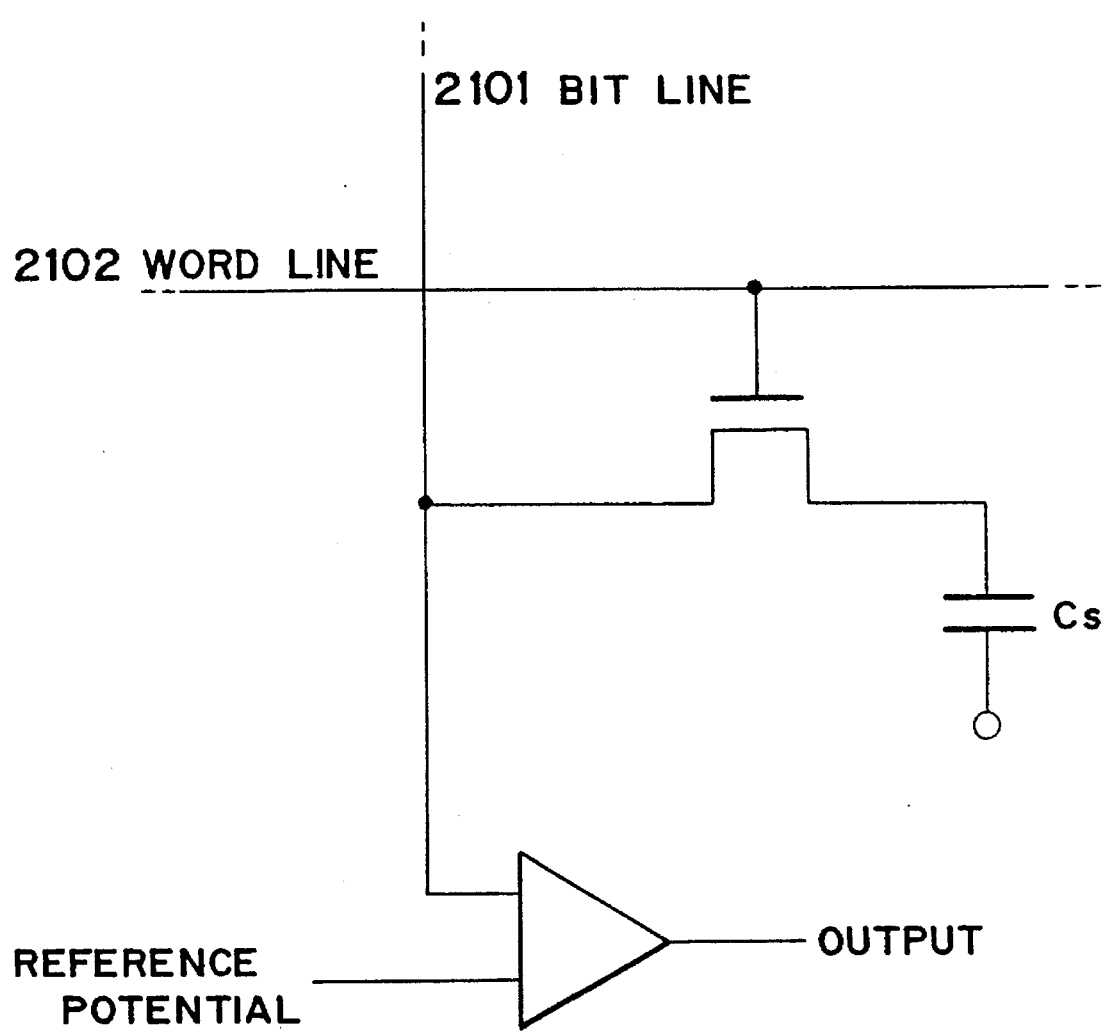
FIG. 39 is a circuit diagram of a semiconductor memory according to a fifth embodiment of the present invention.

A fifth embodiment of the present invention will be described below with reference to FIGS. 39 and 40. In this embodiment, the MOSFET according to the present invention is applied to a DRAM. FIG. 39 illustrates an equivalent circuit of 1 bit in a DRAM. The MOSFET shown in FIG. 39 is made of the transistor according to the present invention.

Figure 40:
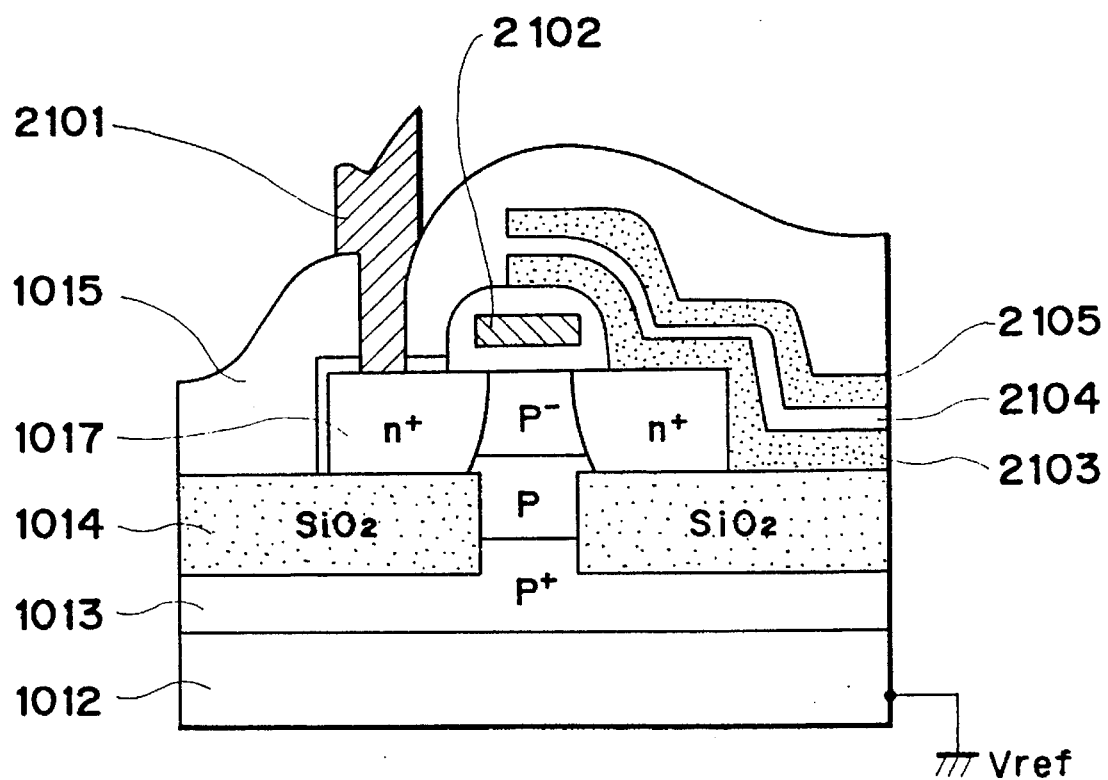
FIG. 40 is a schematic cross-sectional view of the fifth embodiment of the present invention.

FIG. 40 is a sectional view of the MOSFET portion of the equivalent circuit shown in FIG. 39. The same reference numerals are used to denote parts which are the same as those of the third embodiment, description thereof being omitted.

In the above equivalent circuit, a word line is connected to the gate electrode of the MOSFET according to the present invention, one of the source and drain regions is connected to a bit line while the other forms a capacitor element.

The operation of the DRAM of this embodiment is the same as that of general DRAMS, description thereof being omitted. Reference numeral 2103 denotes one of the electrode of the capacitor element; 2104, a dielectric; and 2105, the other electrode. In this embodiment, since the MOS transistor has a three-dimensional structure, the surface area of the capacitor element is large relative to a project area thereof, and the degree of integration is thus increased.

The manufacturing method of this embodiment is substantially the same as that of the first embodiment, as in the case of the fourth embodiment. The difference between the first and fifth embodiments lies in the following points:

1. After the source and drain regions of the NMOS have been formed, the first electrode of the capacitor element is formed by polysilicon 2103 by LPCVD.

2. The dielectric of the capacitor element is formed by $Ta_2O_5$ 2104.

3. The upper electrode of the capacitor element is formed by polysilicon 2105.

4. After the interlayer insulator 1015 has been formed, the bit line 2101 is formed.

The DRAM of this embodiment assures a high degree of integration and has a high speed activation.

(Sixth Embodiment)

In this embodiment, the MOSFET according to the present invention is applied to a random-access read-only memory which is programmable by the user.

Figure 41:
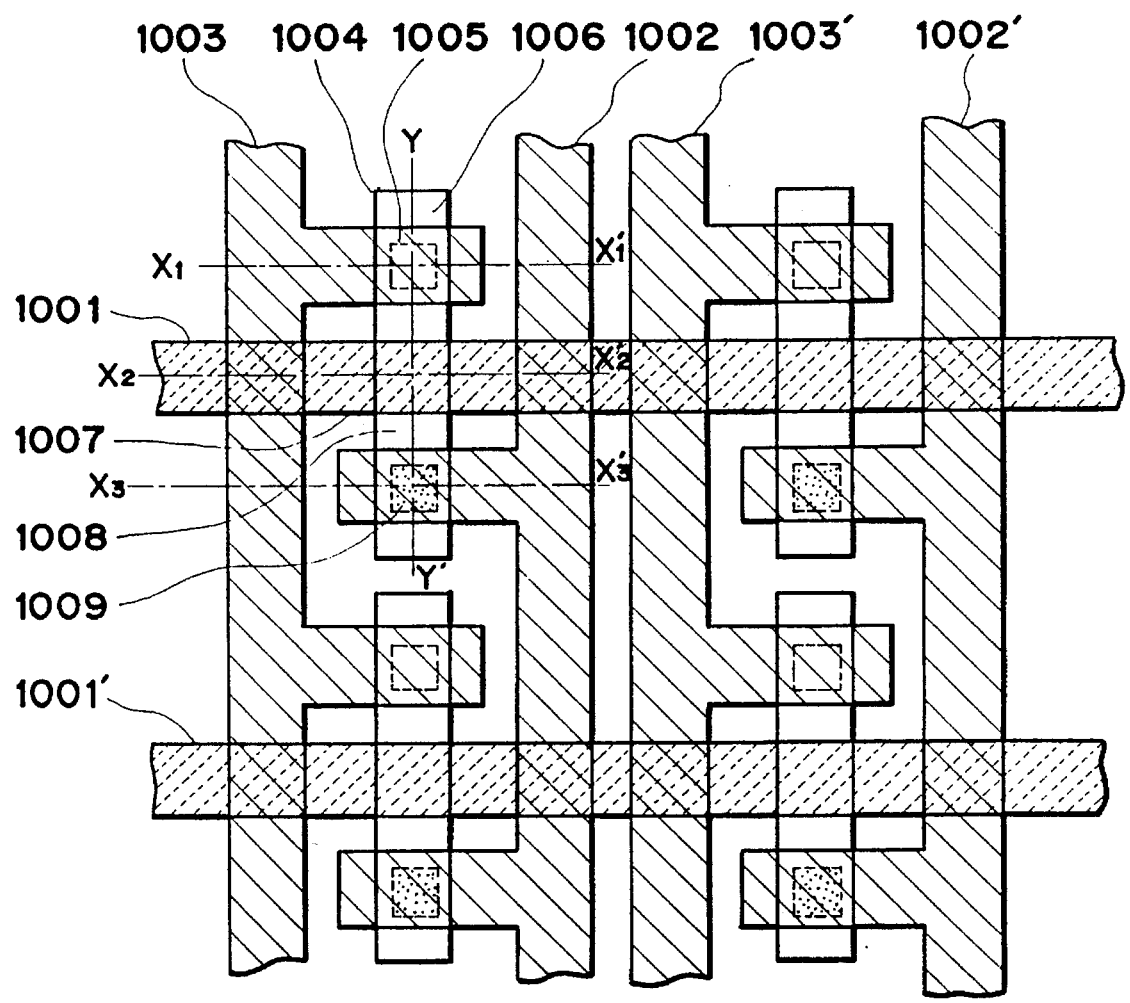
FIG. 41 is a top view of a semiconductor memory according to a sixth embodiment of the present invention.

FIG. 41 shows a pattern of a memory cells of the-sixth embodiment of the present invention. Reference numerals 1001 through 1001' denote word lines, 1002–1002', bit lines; 1003–1003', power source lines; 1004, a silicon single crystal portion which operates as a switching transistor in a memory cell; 1005, a contact region between the power source line and the drain layer; 1006, a drain layer for the MOSFET; 1007, a gate portion for the MOSFET; 1008, a source layer for the MOSFET; 1009, a pn junction between the source layer and the bit line.

Figure 42A:
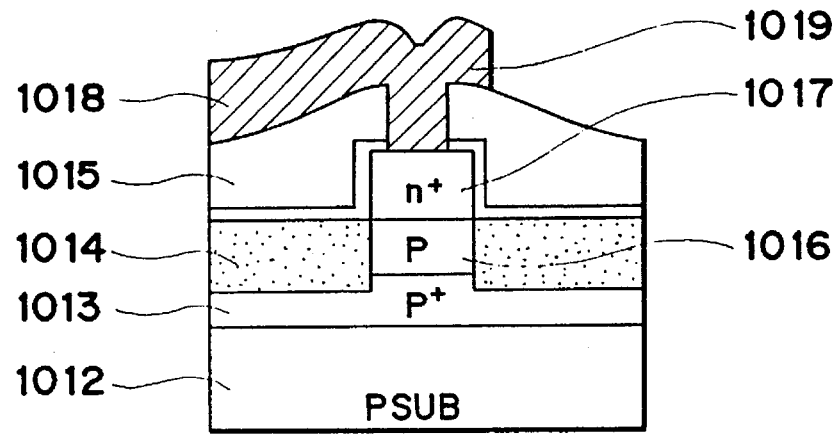
FIGS. 42A to 42C are cross-sectional views of the sixth embodiment of the present invention.
Figure 42B:
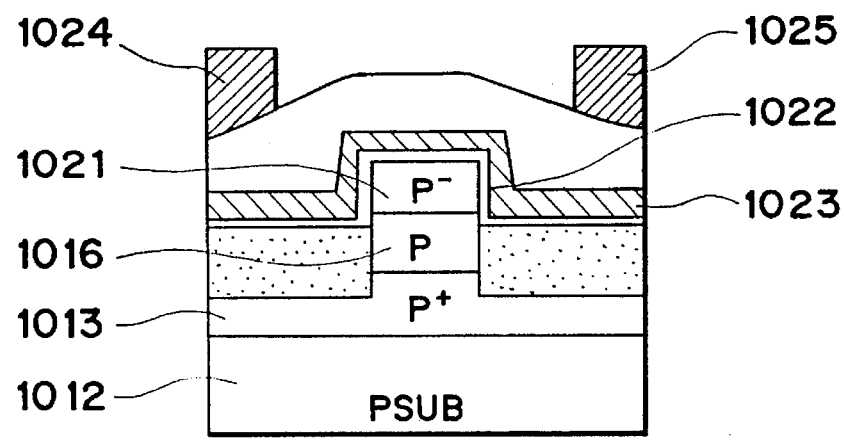
Figure 42C:
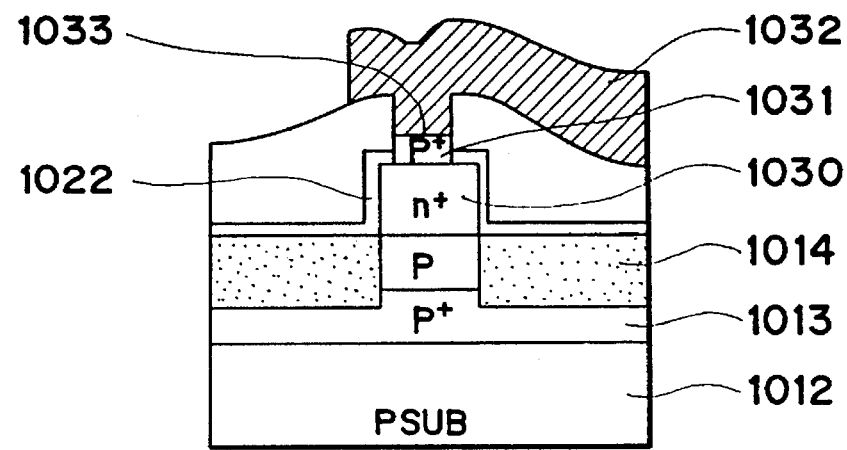
Figure 43:
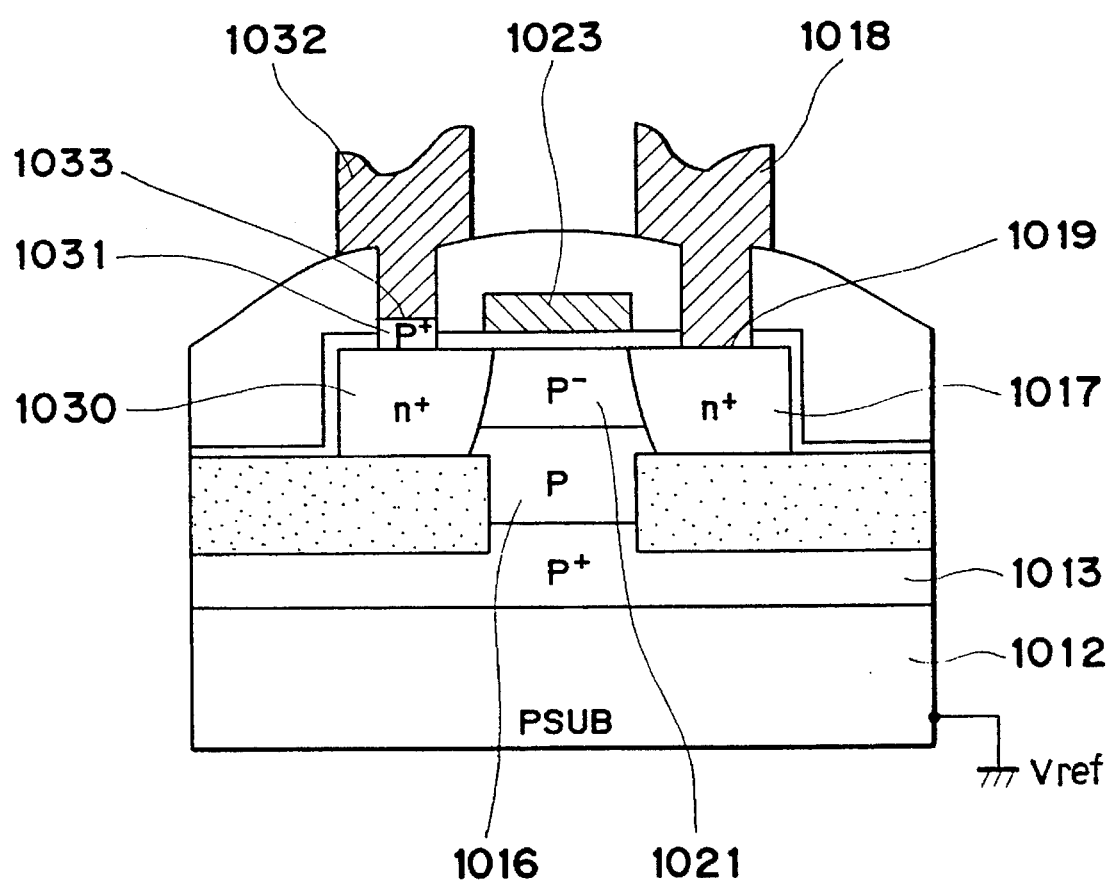
FIG. 43 is a cross-sectional view of the sixth embodiment of the present invention.

FIG. 42A, 42B and 42C are respectively sections taken along lines $X_1$–$X_1$', $X_2$–$X_2$' and $X_3$–$X_3$' of FIG. 41. FIG. 43 is a section taken along line Y–Y' of FIG. 41. In FIGS. 41 through 43, the same reference numerals are used to denote parts which are the same as those of the aforementioned embodiments.

FIGS. 42A to 42C are sectional views of the source region of the transistor in the memory cell. In FIGS. 42A to 42C, reference numeral 1030 denotes an n+ region which acts as a source region; and 1031, a p⁺ region provided on the source layer. A pn junction, consisting of the n⁺ region 1030 and the p⁺ region, defines conduction and non-conduction of the memory. A bit line interconnection 1032 is connected to the p⁺ layer 1031 through a contact region 1033.

The activation method and storing method of the memory device according to the sixth embodiment of the present invention will be described below.

Figure 44:
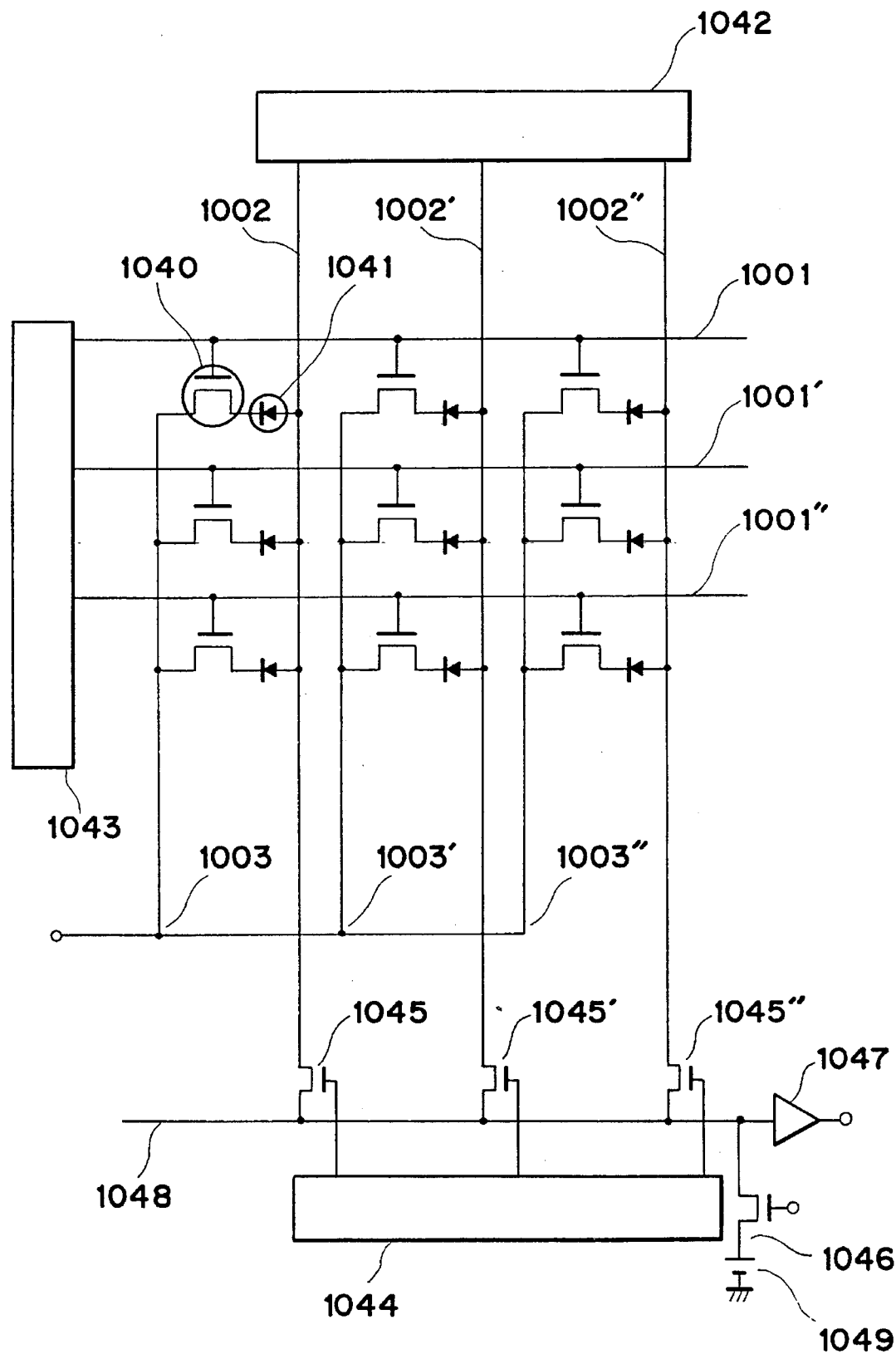
FIG. 44 is a circuit diagram of an example of a semiconductor memory according to the present invention.

FIG. 44 illustrates an equivalent circuit of the memory cell shown in FIG. 41. In FIG. 44, reference numeral 1001 through 1001" denote word lines; 1002 through 1002", bit lines; and 1003 through 1003", power lines Each of the memory cells includes a finely processed transistor 1040 having a high current driving ability, and a pn junction 1041 provided on the source layer of the transistor.

The activation method of the above-described memory device is the same as that shown in FIG. 13 with the exception that in this embodiment, a bit is stored by breakage of the pn junction, unlike the structure shown in FIG. 13 in which storage is conducted by breakage of the insulating layer.

The manufacturing method of the sixth embodiment is substantially the same as that of the first embodiment. The difference lies in the formation of the pn junction in the memory cell.

1) After an opening has been formed in the source region 1030 of the NMOSFET, a p type silicon is grown under the same conditions as those employed for SEG in the first embodiment. The concentration of the p$^+$ layer is $10^{19}$ cm$^{-3}$, and the thickness thereof is 20 nm.

2) Other contacts are opened for the interconnections.

It is possible to provide a high-integration and high-performance memory using the MOSFET according to the present invention.

(Seventh Embodiment)

In the seventh embodiment, the MOSFET according to the present invention is applied to the same type of memory obtained in the sixth embodiment.

Figure 45:
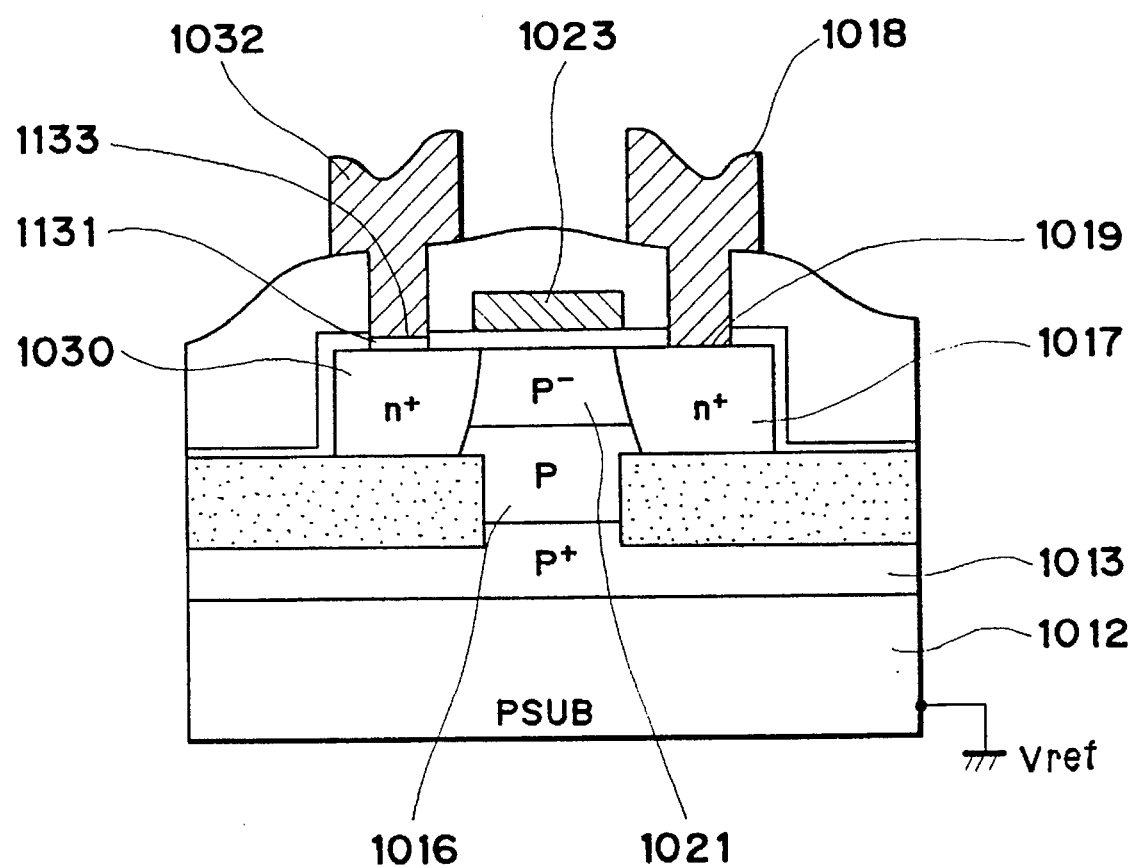
FIG. 45 is a schematic cross-sectional view of a semiconductor memory according to a seventh embodiment of the present invention.

As shown in FIG. 45, the seventh embodiment differs from the sixth embodiment in that conduction and non-conduction of a memory cell are determined by a dielectric 1131, like the case of the first embodiment and unlike the case of the sixth embodiment in which a pn junction is used to define conduction and non-conduction of the memory cell.

In the seventh embodiment, penetration of an interconnection metal through the pn junction by a writing pulse forms a conducted state. In this embodiment, a similar writing pulse is used to provide breakage of the insulating film and hence a conducted state.

The manufacturing method of the seventh embodiment is substantially the same as that of the sixth embodiment. The difference lies in the formation of the dielectric film in the memory cell. That is:

1) After an opening has been formed in the source region of the NMOSFET, the exposed portion is covered by a silicon oxide film 1131. Either CVD or thermal oxidation is employed to form the silicon oxide film 1131. In this embodiment, the thermal oxidation process was used to form a 12 nm thick silicon oxide film. A dielectric film made of a material other than silicon oxide is used according to the power source voltage. A multi-layer dielectric film can also be used.

2) Other contacts are formed for interconnections.

It is possible to provide a high-integration and high-performance memory device by using the aforementioned MOSFET according to the present embodiment.

In the aforementioned embodiments of the present invention, since the magnitude of an electric field in a direction perpendicular to the carrier mobilizing direction is reduced by the opposing two gate electrodes, a semiconductor device exhibiting a high mobility and excellent gm characteristics can be obtained. Generation of hot carriers can be prevented due to electric field limitation, and the life and hence reliability of the device can be enhanced.

Furthermore, since the capacitance of the Si portion provided below the gate oxide film is reduced, S factor (subthreshold swing) characteristics are improved, and leaking current is greatly reduced.

Furthermore, a region of a different conductivity type from that of the source and drain portion and having a higher impurity concentration than a channel region is provided on the portion of the channel region other than the portion on which the opposing two gate electrodes are provided. Also, that high concentration layer is disposed on the substrate. Consequently, the speed at which the minority carrier enters or exits from the semiconductor layer surrounded by the opposing two gate electrodes when the transistor is turned on or off is increased, and the switching characteristics are thus improved.

Furthermore, since the source and drain regions of the MOSFET are disposed on the insulating film, the parasitic effect, such as latch up, can be prevented.

Also, it is possible to form a CMOS inverter, a DRAM and a PROM by using the aforementioned MOSFET.

Furthermore, a conducted state and a non-conducted state are determined by breakdown and non-breakdown of the pn junction which acts as a memory element, and written signals can be read out at a high S/N ratio. Thus, a highly reliable memory having a low error rate can be obtained. Furthermore, the use of a new transistor exhibiting a high driving ability in a memory cell provides a high-speed and high integration memory.

In a preferred form of the manufacturing method according to the present invention, the manufactured transistor is of the type in which the MOSFET elements are located on a substrate in the lateral direction thereof, as will be described later, and are in contact with the doped region on the side of the substrate, and in which the opposing portions of the gate electrode have a surface which crosses the surface of the substrate. In one of the manufacturing methods, an amorphous silicon is formed on the side wall of the opening on the substrate and on the side wall of a stopper layer which defines a semiconductor layer.

Alternatively, ion oblique injection is conducted on the polysilicon formed on the side wall of the opening and that of the stopper layer to make the polysilicon amorphous, and then the amorphous polysilicon is epitaxially grown.

That is, in a preferred form, individual MOSFETs are disposed on an insulating film and a SOI type structure is formed in a self-alignment fashion. Preferred eighth embodiments through eleventh embodiments will be described below in detail.

(Eighth Embodiment)

Figure 46A:
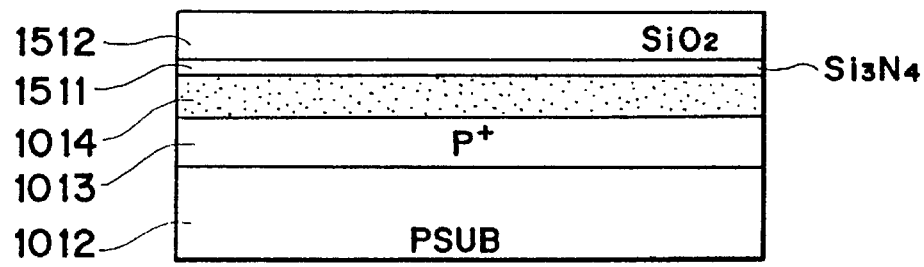
FIGS. 46A to 46D are schematic cross-sectional views illustrating a method of manufacturing a semiconductor device according to an eighth embodiment of the present invention.
Figure 46B:
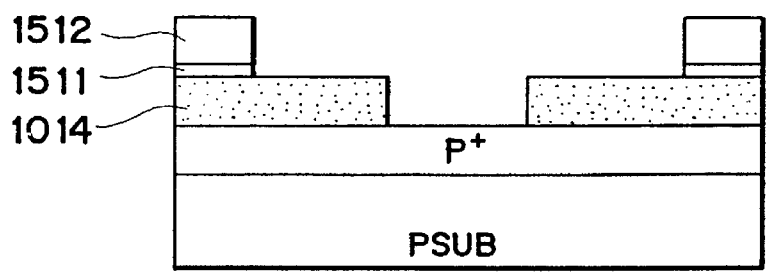
Figure 47:
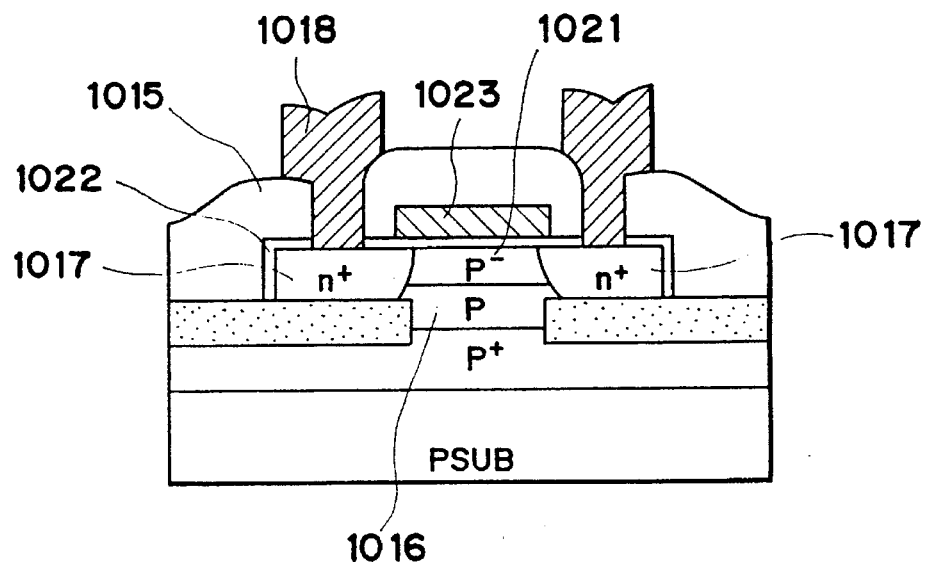
FIG. 47 is a schematic cross-sectional view of a semiconductor device according to the eighth embodiment of the present invention.
Figure 48:
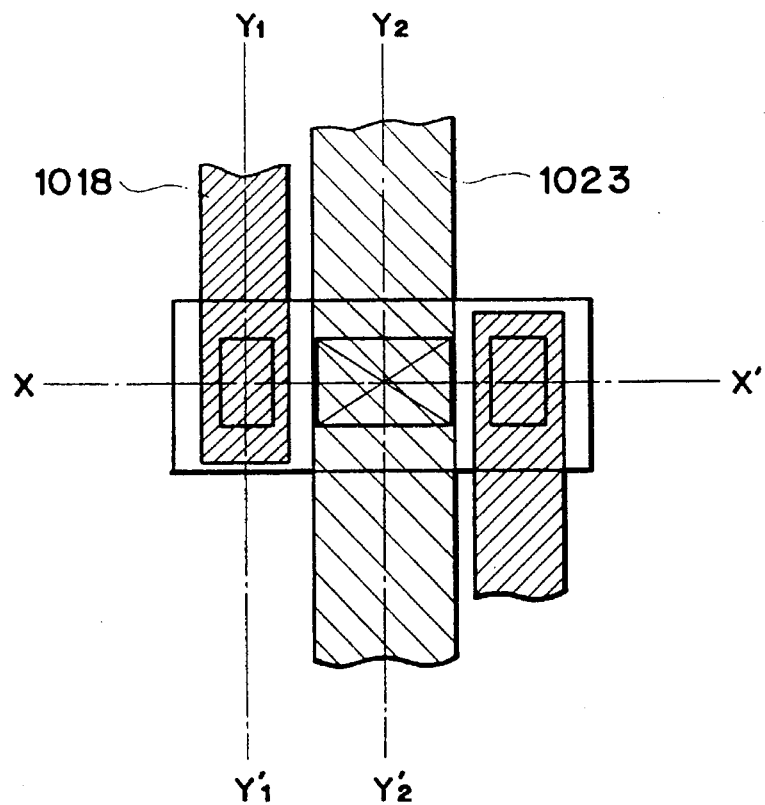
FIG. 48 is a schematic top view of the eighth embodiment of the present invention.

An eighth embodiment of the present invention will be described below with reference to FIGS. 46A through 50. The eighth embodiment is an embodiment of the manufacturing method according to the present invention. FIG. 48 is a plan view of the MOSFET manufactured according to the method illustrated in FIGS. 46A to 46D. FIG. 47 is a section taken along line X–X' of FIG. 48.

Figure 49:
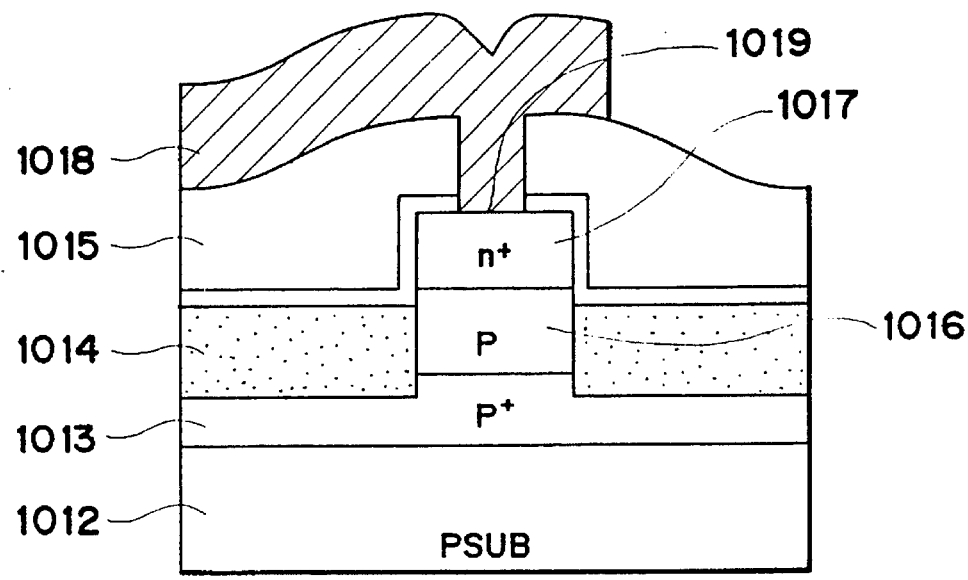
FIG. 49 is a schematic cross-sectional view of the eighth embodiment of the present invention.
Figure 50:
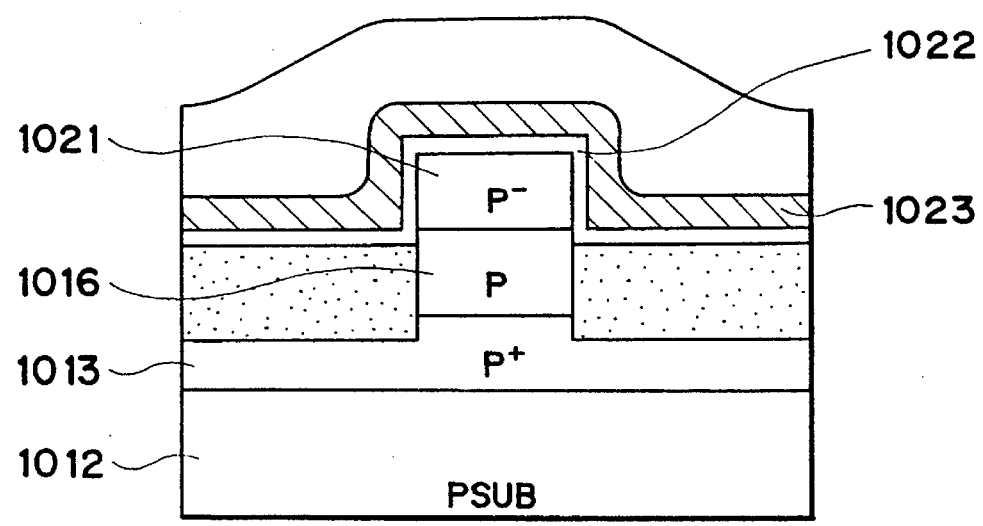
FIG. 50 is a schematic cross-sectional view of the eighth embodiment of the present invention.

FIG. 47 is the best representation of the manufacturing method according to the present invention, and the following description is based on FIG. 47. FIG. 49 is a section taken along line $Y_1$–$Y_1'$. FIG. 50 is a section taken along line $Y_2$–$Y_2'$.

In FIGS. 46A through 50, reference character 1012 denotes a p type silicon substrate having a specific resistivity of several Ω·cm. The plane orientation of the silicon substrate is <100>. In this and subsequent embodiments, the manufacturing method for a NMOSFET will be described. However, a p MOSFET can also be manufactured by changing the conductivity type. Also, a CMOS structure can be formed by patterning.

Reference numeral 1013 denotes a high concentration p$^+$ layer having a concentration of $10^{18}$ through $5\times10^{19}$ cm$^{-3}$; and 1014, a first insulating layer which is made of SiO$_2$ or other materials.

Reference numeral 1511 denotes a layer which acts as a stopper layer when a second insulating film is selectively removed. The stopper layer 1511 is a Si$_3$N$_4$ film. If a sufficient selective ratio can be obtained, other films, such as a polysilicon film, can also be used as the stopper layer 1511. A second insulating layer 1512 is a SiO$_2$ film. Other films can also be employed as the second insulating layer 1512, if they can absorb deformation which would occur during the heat treatment conducted in the subsequent selective epitaxial growth (SEG) process. That is, films which are deformed by contact reflow in such a manner that they are not upright relative to the substrate, cannot be used. In this embodiment, a SiO$_2$ film deposited by CVD and subjected to heat treatment is used.

Reference numeral 1513 denotes an amorphous silicon which is provided to improve crystallization in SEG. Amorphous silicon is employed because it ensures better recrystallization in solid phase epitaxial growth than polysilicon. Reference characters 1016 and 1021 denote single crystal silicon regions formed by SEG; 1022, a gate oxide film for a NMOSFET which may be a $SiO_2$ single layer or a multi-layer consisting of $SiO_2$ and $Si_3N_4$; 1023, a gate electrode of a structure having a low resistance and a work function which ensures a desired threshold of the transistor, such as polycide consisting of a $p^+$ polysilicon substrate and an upper layer of $W_xSi_{1-x}$.

Reference numeral 1017 denotes a $n^+$ region of the source and drain layers of the NMOSFET; 1021, a channel region of the NMQSFET having a concentration of $5\times10^{14}$ to $5\times10^{16}$ $cm^{-3}$; 1016, a doped region provided between the channel and the silicon substrate and having $5\times10^{16}$ to $10^{18}$ $cm^{-3}$; 1015, an interlayer insulating film; and 1018, an interconnection.

The manufacturing method of the eighth embodiment will be described below. First, a p type buried layer was formed on the p type substrate by $B^+$ ion injection. A 600 nm thick $SiO_2$ film was formed as the first insulating film by thermal oxidation at 900° C. An $SiO_3N_4$ film was deposited to a thickness of 50 nm by LPCVD. Thereafter, an $SiO_2$ film was deposited on the $SiO_3N_4$ film to a thickness of 1 μm as the second insulating layer by CVD, and was then subjected to heat treatment at 850° C. for densification (FIG. 46A). The portion of the second insulating layer and $Si_3N_4$ film where the MOSFET is formed was patterned and removed by dry etching. Subsequently, the seed of SEG, i.e., the channel portion of the MOSFET, was removed by dry etching (FIG. 46B).

Amorphous silicon was deposited to a thickness of 25 nm by plasma CVD. This was performed under the conditions of 250° C. and 0.5 Torr and using $SiH_4$ and $H_2$ at 10 W.

Figure 46C:
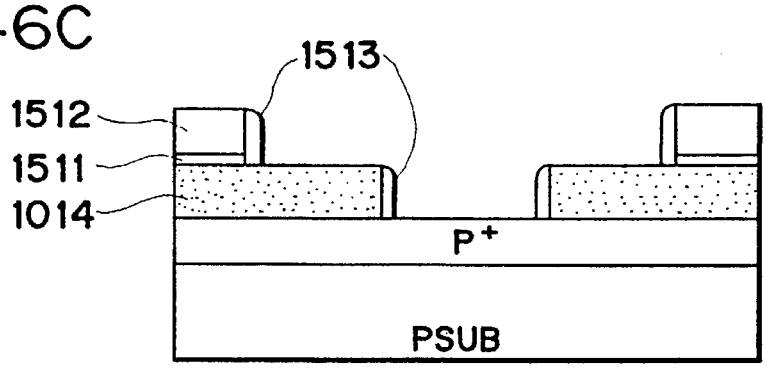

Thereafter, the amorphous silicon deposited on the portion other than the side wall of the first and second insulating films was removed by etchback (FIG. 46C).

After the wafer was chemically washed, a single crystal silicon of the MOSFET was grown by SEG. This SEG was performed under the conditions of 850° C., 50 Torr and using $H_2$, HCl, $SiH_2Cl_2+H_2$ and $B_2H_6+H_2$. The single crystal silicon was grown to the same level as that of the second insulating layer by adjusting the gas flow rate. The thickness of the epitaxial film was 1.6 μm, and the length thereof in the lateral direction was 1.1 μm. The lower 1 μm thick p type layer and the upper 0.6 μm thick $p^-$ layer were formed in sequence by controlling the flow rate of $B_2H_6+H_2$ gas.

Figure 46D:
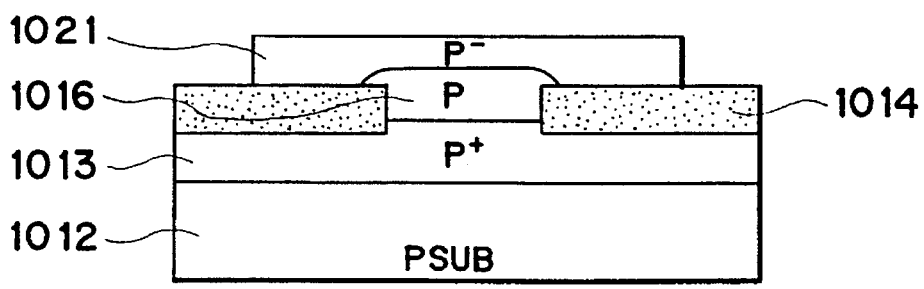

Thereafter, a resist was coated and etchback was conducted to make flat the upper surface of the single crystal silicon layer formed by SEG. Next, the $SiO_2$ film which was the second insulating film was selectively removed by wet etching, and then the $Si_3N_4$ film was removed by dry etching, by which a single crystal silicon island was formed in a self-alignment fashion, as shown in FIG. 46D.

Thereafter, the gate oxide film was formed, and then the gate electrode, consisting of $p^+$ polysilicon—$W_{1-x}Si_x$—W, was formed by depositing polysilicon and tungsten in sequence and then by injecting boron ions from the tungsten surface and conducting the heat treatment.

After the gate electrode was patterned, the $n^+$ layer was formed using the gate as a mask to form the source and drain layer. Next, the interlayer insulating film was formed by TEOS and etchback. A contact was opened, Ti, TiN, and Al—Si films were formed, and an interconnection was formed. Finally, a passivation film was formed, by which manufacture of the transistor structure was completed (FIG. 47).

(Ninth Embodiment)

A ninth embodiment of the present invention will be described below with reference to FIGS. 51A to 51D.

The same reference numerals are used to denote parts which are the same as those of the eighth embodiment, and description thereof is omitted.

The ninth embodiment differs from the eighth embodiment in that polysilicon is formed on the first and second insulating films in place of amorphous silicon employed in the eighth embodiment. Compared with amorphous silicon, polysilicon does not assure excellent solid phase epitaxial growth in SEG and hence good-quality single crystal. To overcome this drawback and obtain a single crystal silicon layer as good as that obtained in the eighth embodiment, in this embodiment, polysilicon deposited on the side walls of the first and second insulating films is made amorphous by oblique ion injection (FIG. 51C).

Which material, polysilicon or amorphous silicon, is employed is determined by, for example, in-plane distribution of the film thickness.

The manufacturing method of the ninth embodiment will be described below.

Figure 51A:
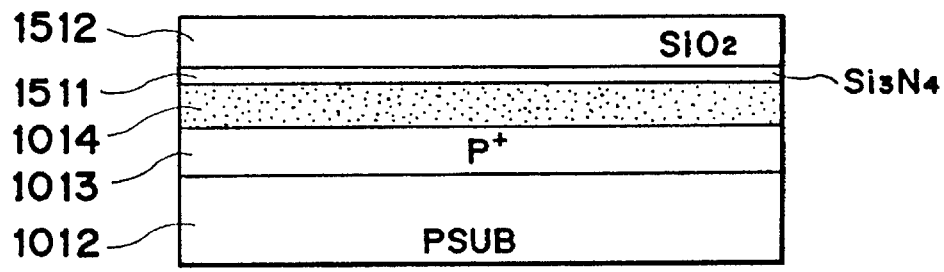
FIGS. 51A to 51D are schematic views illustrating a method of manufacturing a semiconductor device according to a ninth embodiment of the present invention.
Figure 51B:
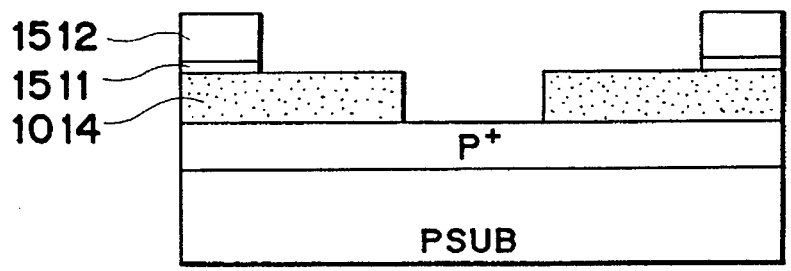
Figure 51C:
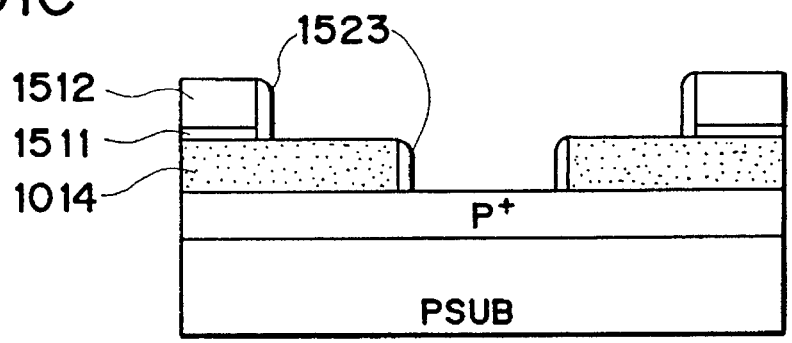
Figure 51D:
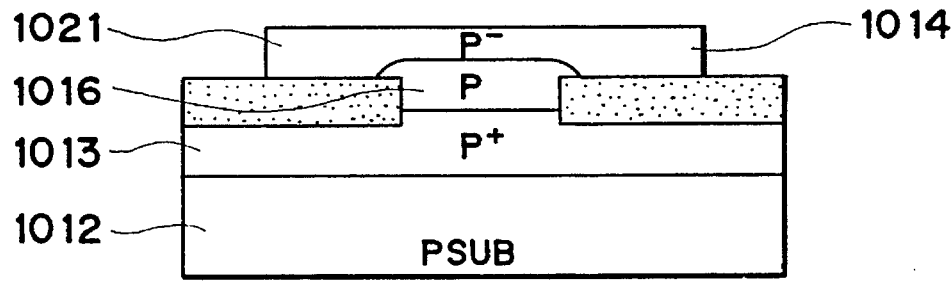

This manufacturing method is the same as that of the eighth embodiment from the beginning to the patterning of the second insulating film which is conducted to determine the region where the individual elements of the MOSFET are disposed and opening of the first insulating film which is conducted to determine the seed of SEG (FIGS. 51A and 51B).

Next, polysilicon was deposited to a thickness of 25 nm by LPCVD. This was conducted under the conditions of 600° C. and 50 Pa using $SiH_4$—He.

Subsequently, polysilicon deposited on the portion other than the side wall of the first and second insulating films was removed by etch back.

$Ar^+$ ions were injected into the wafer by an ion injector at a rate of $10^{16}$ $cm^{-2}$. At that time, the wafer was inclined by 45° so that ions could be injected into the entire side wall. This ion injection made polysilicon on the side wall amorphous (FIG. 51C).

Subsequently, SEG was conducted in the same manner as that of the eighth embodiment to form the same MOSFET as that obtained in the eighth embodiment.

(Tenth Embodiment)

In a tenth embodiment of the present invention, SEG is not employed, unlike the cases of the eighth and ninth embodiments.

The tenth embodiment will be described below with reference to FIGS. 52A to 52D. In FIGS. 52A to 52D, parts which are the same as those of the aforementioned embodiments are designated by the same reference characters, and description thereof is omitted.

In the manufacturing method of this embodiment, amorphous silicon is deposited over the entire surface of the wafer and the deposited amorphous silicon is subjected to heat treatment so as to change amorphous silicon into single crystal silicon by solid phase epitaxial growth.

The solid phase epitaxial growth conducted on the first insulating layer at this time is called the lateral solid phase epitaxial growth (L-SPE). L-SPE is characterized in that the rate thereof differs depending on the plane orientation on the wafer. Therefore, a good quality single crystal silicon is obtained by disposing the plane whose L-SPE growth rate is fast in the longitudinal direction of the MOSFET while disposing the plane whose L-SPE growth rate is slow in the lateral direction.

Figure 52A:
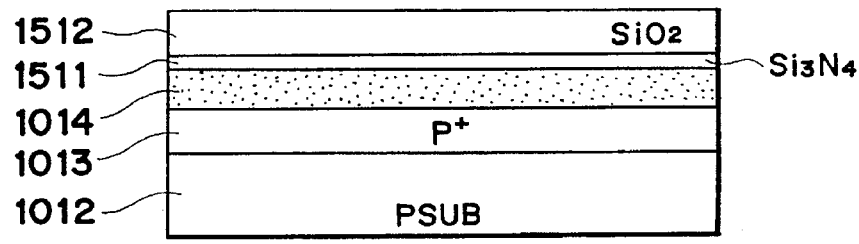
FIGS. 52A to 52D are schematic views illustrating a method of manufacturing a semiconductor device according to a tenth embodiment of the prevent invention.
Figure 52B:
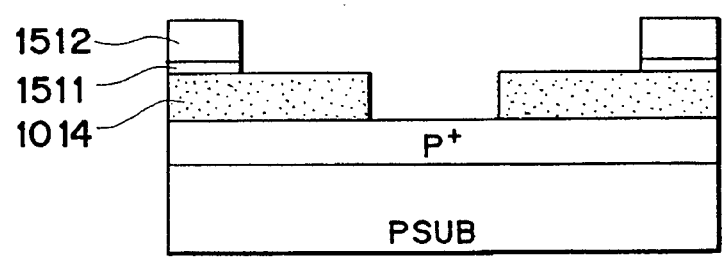
Figure 52C:
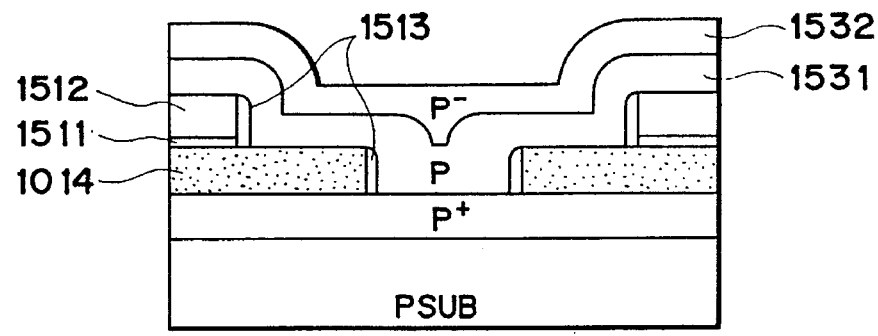
Figure 52D:
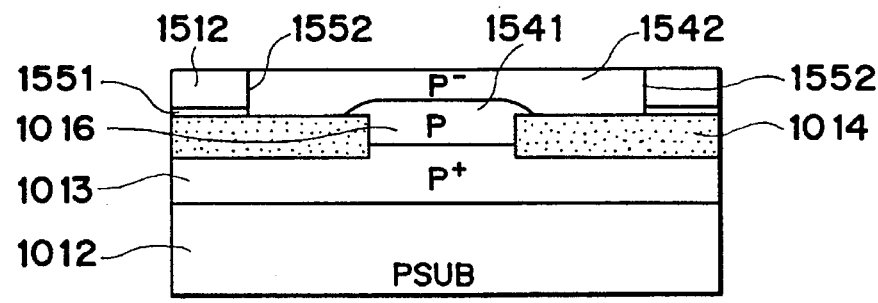
Figure 53:
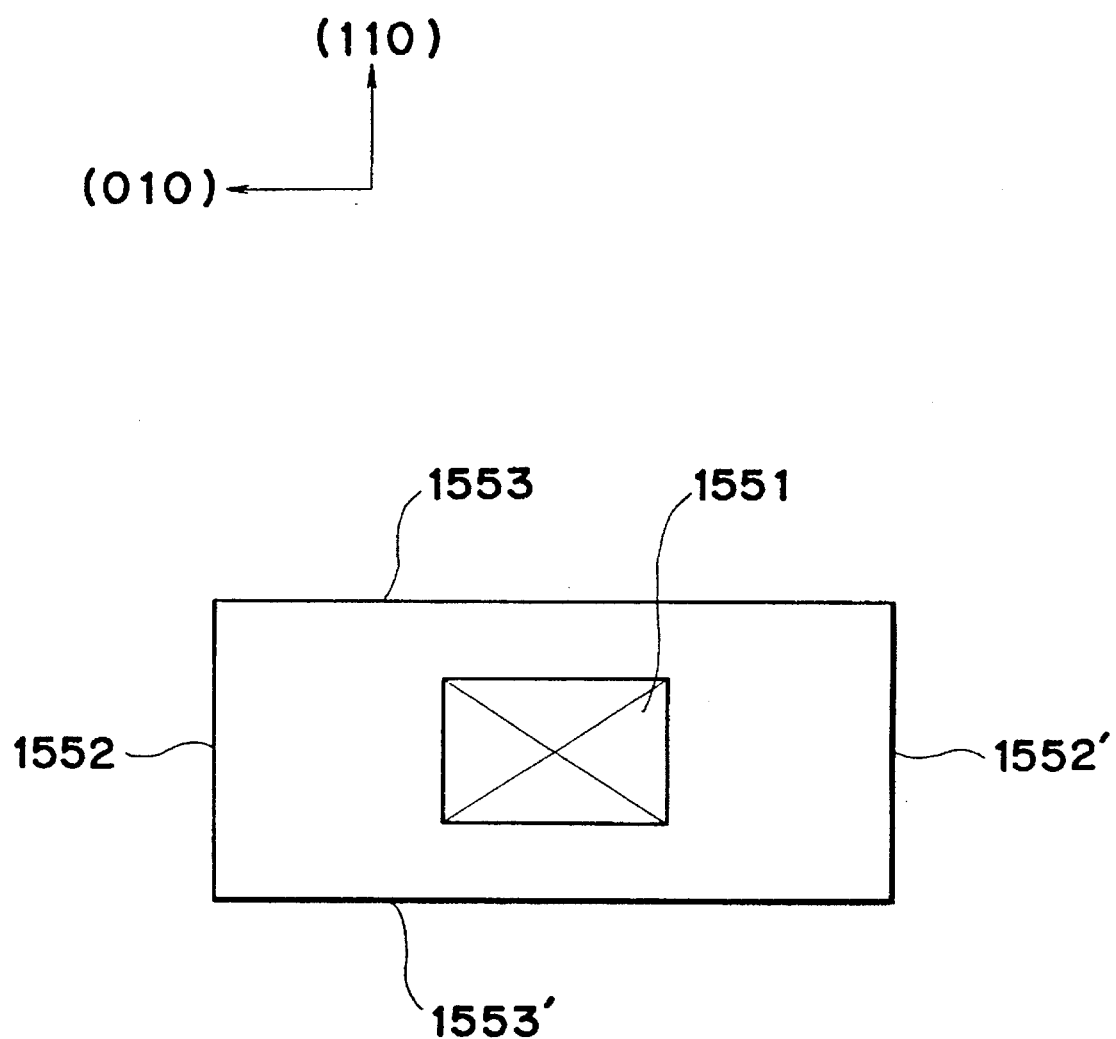
FIG. 53 is a schematic top view of a semiconductor device according to the tenth embodiment of the present invention.

The manufacturing method of the tenth embodiment will be described below (FIGS. 52A to 53).

This manufacturing method is the same as that of the eighth embodiment from the beginning to the patterning of the second insulating film which is conducted to determine the regions where the individual elements of the MOSFET are disposed, the opening of the first insulating film which is conducted to determine a seed portion 1551 of SEG, deposition of amorphous silicon and removal of amorphous silicon from the portion other than the side wall of the first and second insulating films. However, at this time, longitudinal directions 1552 and 1552' and lateral directions 1553 and 1553' of the MOSFET must be examined with the plane orientation of the wafer taken into consideration. That is, the fact that the growth rate of L-SPE is faster in (010) direction than in (110) direction on the wafer of crystal axis <100> must be taken into consideration.

After the wafer was chemically washed, amorphous silicon was deposited at a temperature of 250° C. and under the pressure of 0.5 Torr using $SiH_4$, $H_2$ and $B_2H_6$ gases at a power of 10 W. A desired thickness and a desired concentration were obtained by controlling the flow rate of $SiH_4$ and $B_2H_6$, as in the case of the eighth embodiment (1531, 1532).

Subsequently, the wafer was subjected to heat treatment in a diffusion furnace at 600° C. in an atmosphere of $N_2$ for L-SPE. The heat treatment which lasted 60 minutes formed a 0.2 μm thick single crystal silicon film in the direction of (110) and a 0.7 μm thick single crystal silicon film in the direction of (010). Thereafter, a resist was coated on the wafer, and the amorphous silicon formed on the second insulating film was removed by etchback (1541, 1542).

Subsequently, the second insulating film and $Si_3N_4$ film were removed to form an island of single crystal silicon.

The subsequent processes are the same as those of the eighth embodiment. A MOSFET having the same characteristics as those of the MOSFET obtained in the eighth embodiment was obtained.

In this embodiment, formation of a single crystal silicon on the portion where the second insulating film is removed, i.e., on the region where the elements of the MOSFET are to be disposed, is desired.

When L-SPE does not reach the portion where the second insulating film is removed, crystallization in the individual elements of the MOSFET deteriorates. Also, when L-SPE expands over the portion where the second insulating film is removed and reaches the second insulating film, there is the possibility that twin or other degraded crystal is formed on the side wall of the second insulating film.

(Eleventh Embodiment)

An eleventh embodiment of the present invention will be described below with reference to FIGS. 54A to 54D. In FIGS. 54A to 54D, parts which are the same as those of the aforementioned embodiments are designated by the same reference numerals, and description thereof is omitted.

In this embodiment, after the second insulating film is removed, amorphous silicon is deposited on the first insulating film to improve crystallinity of the single crystal silicon grown on the first insulating film.

The manufacturing method of the eleventh embodiment will be described below.

Figure 54A:
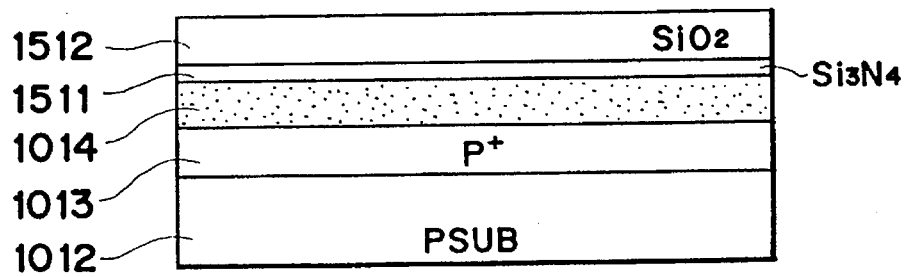
FIGS. 54A to 54D are schematic views illustrating a method of manufacturing a semiconductor device according to an eleventh embodiment of the present invention.
Figure 54B:
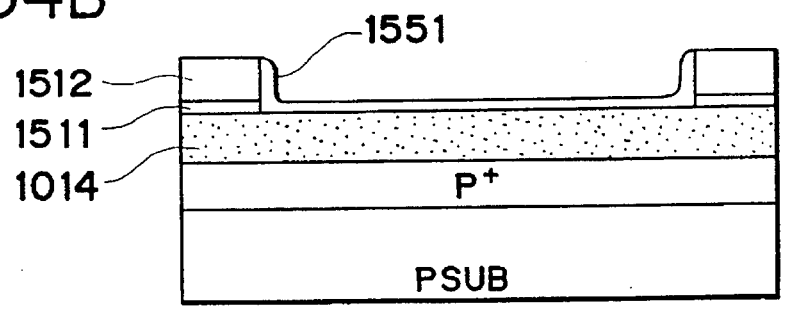
Figure 54C:
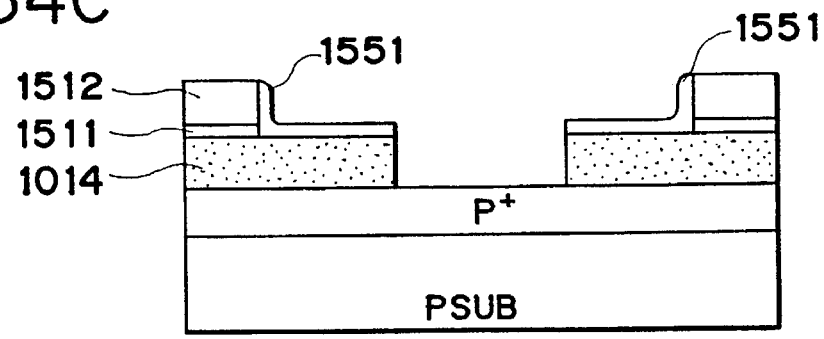
Figure 54D:
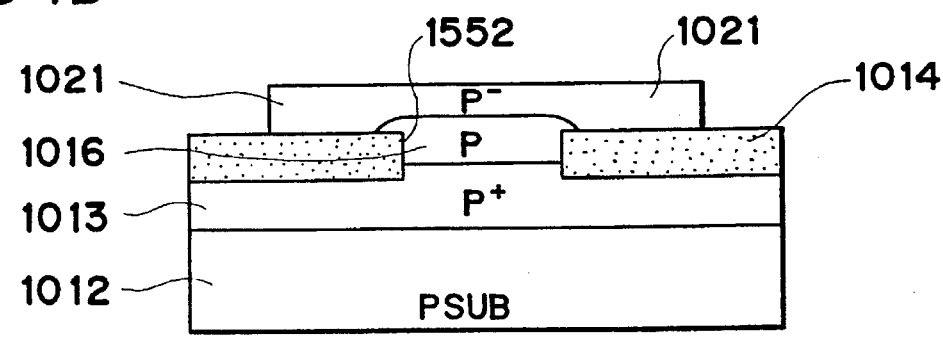

After the region where the individual elements of the MOSFET are to be disposed was determined by patterning the second insulating film in the same manner as that of the eighth embodiment, amorphous silicon was deposited to a thickness of 25 nm by plasma CVD. Deposition of amorphous silicon was conducted under the conditions of 250° C. and 0.5 Torr using $SiH_4$ and $H_2$ gases at a power of 10 W. Subsequently, a resist was coated, and the amorphous silicon deposited on the second insulating film was removed (FIG. 54B). Thereafter, the portion of the amorphous silicon and the portion of the $SiO_2$ film acting as the first insulating film where the seed portion 1551, i.e., the channel of the MOSFET, was to be provided, were removed by dry etching.

Next, SEG was conducted in the same manner as the eighth embodiment to form a single crystal silicon. The subsequent processes were the same as those of the eighth embodiment. A MOSFET which was the same as that obtained in the eighth embodiment was manufactured.

Although the portion of the single crystal silicon located near the side wall 1552 of the first insulating film had slight defects, the portion thereof located near the channel of the MOSFET had no defects. As a whole, the defects of the single crystal silicon were negligible.

(Twelfth Embodiment)

Figure 55:
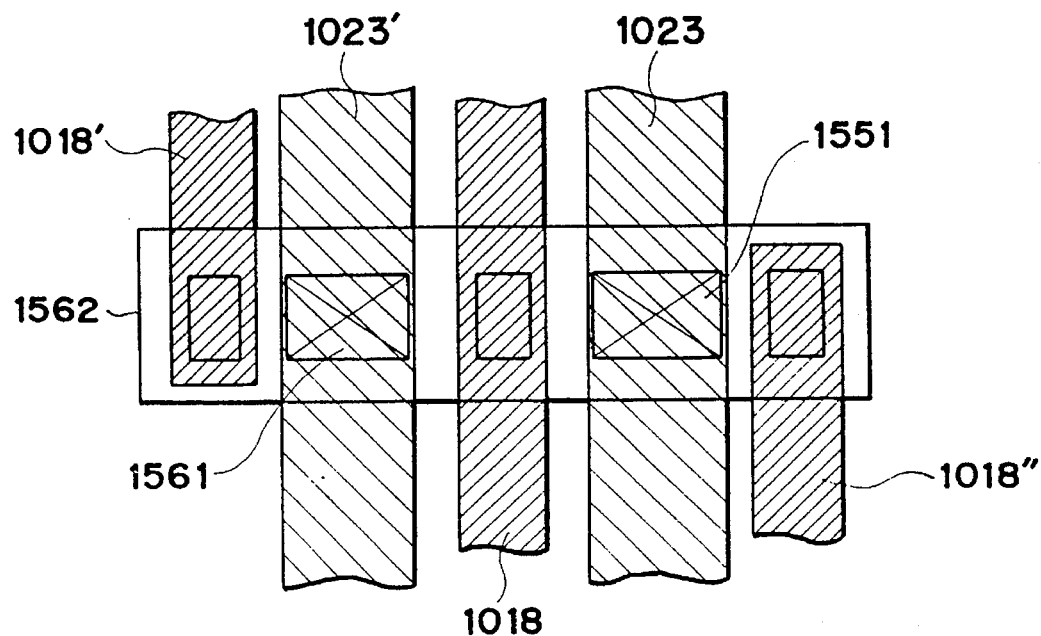
FIG. 55 is a schematic top view of a semiconductor device according to a twelfth embodiment of the present invention.

In the twelfth embodiment, the single crystal silicon region where the individual elements of the MOSFET are disposed is formed by SEG conducted using two or more seeds, as shown in FIG. 55.

This allows a plurality of MOSFETs to have common source and drain. As a result, the degree of integration and the degree of freedom of circuit designing can be increased.

In FIG. 55, reference numerals 1551 and 1561 denote seeds for SEG; 1023 and 1023', gate interconnections; 1018, a drain interconnection; 1018' and 1018", source interconnections; and 1562, a single silicon region.

(Thirteenth Embodiment)

Figure 56:
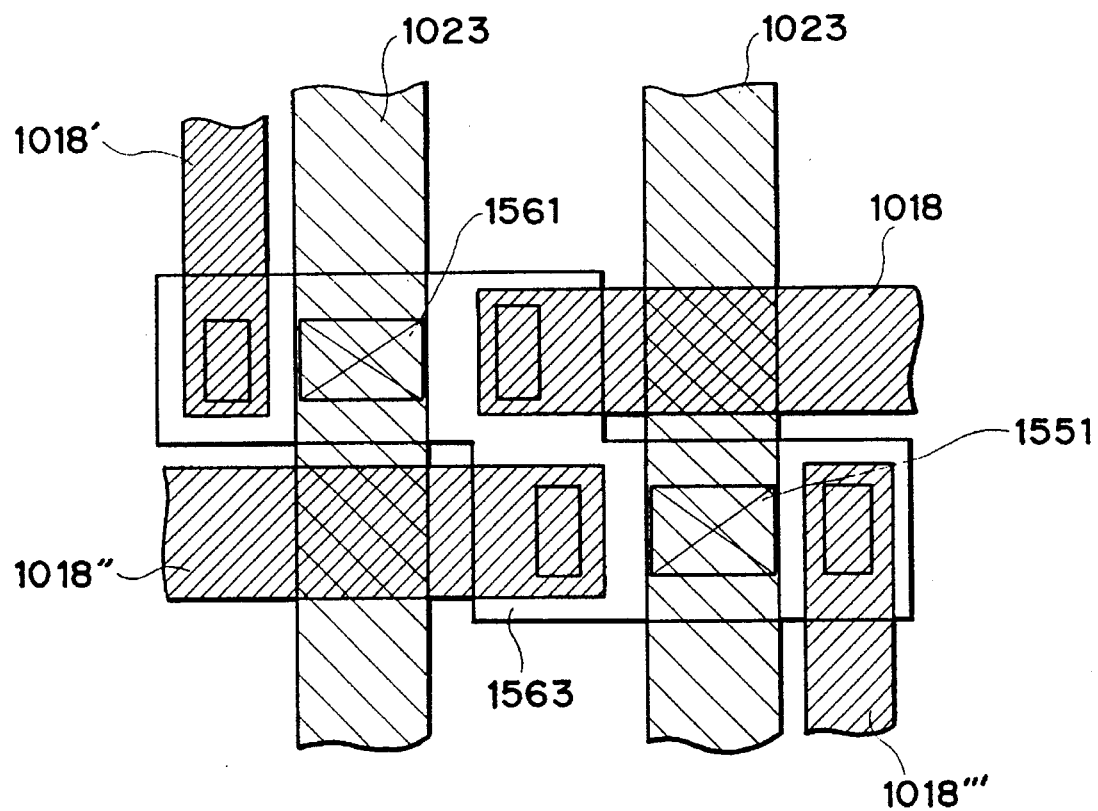
FIG. 56 is a schematic top view of a semiconductor device according to a thirteenth embodiment of the present invention.

A thirteenth embodiment is an application of the twelfth embodiment. As shown in FIG. 56, the silicon region where the individual elements of the MOSFET are disposed consists of two or more squares, and SEGNO seed is provided for a single silicon region 1563. Consequently, the degree of freedom for circuit designing can be further increased, and a high-integration and high-performance device can be provided.

(Fourteenth Embodiment)

Figure 57A:
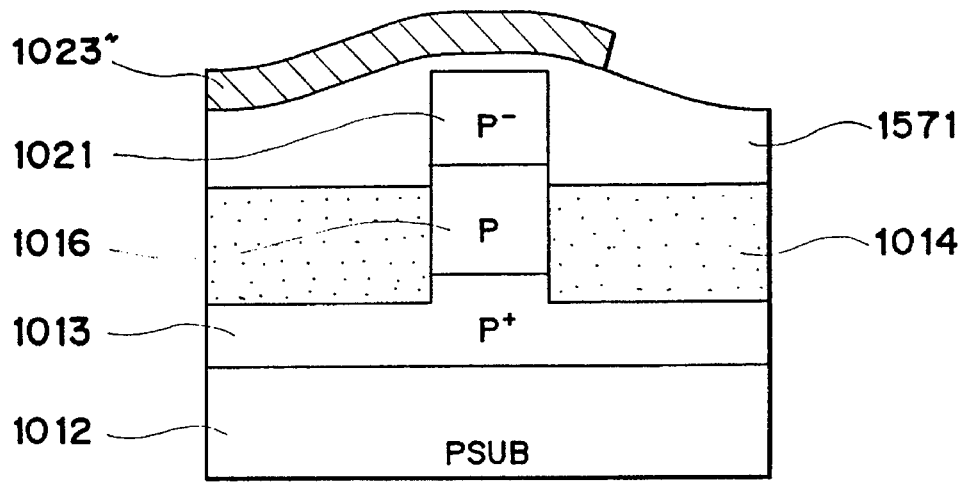
FIGS. 57A and 57B are schematic views of a semiconductor device according to a fourteenth embodiment of the present invention.
Figure 57B:
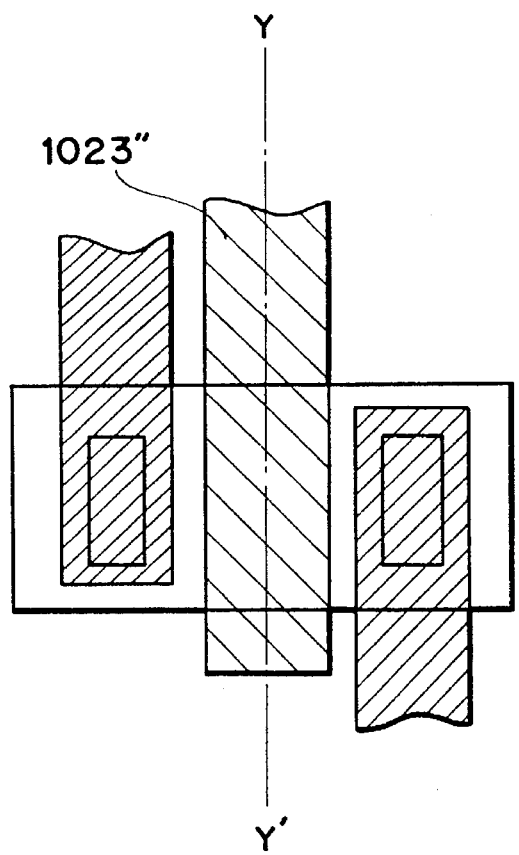

In the aforementioned embodiments, manufacture of an MOSFET in which at least one of the gate electrodes is provided upright relative to a substrate has been described. However, the present invention can also be applied to an MOSFET having the structure other than the aforementioned one, as shown in FIGS. 57A and 57B. That is, the present invention can be applied to all SOI type MOSFETs.

FIG. 57A is a section taken along line Y–Y' of FIG. 57B.

In the eighth through fourteenth embodiments, it is possible to form a SOI type MOSFET in a self-alignment by defining the single crystal semiconductor region formed by SEG or the like by at least two insulating layers made of the same or different types of materials.

Furthermore, since a polysilicon or amorphous semiconductor layer is disposed between the portion of the insulating layer other than that which forms the seed of SEG or other than that which is in contact with the semiconductor substrate and the single crystal semiconductor region formed by SEG or the like, current leaking from the transistor formed in the semiconductor region can be restricted, and a high-performance transistor can thus be provided.

(Fifteenth Embodiment)

Figure 58:
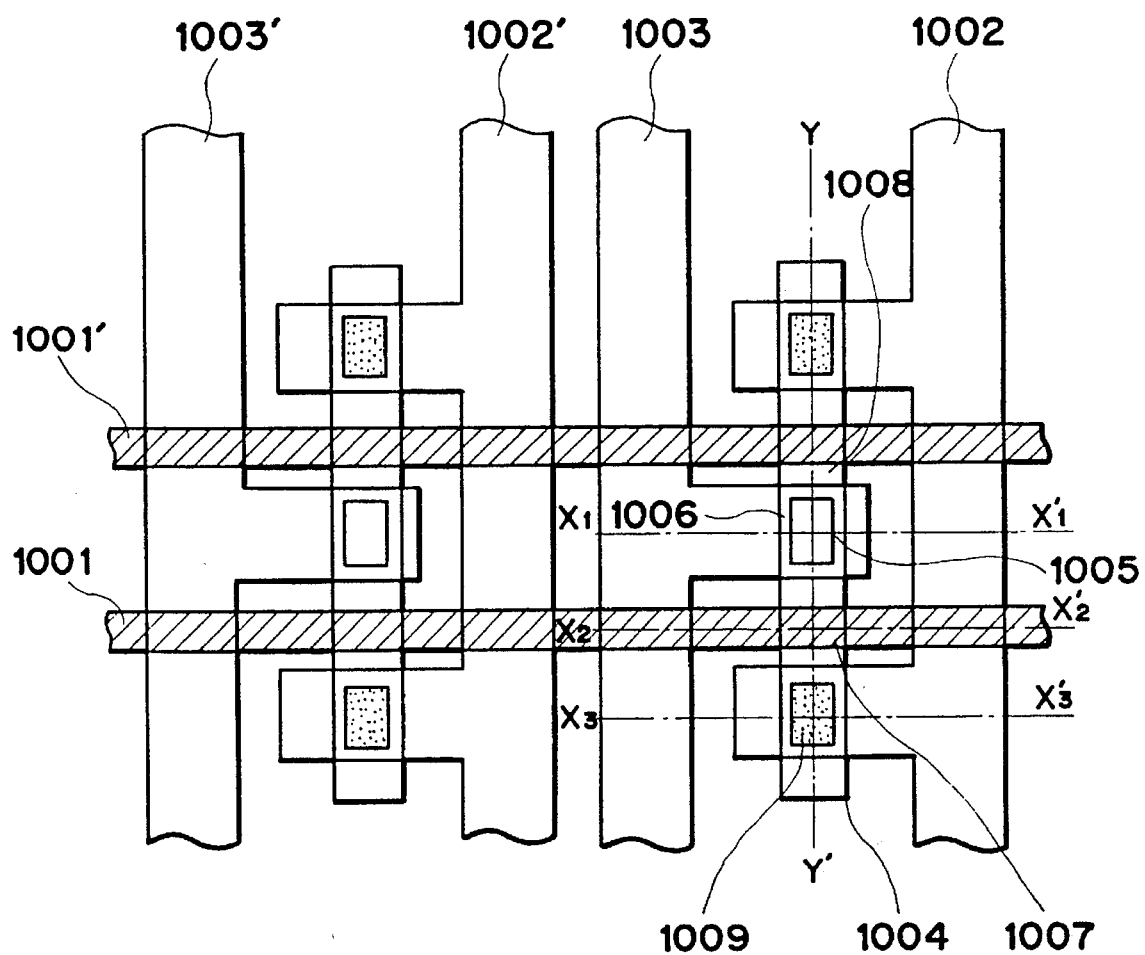
FIG. 58 is a schematic top view of a semiconductor memory according to a fifteenth embodiment of the present invention.
Figure 59:
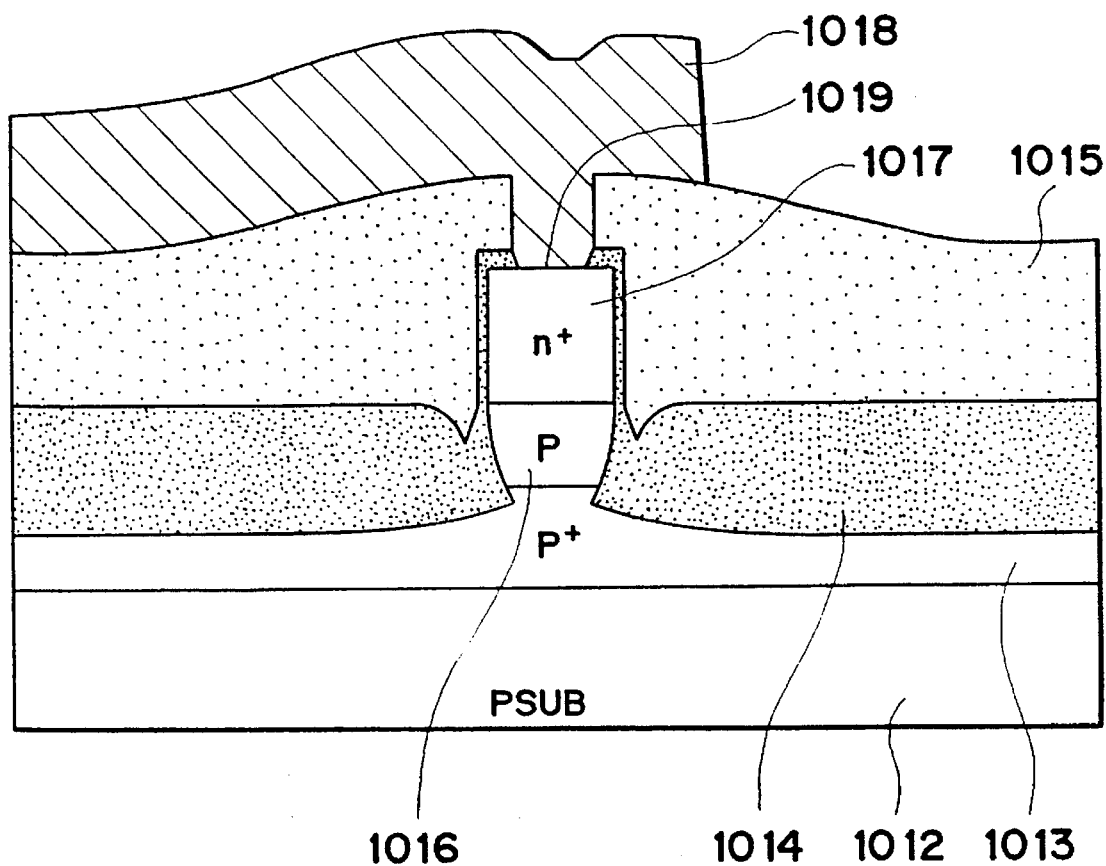
FIG. 59 is a schematic cross-sectional view taken along line $X_1$–$X_1'$ of FIG. 58.

A fifteenth embodiment of the present invention will be described below with reference to FIG. 58. FIG. 58 is a top view of a memory cell of the fifteenth embodiment of the present invention. Reference numerals 1001 and 1001' denote word lines; 1002 and 1002', bit lines; 1003 and 1003', power source lines; 1004, an Si single crystal portion which offers an activated region which operates as a switching transistor in the memory cell; 1005, a contact region between the power source line and the drain layer; 1006, a drain layer of the transistor; 1007, a gate portion of the transistor; 1008, a source layer of the transistor; and 1009, a p type semiconductor layer for offering an electrically breakable pn junction provided between the source layer and the bit line. FIGS. 59, 60, 61 and 62 are respectively sections taken along lines $X_1$–$X_1'$, $X_2$–$X_2'$, $X_3$–$X_3'$ and Y–Y'. In FIG. 59, reference character 1012 denotes a p type Si substrate having a resistivity of, for example, several Ω cm; 1013, a $p^+$ buried layer; 1014, a field oxide film; 1015, an interlayer insulator which may be made of PSG, BPSG, SiN or SiON; 1016, a P type layer provided immediately below the drain; 1017, a drain $n^+$ high concentration layer; and 1018, an interconnection for a drain power source which is connected to the drain layer 1017 through a contact portion 1019. The drain layer 1006 shown in FIG. 58 corresponds to the drain $n^+$ high concentration layer 1017 shown in FIG. 59. The contact portion 1005 shown in FIG. 58 corresponds to the contact portion 1019 shown in FIG. 59. In FIG. 59, illustration of a passivation film is omitted.

Figure 60:
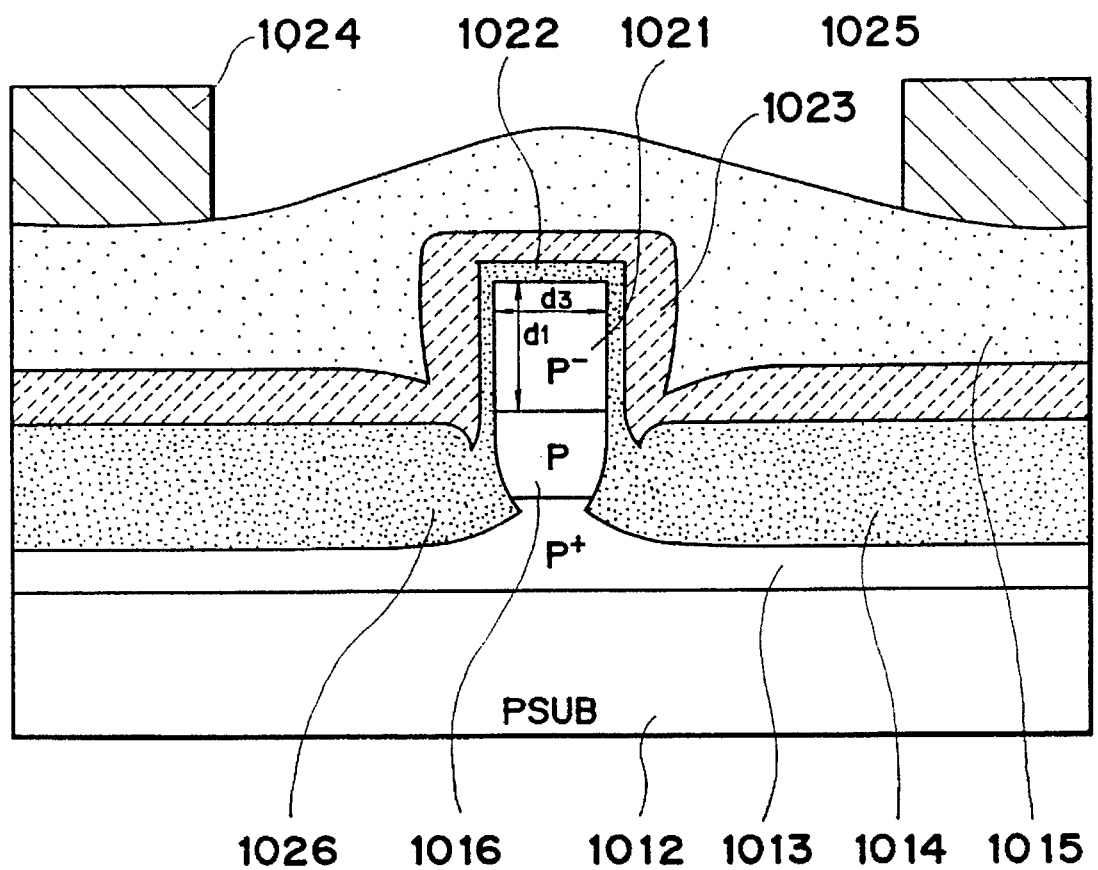
FIG. 60 is a schematic cross-sectional view taken along line $X_2$–$X_2'$ of FIG. 58.

FIG. 60 is a cross-sectional view of the gate portion of the transistor in the memory cell.

In FIG. 60, reference character 1021 denotes a channel region which is made of a semiconductor having an impurity concentration of, for example, $5 \times 10^{14}$ through $5 \times 10^{16}$ cm$^{-3}$; and 1022, a gate insulating film which is about 60 Å through 250 Å thick, although the thickness thereof must be changed according to the length of the gate.

The gate insulating film 1022 may be an Si oxide film, SiON or a laminated layer of $SiO_2$ and SiON. Reference character 1023 denotes a gate electrode having a low resistance structure having a work function which ensures a desired threshold of the transistor, such as a polycide structure in which an upper layer made of $W_xSi_{1-x}$ is formed on a $p^+$ type polysilicon substrate; 1024, an interconnection for the drain power source which corresponds to the interconnection 1003 shown in FIG. 58; and 1025, an interconnection for the bit line which corresponds to the interconnection 1002 shown in FIG. 58. As shown in FIG. 60, the channel region 1021 is defined by the gate insulating film 1022 and the p layer 1016. Therefore, the channel width of this transistor is $2d_1+d_3$. The thickness of the portion of the gate insulating layer located below the channel region 1021 changes in the manner indicated by 1026 in FIG. 60 as a result of the field oxidation process, and is comparatively difficult to control. However, in this transistor, since the actually activated channel region is defined by the p region located below the channel region, it is not affected by variations in the thickness of the gate insulating film, and variations in the transistors are greatly reduced.

Figure 61:
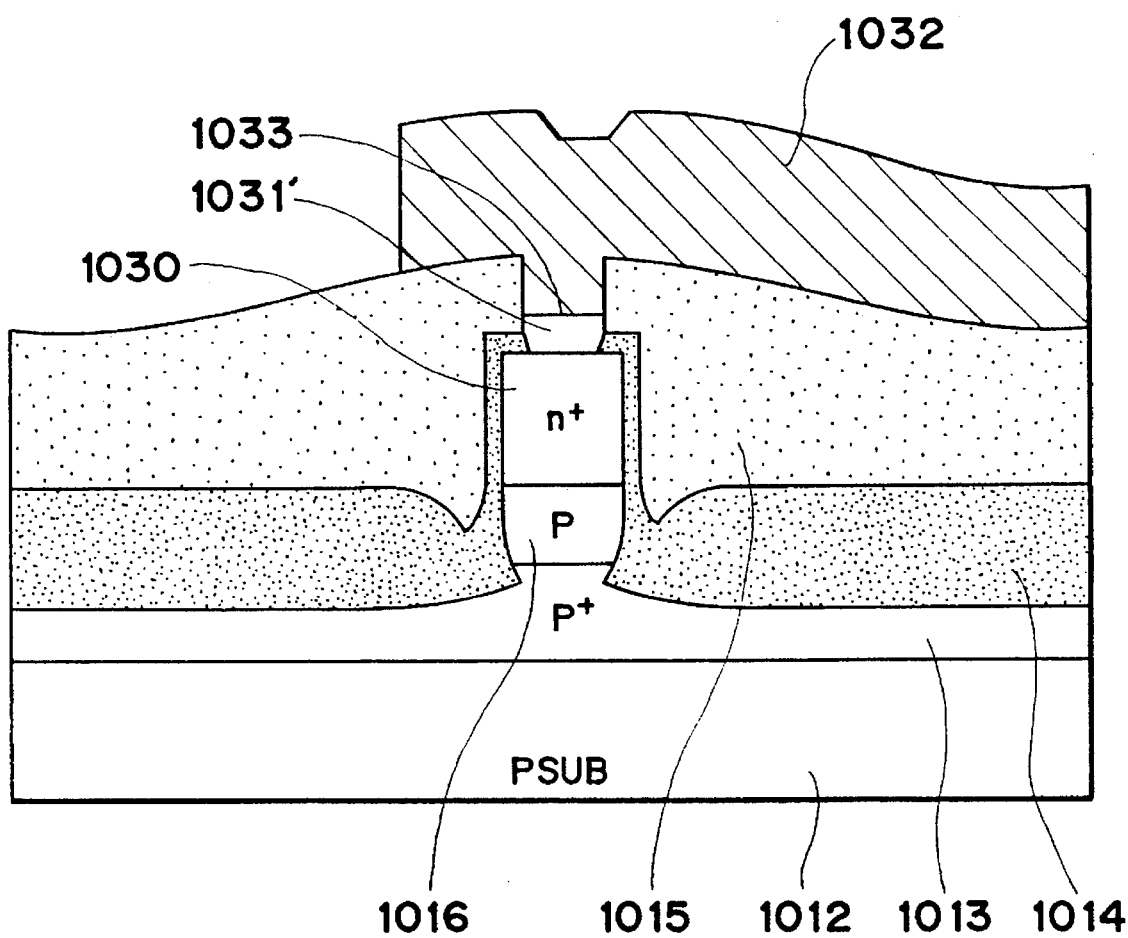
FIG. 61 is a schematic cross-sectional view taken along line $X_3$–$X_3'$ of FIG. 58.

FIG. 61 is a cross-sectional view of a source region of the transistor in the memory cell. In FIG. 61, reference character 1030 denotes an $n^+$—Si region which is the source layer; 1031', a thin film provided on the source whose breakdown and non-breakdown define conduction and non-conduction of the memory, respectively; and 1032, a bit line interconnection which is connected to the thin film 1031' through a contact area 1033. In this embodiment, the thin film is a P type semiconductor layer. However, it may be made of $SiO_2$, SiON or a laminated layer of $SiO_2$ and SiN. Aluminum oxide and tantalum oxide can also be used.

Figure 62:
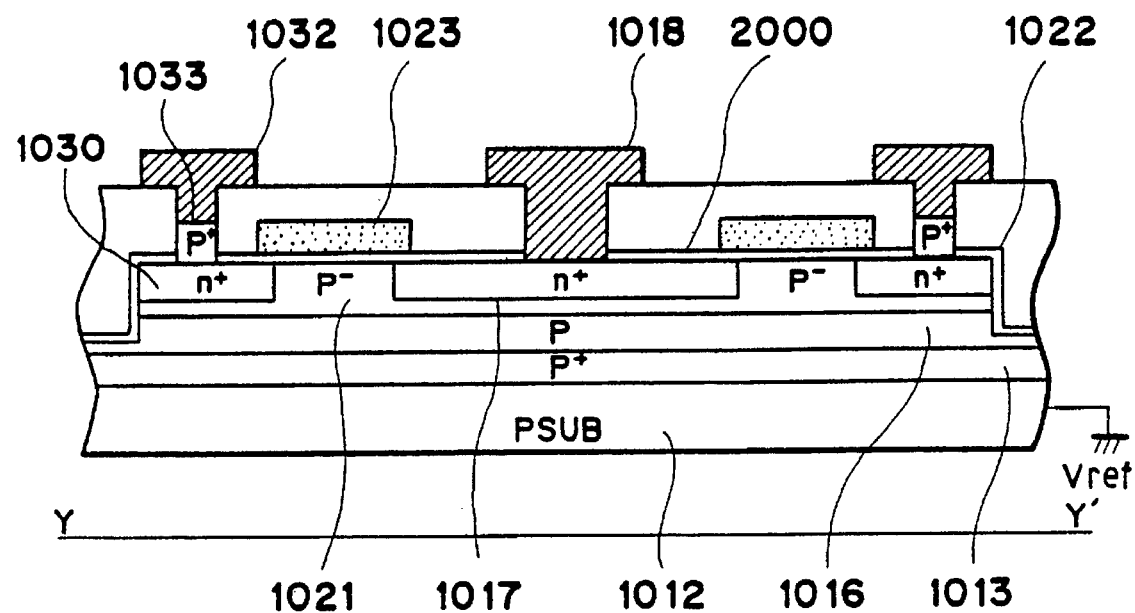
FIG. 62 is a schematic cross-sectional view taken along line Y–Y' of FIG. 58.

FIG. 62 which is the section taken along the line Y–Y' of FIG. 58 will be explained.

In FIG. 62, parts which are the same as those shown in the aforementioned figures are designated by the same reference numerals, and description thereof is omitted. As shown in FIG. 62, a drain region 2000 is formed as a common drain of two MOSs. This allows two cells to share the common power source line, and thus increases the degree of integration of the memory. The gate electrode structure on the section shown in FIG. 62 is similar to that of general MOSFETs. However, on the section of FIG. 60 which is perpendicular to the section shown in FIG. 62, the gate electrode is disposed such that it opposes the side wall portions.

Furthermore, although the gate electrode is provided above the channel region, if the relation between $d_1$ and $d_3$ shown in FIG. 60 is determined by $$d_3 < d_1 \qquad \text{Equation (1),}$$

even when the gate voltage increases, the potential of the channel region is increased from both sides thereof, and the electric field in the channel region can thus be limited as compared with the general MOSFETs. Furthermore, changes in the potential take place over the entire channel region. Consequently, when the transistor is turned on, a large current can flow, and a high driving capability can be obtained.

Figure 63:
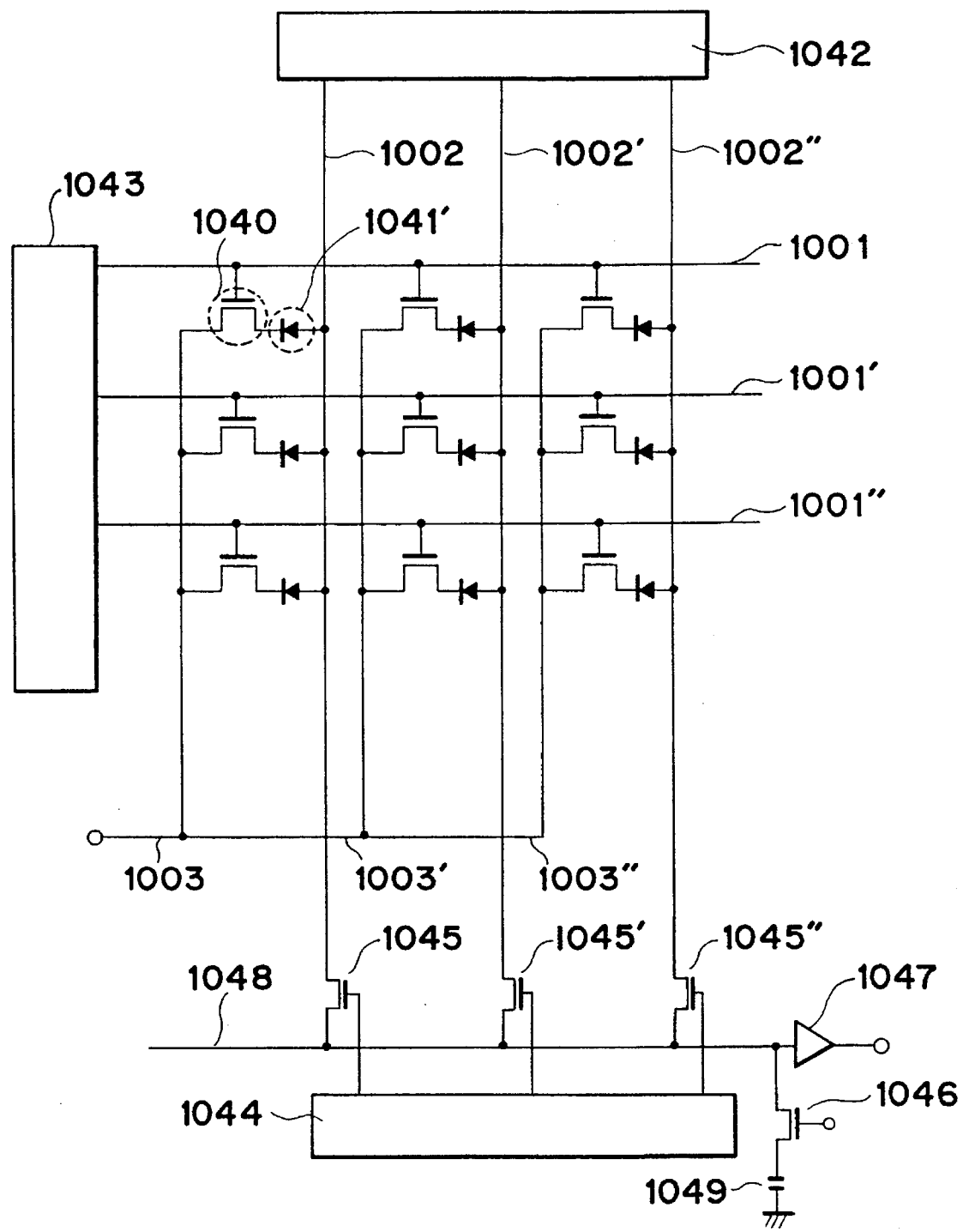
FIG. 63 is a circuit diagram of a semiconductor memory according to the fifteenth embodiment of the present invention.

FIG. 63 is a circuit diagram of a semiconductor memory having 3×3 cells according to the fifteenth embodiment of the present invention.

The single cell includes an addressing transistor 1040 and a memory element 1041. The memory element 1041' forms a pn junction and thus acts as a rectifier before breakage takes place but does not act as a rectifier after breakage occurs.

Reference characters 1001, 1001' and 1001" denote word lines connected to the gates of the FETs.

1002, 1002' and 1002" denote bit lines connected to one side of each of the memory elements.

1003, 1003' and 1003" denote power source lines. The memory also includes, as the peripheral circuits, a bit line voltage setting circuit 1042 for setting the voltage of each of the bit lines to a reference voltage, a word line voltage setting circuit 1043, a selection signal generating circuit 1044 for generating a signal of sequentially selecting the bit lines, bit line selection switches 1045, 1045' and 1045", and a switch 1046 for resetting a bit line reading-out line 1048, and an amplifier 1047.

The operation of the aforementioned semiconductor memory will now be described.

First, the writing operation will be explained. The operation consists of following four major operations.

(1) Writing operation part 1: (pre-charge of the bit lines)

The voltage on the bit lines is set to the reference voltage $V_{DD}$ by the voltage setting circuit 1042. Consequently, no potential difference exists between the power source lines and the bit lines. Thus, no matter what voltage is applied to the word lines, no potential is generated or no current flows between the source and the drain of the FET, and breakdown of the insulating film 1041 thus does not occur. The pre-charge voltage applied to the bit lines may be or may not be equal to the power source voltage. When the pre-charge voltage is not equal to the power source voltage, a voltage which does not generate breakdown of the insulating film region and hence conduction is set. A voltage between 1 and 5 v is applied as $V_{DD}$.

(2) Writing operation part 2: (discharge of the word lines)

The voltage on all of the word lines is fixed to a first grounding voltage $V_{GND1}$. It is fixed to, for example, 0 v.

This prevents mixture of a signal into the adjacent word lines of the word line on which writing operation is conducted due to generation of cross-talk.

(3) Writing operation part 3: (selection of a writing word line)

Assuming that the present writing bit represents the cell on the second line and second row with the upper and left cell shown in FIG. 63 as an origin, the writing bit is present on the word line 1001' shown in FIG. 63. Hence, the potential on the word line 1001' is set to $V_G$ which is expressed by:

$$V_{GND1} < V_G < V_{GB} \qquad \text{Equation (2)}$$

where $V_{GB}$ is a gate insulating film breakdown voltage.

(4) Writing operation part 4: (selection of a bit line)

The voltage on the bit line corresponding to the writing cell present on the selected line is set to the grounded voltage. Since all the FETs present on the selected line have been turned on, application of the grounded voltage causes a high voltage to be applied to the insulating film, generating breakdown of the insulating film and hence conduction. When the writing operation is completed, a current flows between the bit line and the word line. Thus, it is desirable that selection of the bit lines be conducted line by line. However, it is also possible to conduct writing on a plurality of bit lines at the same time.

Next, the reading out operation will be explained. This operation consists of following four major operations.

(1) Reading out operation part 1: (pre-charge of the bit lines)

Pre-charge of the bit lines is conducted-in the same manner as that of the writing operation to prevent the reading out operation performing writing on the bits on which writing has not been conducted. The voltage applied for pre-charging is equal to the power source voltage $V_{DD}$.

(2) Reading out operation part 2 (discharge of the word lines)

The voltage on all of the word lines is fixed to second grounded voltage $V_{GND2}$. The voltage $V_{GND2}$ and the first grounded voltage $V_{GND1}$ has the following relation.

$$V_{GND1} < V_{GND2} \qquad \text{Equation (3)}$$

(3) Reading out operation part 3 (selection of a reading line)

The voltage on the word line on which the reading out operation is to be conducted is fixed to $V_G$ defined by Equation (2) to turn on the FETs present on that line.

(4) Reading out operation part 4 (resetting of the bit line reading out line)

The bit line reading out line 1048 is reset by the switch 1046. The reset voltage, determined by the power source connected to the switch 1046, is $V_{GND2}$. Thereafter, the switch 1046 is turned off to make the bit line reading out line floating.

(5) Reading out operation part 5 (selection of a bit line)

The gate of the selected bit selection switch is raised by the bit line sequentially selecting signal generating circuit 1044 to turn on the switch and thereby connect it to the bit line reading out line. If the selected cell is not present, the voltage on the reading out line converges to the value expressed by $$\frac{C_{BIT} \cdot V_{DD} + C_{OUT} \cdot V_{GND2}}{C_{BIT} + C_{OUT}}$$

where $C_{BIT}$ is the capacity of the bit line and $C_{OUT}$ is the capacity of the reading out line.

If the selected cell is present and the insulating film is in a conducting state, the reading out line is connected to the power source $V_{DD}$ through the transistor and the voltage on the reading out line thus converges to $V_{DD}$. These two voltage stages are utilized to determine whether the written cell (bit) is present or not. The voltage on the reading out line is detected by the amplifier 1047. In the reading out operation which is conducted in the manner described above, in the case of a written state, the time it takes for the voltage on the reading out line to converge to $V_{DD}$ determines the reading out speed. The larger the capacity of the memory, the larger the capacity of the bit line and bit line reading out line. Thus, how these large capacities are driven is the key to an increase in the reading out speed. The aforementioned fine transistor structure having a high driving ability is therefore very effective in this sense.

In this reference example, two types of grounded voltages are used so that the reading out operation does not cause breakdown of the insulating film. That is, a difference in the voltages applied to the two ends of the insulating film in the reading out operation is lower than that in the writing operation.

The manufacturing method of the fifteenth embodiment will be described below with reference to FIGS. 64 through 68. FIGS. 64 through 67 are cross-sectional views corresponding to FIG. 60. FIG. 68 corresponds to FIG. 62.

Figure 64:
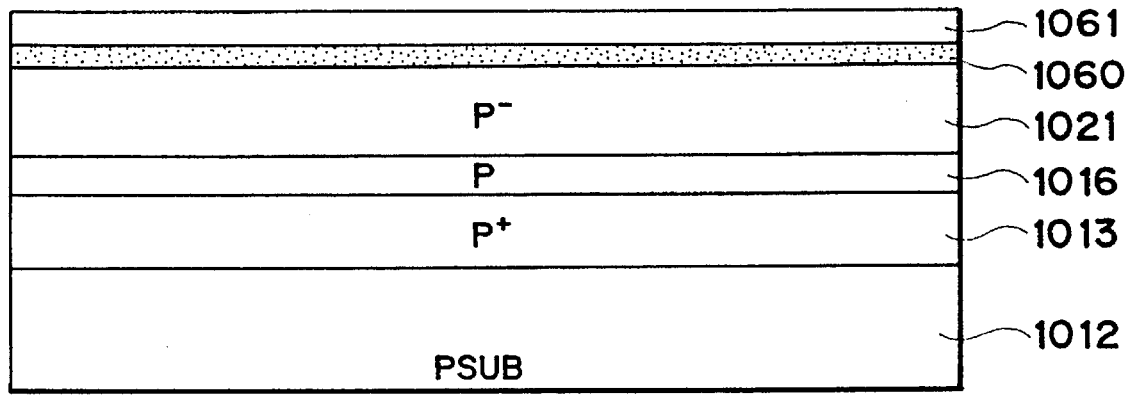
FIG. 64 is a schematic view illustrating a method of manufacturing a semiconductor memory according to the fifteenth embodiment of the present invention.

First, boron ions are injected into the surface of the p type silicon substrate 1012, and then activation of the impurities in the ion injected layer is conducted at about 900° C. After the $p^+$ high concentration layer 1013 has been formed, the wafer is washed and placed in an epitaxial growth device. In the device, the natural oxidized film formed on the surface is removed due to reduction of silane, and then the 2 μm thick p layer 1016 and the 0.5 μm thick $p^-$ layer 1021 are sequentially grown at a low temperature of 850° C. Low-temperature epitaxial growth restricts welling of impurities, and provides rapid joint between $p^+$–p and p–$p^-$. The concentration of the $p^+$ layer is $10^{19}$ cm$^{-3}$. The concentration of the p layer is $10^{17}$ cm$^{-3}$. The concentration of the $p^-$ layer is $10^{16}$ cm$^{-3}$. The resultant wafer is subjected to thermal oxidation to form the silicon oxide film 1060 of about 250 Å. Thereafter, the silicon nitride film 1061 of 250 Å is formed on the silicon oxide film 1060 by the vapor chemical deposition technique (CVD) (FIG. 64).

Figure 65:
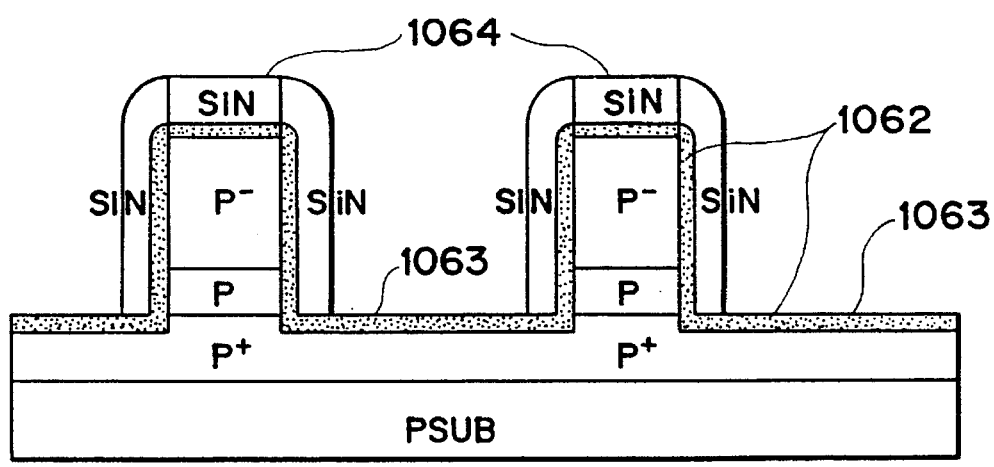
FIG. 65 is a schematic view illustrating a method of manufacturing a semiconductor memory according to a sixteenth embodiment of the present invention.

Next, reactive anisotropic etching is conducted on the wafer except for the transistor forming area using a resist as a mask to vertically remove the silicon nitride film 1061, the silicon oxide film 1060, the $p^-$ layer 1021 and the p layer 1016. The end of the groove formed by etching is as deep as either the p layer or $p^+$ layer. It is not necessary to control the depth of the groove strictly, which is one of the advantages of this structure. Next, the resist used for patterning is removed. After washing of the wafer, a silicon oxide film 1062 of about 250 Å thickness is formed on the surface where Si is exposed. Thereafter, a silicon nit ride film is deposed on the entire surface by CVD, and only the silicon nitride film formed on a bottom surface 1063 is removed by the anisotropic silicon nitride film etching, as shown in FIG. 65. At that time, a silicon nitride film 1064 formed on Si columns remains because they consist of two layers (FIG. 65).

Figure 66:
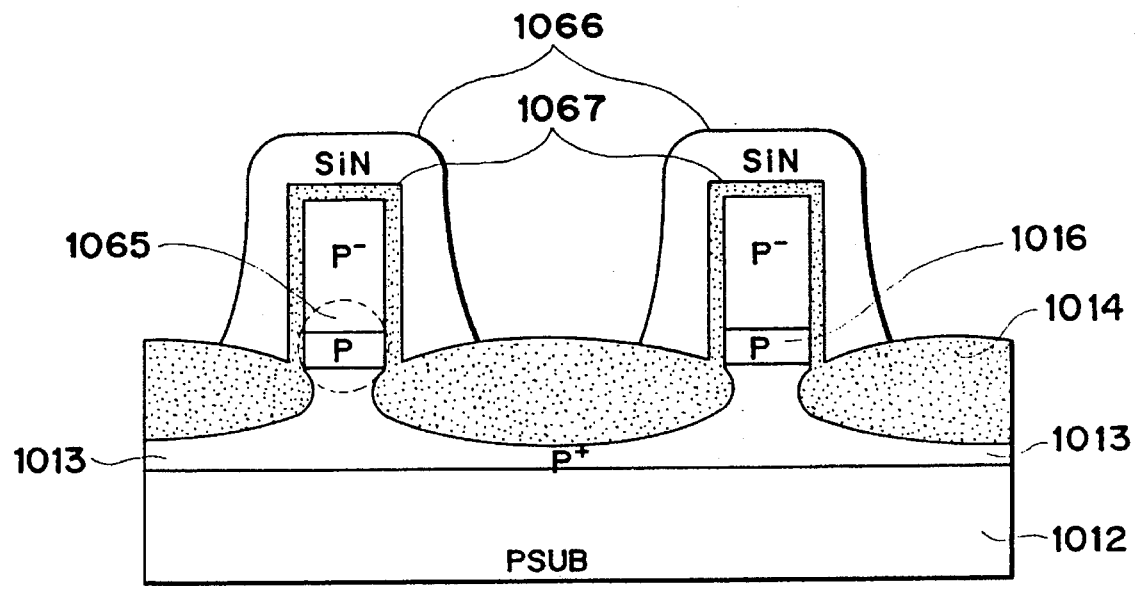
FIG. 66 is a schematic view illustrating a method of manufacturing a semiconductor memory according to the sixteenth embodiment of the present invention.

Next, pyrogenic oxidation is conducted on the wafer at about 900° C. to selectively oxidize the surface on which no silicon nitride film is formed. This process forms a field oxidized film 1014, as shown in FIG. 66. This field oxidation process deforms the silicon columnar I portion, as indicated by 1065. However, the deformed area is either the p layer 1016 or the p+ layer 1013, and is not affected by deformation (FIG. 66).

Next, the silicon nitride film 1066 used for selective oxidation and the pad oxide film 1067 are removed. After the exposed Si surface has been washed, the gate oxide film 1022 is formed by thermal oxidation. Thereafter, polysi W (tungsten) is continuously deposited, and then a gate electrode consisting of $p^+$ type polysilicon, $W_{1-x}Si_x$ and W is formed by injecting boron ions from the W surface and then by conducting annealing. The distance between the opposing gates of the transistor of this type is 0.1 μm. Thus, the transistor is turned on and off by controlling the entire potential of the channel portion by the gate voltage. Hence, the threshold thereof, which is reduced than that of a conventional MOSFET, is increased by the presence of the $p^+$ layer 1068. A W metal 1069 formed on the upper portion of the gate electrode reduces the resistance of the word lines.

After the patterning of the gate electrode, an $n^+$ layer is diffused using the gate as a mask to form the source layer 1030 and the drain layer 1017.

Figure 67:
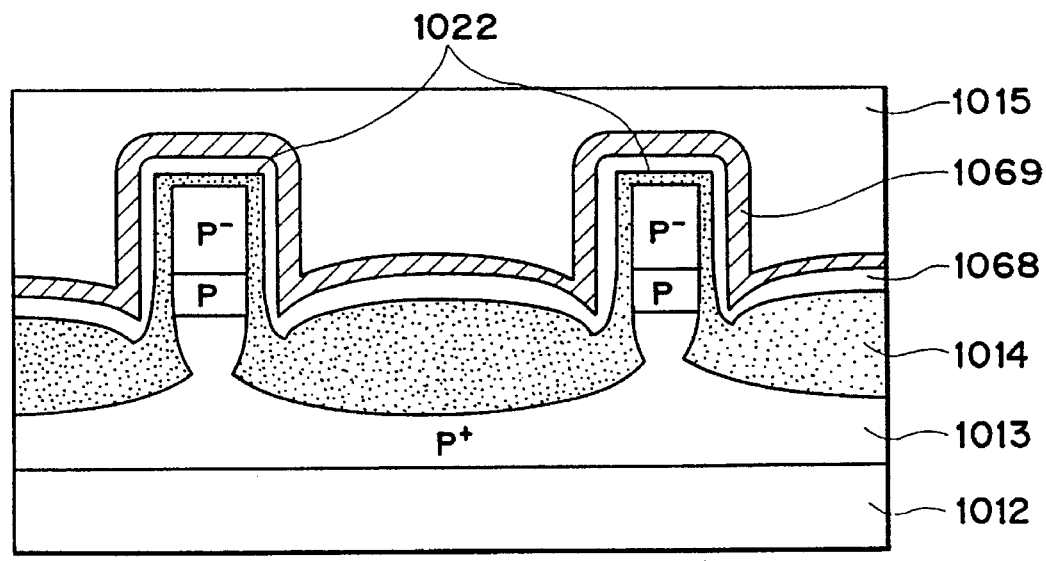
FIG. 67 is a schematic view illustrating a method of manufacturing a semiconductor memory according to the sixteenth embodiment of the present invention.
Figure 68:
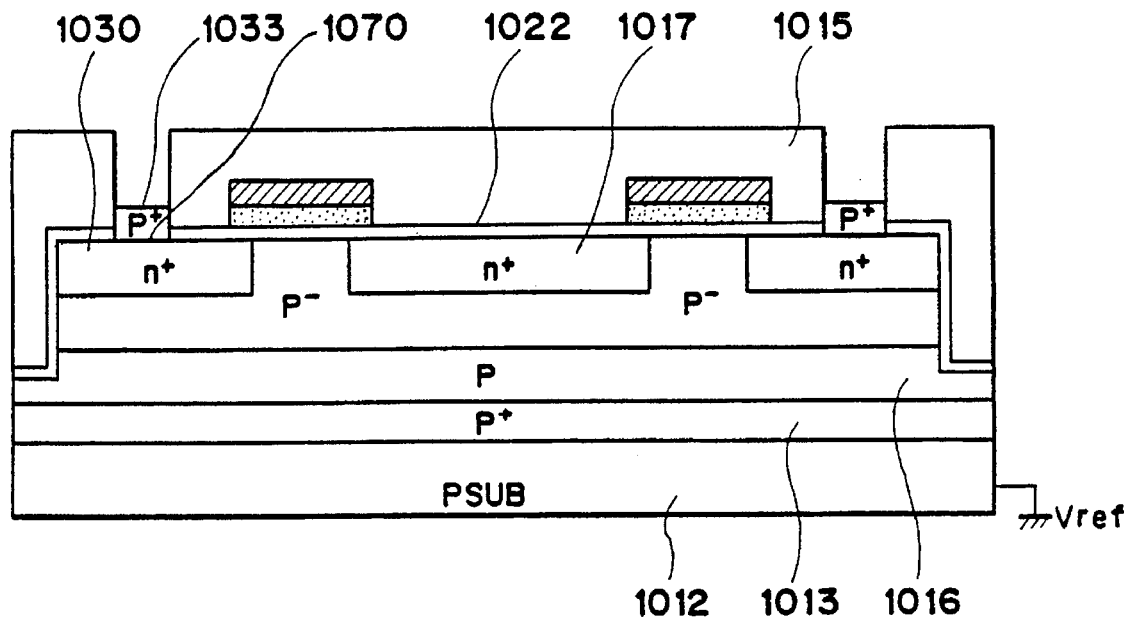
FIG. 68 is a schematic view illustrating a method of manufacturing a semiconductor memory according to the sixteenth embodiment of the present invention.

Next, as shown in FIG. 67, the interlayer insulator 1015 is planarized. Planarization of the insulating layer 1015 is achieved by a combination of deposition of tetraethyl orthosilicate (TEOS) and etching back.

Next, as shown in FIG. 68, a contact hole 1070 is formed only in the source region 1030. Only through the contact hole 1070, the Si surface is exposed. A $p^+$ layer with 400–800 Å thick is formed by LPCVD only in the area of the contact hole. Subsequently, the power source and bit line interconnections are patterned, and then a passivation film is formed, by which manufacture of the cell structure is completed. As shown in FIG. 68, the power source is connected to the $n^+$ drain region 1017 which is common to two memory cells located at the right and left of the drain region.

In this embodiment, the n channel MOSFET has been described. However, a p channel MOSFET can be manufactured by the same process, if the conductivity type is inverted. Thus, the peripheral circuit can be manufactured as a CMOS structure consisting of an n channel MOSFET and a p channel MOSFET.

As will be understood from the foregoing description, the fifteenth embodiment of the present invention is of the type in which a conducted state and a non-conducted state are obtained by breakdown and non-breakdown of a pn junction, respectively, and is not of the type in which a small amount of stored electric charges is read out, as in the case of the conventional DRAM or $E^2PROM$. Therefore, even when the degree of fine processing is increased, reading out at a high S/N ratio can be provided. Furthermore, reading out is conducted using a transistor which has a new structure. Since this transistor has a fine structure and a high driving capability, high integration and high-speed reading out can be achieved.

Furthermore, the two memory cells share the single power source, higher degree of integration can be achieved.

(Sixteenth Embodiment)

A sixteenth embodiment of the present invention will be described below with reference to FIG. 69. Parts which are the same as those shown in FIG. 58 are designated by the same reference numerals, and description thereof is omitted.

Figure 69:
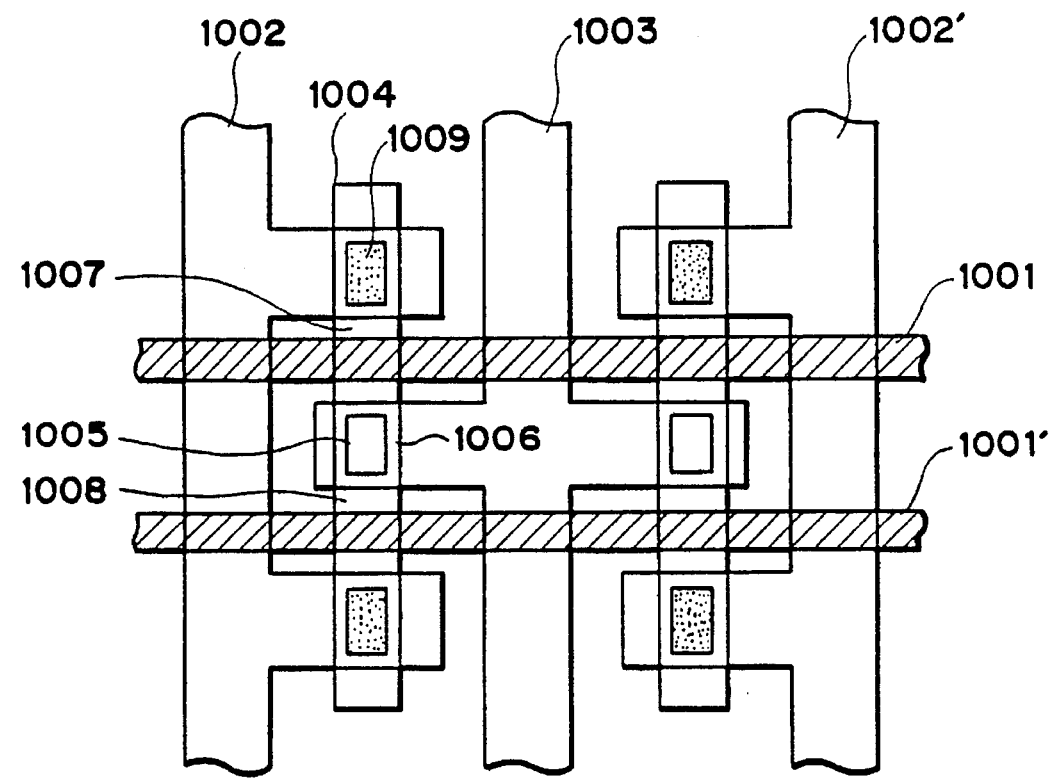
FIG. 69 is a schematic top view of a semiconductor memory according to the sixteenth embodiment of the present invention.

In the sixteenth embodiment of the present invention, the memory cell power leads are disposed on the right and left sides of the power source line 1003, as shown in FIG. 69, and one power source line is thus shared by the four memory cells, unlike the case of the fifteenth embodiment in which one power source line is shared by the two memory cells.

Thus, the required number of power source lines can be reduced from one line per 2n memory cells to one line per 4n memory cells, and the interconnections required for the power source lines can be lessened. Consequently, a memory cell having a smaller chip size and a higher degree of integration can be provided. Furthermore, since the power source lines 1003 and 1003' are made of Al, the interconnection resistance of the memory cell is sufficiently low.

(Seventeenth Embodiment)

A seventeenth embodiment of the present invention will be described below with reference to FIGS. 70 through 72. Parts which are the same as those shown in FIGS. 58 and 62 are designated by the same reference numbers, and description thereof is omitted.

Figure 70:
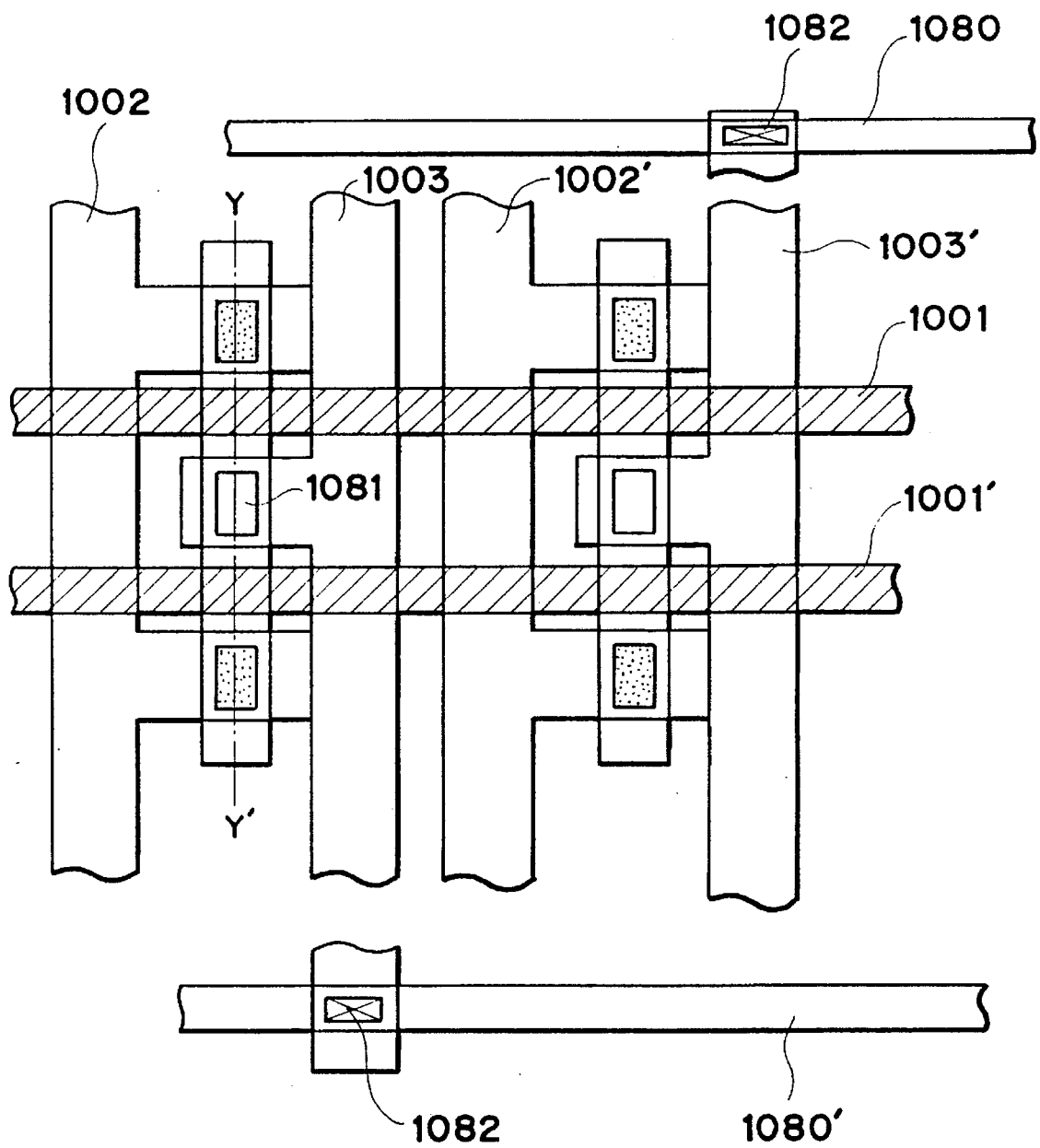
FIG. 70 is a schematic top view of a semiconductor memory according to a seventeenth embodiment of the present invention.
Figure 71:
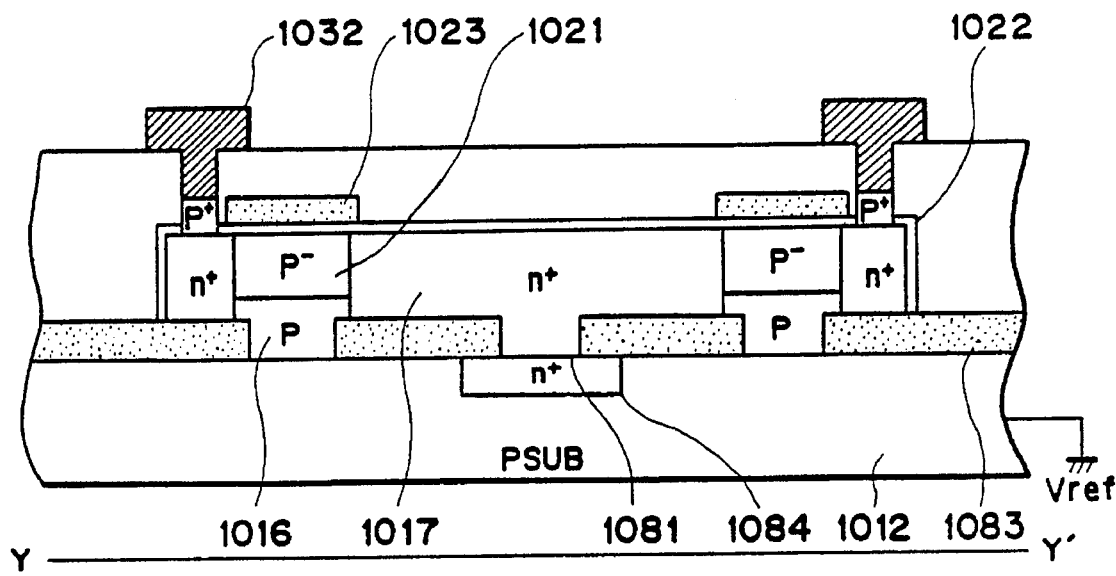
FIG. 71 is a schematic cross-sectional view of the semiconductor memory according to the seventeenth embodiment of the present invention.

In FIGS. 70 and 71, reference number 1080 denotes an Al interconnection for the power source line; 1081, a contact portion between the Al interconnection and an $n^+$ layer substrate; 1082, a contact portion between the $n^+$ layer substrate and the Al interconnection which is the power source line; 1083, an Si oxide film formed on the substrate; and 1084, an $n^+$ layer formed in the substrate.

In this embodiment, as shown in FIGS. 70 and 71, the power source line 1003 formed by the $n^+$ layer 1084 is connected to the Al interconnection through the contact 1082. Since the power source line is formed by the $n^+$ layer 1084, it is not necessary to provide the Al interconnection as the power source line. Consequently, patterning of the Al interconnection can be omitted, and a higher degree of integration can be achieved. Furthermore, since the Al interconnection can be connected to a desired memory cell, the degree of freedom of pattern designing can be increased.

Figure 72:
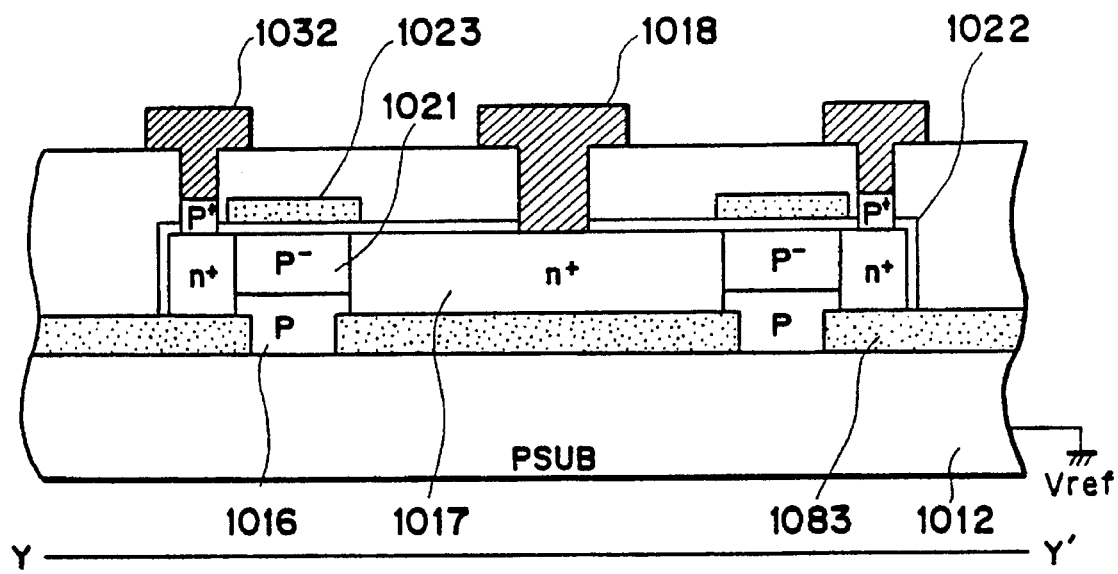
FIG. 72 is a schematic cross-sectional view of the semiconductor memory according to the seventeenth embodiment of the present invention.

Alternatively, as shown in FIG. 72, an Al interconnection connected to the drain region 1017 may be connected to the power source line. In this case, a power source line 1018 has a low interconnection capacitance and interconnection resistance due to the presence of an oxide film 1083. This allows for provision of a high-speed memory transistor.

(Eighteenth Embodiment)

An eighteenth embodiment of the present invention will be described below with reference to FIG. 73. Parts which are the same as those shown in FIG. 62 are designated by the same reference numerals, and description thereof is omitted.

Figure 73:
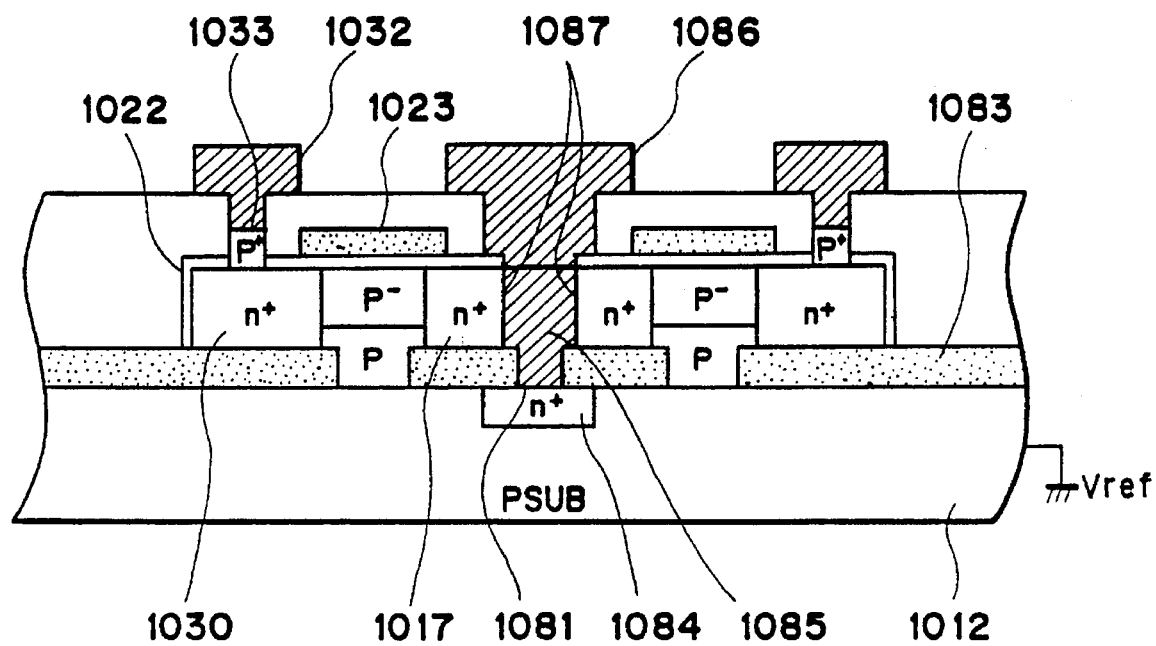
FIG. 73 is a schematic cross-sectional view of a semiconductor device according to an eighteenth embodiment of the present invention.

In FIG. 73, reference numeral 1081 denotes a contact to a substrate $n^+$ layer; 1084, a $n^+$ layer formed in the substrate; 1085, an Al interconnection connected to a power source line; 1086, an Al type interconnection which is the power source line; and 1087, a contact between memory cell drains and the power source line Al.

In this embodiment, as shown in FIG. 73, Al type metal buried in the drain 1017 is connected to the power source line 1086. In this embodiment, since the drains of the memory cell transistors are connected to the common Al interconnection which is in turn connected to the power source line, the power source line is formed of only Al interconnection, and the interconnection resistance of the power source line can thus be minimized. Both the Al interconnection connected to the power source line and the Al interconnection which serves as the power source line are formed by CVD which employs dimethyl aluminum hydride and $H_2$. Al type interconnection material is buried to form the interconnection.

Thus, the use of Al—CVD technology in the formation of the power source line enables the power source line having a minimum interconnection resistance to be provided. As a result, a high-speed memory cell transistor can be provided.

According to the aforementioned fifteenth through eighteenth embodiments, a conducted state and a non-conducted state are formed by breakage and non-breakage of a memory element, such as a pn junction, respectively, and signals can thus be read out at a high S/N ratio. It is therefore possible to provide a highly reliable memory having a low error rate.

Furthermore, since a plurality of memory cell transistors employ a common power source line, an interconnection material having a low resistance can be used, and a higher degree of integration and a higher speed activation of the memory can be achieved.

What is claimed is:

1. A process for manufacturing a semiconductor device, comprising the steps of:
    a) forming, on a single-crystalline semiconductor region of a substrate, a first insulating film having a first opening portion with a first lateral dimension for exposing the single-crystalline semiconductor region therethrough;
    b) forming, on the first insulating film, a second insulating film having a second opening portion with a second lateral dimension larger than the first lateral dimension, the second opening portion overlying the first opening portion for exposing the single-crystalline semiconductor region therethrough;
    c) applying a non-single-crystalline material on a sidewall inside of the second opening portion;
    d) growing a single-crystalline semiconductor body in the first and the second opening portions to have a portion on the first insulating film;
    e) introducing a dopant into the portion of the single-crystalline semiconductor body which is on the first insulating film to form spaced source and drain regions having a conductivity type opposite to a conductivity type of the single-crystalline semiconductor body; and
    f) forming a gate insulating film and a gate electrode on the single-crystalline semiconductor body between the source and drain regions.

2. Said process according to claim 1, wherein the non-single-crystalline material is amorphous silicon.

3. Said process according to claim 1, wherein the non-single-crystalline material is polycrystalline silicon.

4. Said process according to claim 1, wherein the non-single-crystalline material is further applied on a sidewall inside of the first opening portion.

5. Said process according to claim 1, wherein the non-single-crystalline material is further applied on the first insulating film within the second opening portion.

6. Said process according to claim 1, wherein after forming the single-crystalline semiconductor body, the second insulating film is removed.

7. Said process according to claim 1, wherein after forming the gate electrode, the source and drain regions are formed by ion implantation.

8. Said process according to claim 1, wherein the single-crystalline semiconductor body is formed by vapor phase epitaxial growth.

9. Said process according to claim 1, wherein after depositing amorphous silicon as the non-single-crystalline material in said step (c), the single-crystalline semiconductor body is formed by solid phase epitaxial growth.

10. Said process according to claim 1, wherein the substrate is a single-crystalline substrate and the single-crystalline semiconductor region of the substrate is formed by implanting ions into a surface of the single-crystalline substrate.

* * * * *